United States Patent [19]

Muraoka et al.

[11] Patent Number: 5,418,376
[45] Date of Patent: May 23, 1995

[54] STATIC INDUCTION SEMICONDUCTOR DEVICE WITH A DISTRIBUTED MAIN ELECTRODE STRUCTURE AND STATIC INDUCTION SEMICONDUCTOR DEVICE WITH A STATIC INDUCTION MAIN ELECTRODE SHORTED STRUCTURE

[75] Inventors: Kimihiro Muraoka; Naohiro Shimizu, both of Kanagawa; Takashige Tamamushi, Tokyo, all of Japan

[73] Assignee: Toyo Denki Seizo Kabushiki Kaisha, Tokyo, Japan

[21] Appl. No.: 202,821

[22] Filed: Feb. 28, 1994

[30] Foreign Application Priority Data

Mar. 2, 1993 [JP] Japan .................................. 5-066185
Mar. 12, 1993 [JP] Japan .................................. 5-078740

[51] Int. Cl.⁶ ............................................ H01L 29/80
[52] U.S. Cl. ............................ 257/136; 257/260; 257/264; 257/281; 257/475; 257/498
[58] Field of Search ............... 257/136, 264, 498, 260, 257/475, 281

[56] References Cited

U.S. PATENT DOCUMENTS 4,454,523  6/1984  Hill ........................................ 257/264
4,985,738  1/1991  Nishizawa et al. ................. 257/136

*Primary Examiner*—Edward Wojciechowicz
*Attorney, Agent, or Firm*—McGlew and Tuttle

[57] ABSTRACT

The present invention is to provide a static induction semiconductor device with a distributed main electrode structure and a static induction semiconductor device with a static induction main electrode shorted structure where the main electrode region is composed of regions of higher and lower impurity densities relative to each other and formed partly in contact with the lower impurity density region as well, and alternatively a static induction short-circuit region opposite in conductivity type to the main electrode region is formed in the lower impurity density region surrounded by the higher impurity density region.

20 Claims, 40 Drawing Sheets

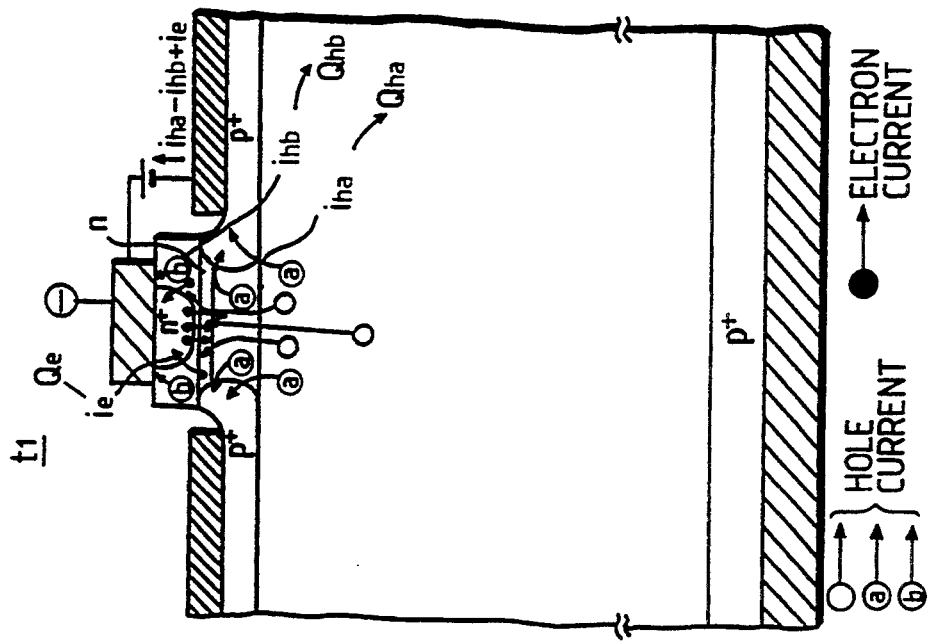
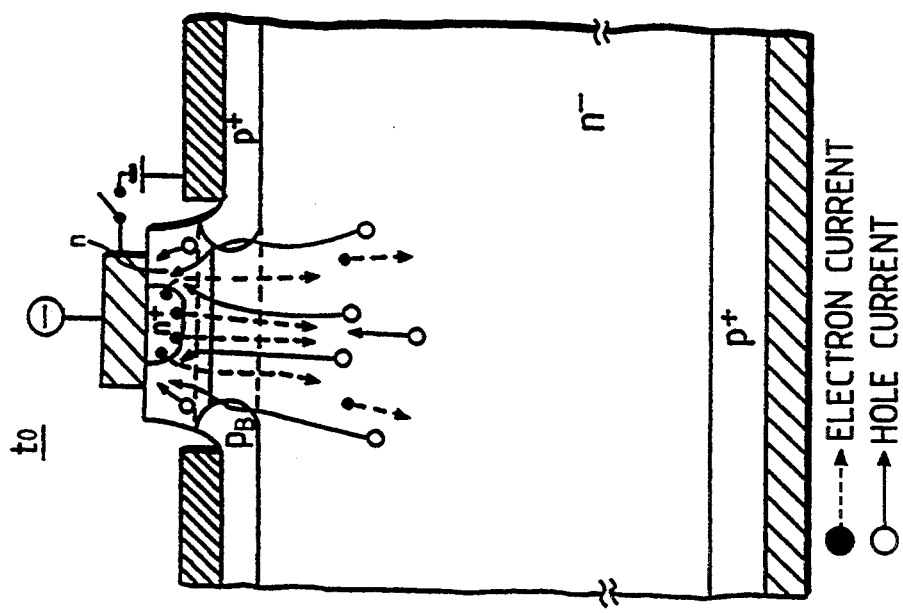

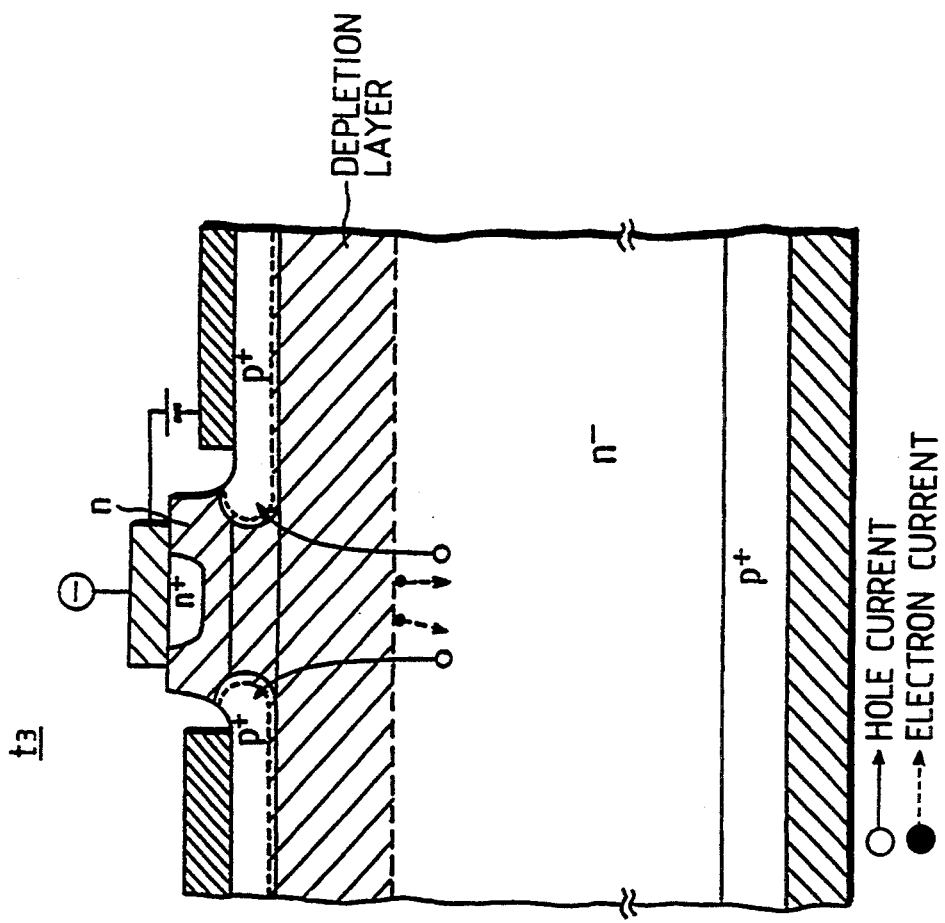
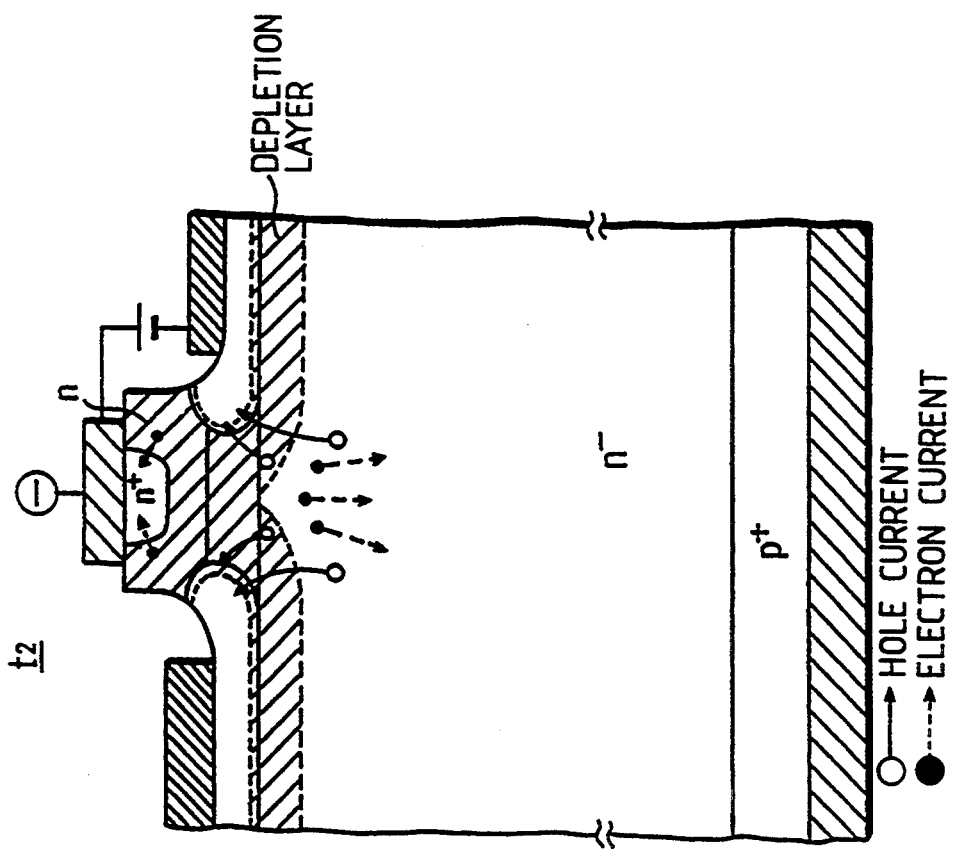

○ → HOLE CURRENT
● → ELECTRON CURRENT

SURFACE PLAN VIEW

STATIC INDUCTION SEMICONDUCTOR DEVICE WITH A DISTRIBUTED MAIN ELECTRODE STRUCTURE AND STATIC INDUCTION SEMICONDUCTOR DEVICE WITH A STATIC INDUCTION MAIN ELECTRODE SHORTED STRUCTURE

BACKGROUND OF THE INVENTION

1. Field of the Invention

The present invention relates generally to the field of power semiconductor device and, more particularly, to a static induction semiconductor device with a distributed main electrode structure which is improved in the device turn-off performance through substantial reduction of the minority carrier storage time, the device fall time and the quantity of gate electrode pull-out charges that are factors important to the turn-off switching performance of the device. The invention also pertains to a static induction semiconductor device with a static induction main electrode shorted structure which permits reduction of the quantity of charges that are pulled out of the gate electrode when the device is turned off.

2. Description of the Prior Art

There have heretofore been proposed a variety of structures intended to improve switching performance of static induction (hereinafter abbreviated to SI) semiconductor devices. FIG. 43 shows in section the structure of a first prior art example that is proposed by Nishizawa and Tamamushi in Japanese Patent Public Disclosure No. 91474/89 to reduce the input capacitance between the gate and the source or between the gate and the cathode and enhance the efficiency of electron injection from the source or cathode region in an SI transistor or thyristor with a buried gate structure. In FIG. 43, reference numeral 1 denotes an $n^-$-type high resistivity layer, 3 an anode or drain region, 4 gate regions, 5 channel regions and 11 cathode or source regions.

In the first prior art example, a semiconductor region that serves as a cathode or source is provided only above a channel defined by buried gates therebetween to reduce the capacitance between the gate-cathode or gate-source capacitance to thereby increase the device switching speed with no reduction of the channel current.

Since the semiconductor region of high impurity concentration, which serves as the cathode or source region, is provided only above the channel region defined by the buried gate regions therebetween, the junction capacitance between the gate and cathode or source regions is smaller than in the past. Accordingly, a time constant that is defined by the product of the gate resistance and the junction capacitance is smaller than before and the gate-cathode or gate-source voltage reaches the gate region apart from a gate electrode more rapidly than before. This reduces the turn-on time and the turn-off time, and hence permits high-speed switching of the device.

A second prior art example is shown in FIG. 44, which is a sectional view of an SI thyristor disclosed by Kawamura and Morikawa in Japanese Patent Public Disclosure No. 257266/90. In FIG. 44, reference numeral 1 denotes an $n^-$-type high resistivity layer, 3 $p^+$-type anode regions, 4 gate regions, 6 $n^+$-type short-circuit layers, 7a a cathode electrode, 7b a gate electrode, 7c an anode electrode, 11 $n^+$-type cathode regions and 13 $p^+$type short-circuit regions. The structure depicted in FIG. 44 is intended to provide an SI thyristor with a shorted cathode structure which is excellent in its turn-off characteristic, current carrying capacity and breakdown voltage, by increasing the cathode area utilization factor.

The SI thyristor of the second prior art example, which has the $n^+$-type cathode regions 11 and the $p^+$-type short-circuit regions 13 formed in one main surface of the $n^-$-type high resistivity layer (an $n^-$-type base region ), is characterized by a construction in which the $p^+$-type gate regions 4 are buried in the $n^-$-type base region 1 side by side in parallel to the said main surface thereof, the $n^+$-type cathode regions 11 are each formed opposite the channel region defined by the $p^+$-type gate regions therebetween and the $p^+$-type short-circuit regions 13 are disposed partly opposite the $p^+$-type gate regions 4.

That is, the $p^+$-type gate regions 4 are provided as buried regions, the $p^+$-type short-circuit regions 13 are formed above the gate regions 4, and the regions defined between the short-circuit regions 13 form the $n^+$-type cathode regions 11, which serve as main current paths at the cathode side. This structure provides increased device area utilization factor.

FIG. 45 is a sectional view showing, as a third prior art example, an SI thyristor disclosed by Muraoka in Japanese Patent Public Disclosure No. 152063/85. Reference numeral 1 denotes an $n^-$-type high resistivity layer, 3 second high concentration regions ($p^+$-type anode regions), 4 gate regions, 7a a cathode electrode, 7b a gate electrode, 7c an anode electrode, 11 first high concentration regions ($n^-$-type cathode regions), 12 a support electrode, and 14 and 14' insulating regions. With such a structure as shown in FIG. 45, the $p^+$-type buried gate regions 4 lessens the effect of a parasitic bipolar transistor formed in a region defined by the cathode and anode regions between them, thereby preventing retriggering of the device by the parasitic bipolar transistor, enhancing the dv/dt capability of the device immediately after its turn-off and improving the gate loss at turn-on during high-frequency operation.

The above-mentioned third prior art example is intended to offer an SI thyristor of a novel construction that is free from the parasitic bipolar transistor effect and remarkably high in the yield rate of production.

To attain such an object, in the third prior art example, the above-mentioned first high concentration regions 11 may be formed so that their junction is shallow in the regions directly above the buried regions 4 and deep in the other regions.

This structure allows the dv/dt capability just after turn-off to be held high as required, permits reduction of the gate loss at turn-on during high-frequency operation and appreciably raises the yield rate of production.

In this third prior art example, the second high concentration regions 3 may be formed so that their junction is shallow in the regions directly below the buried regions 4 and deep in the other regions. This further increases the dv/dt capability.

It is also possible to form an insulating layer between the region directly below the gate region and the anode electrode, this further enhances the above-noted effects.

In the same structure as shown in FIG. 44 of the second prior art, the inventors of this application found out a phenomenon that when the device is turned off, the $p^+$-type buried gate regions 4 and the $p^+$-type short-circuit regions 13 get shorted and extra holes are injected from the p+-type short-circuit regions 13 into the n⁻-type high resistivity region 1, increasing the quantity of charges that are extracted from the gate electrode 7b. This leads to an adverse effect that the turn-off time increases.

The SI thyristor structure of the first prior art example is intended primarily to reduce the parasitic capacitance, but since the first prior art example makes no reference to the arrangement of the cathode electrode, the flow of holes at turn-on and turn-off are unconfirmed, and it, too, makes no mention of the effect of reducing the quantity of holes extracted according to the present invention as described later on. The third prior art example also aims to lessen the effects of a parasitic bipolar transistor and a parasitic diode and makes no mention of the flow of holes at turn-on and turn-off; hence, the effect of reducing the quantity of holes that are extracted at turn-off is not found.

Moreover, the inventors of this application have found, by experiment, that in an SI device with a buried gate structure, buried diffused layers (p+-type gate regions) directly below an n+-type cathode region are formed more rapidly and wider during the same diffusion period than those formed just under a region where no n+-type cathode region is formed. FIG. 46 is a schematic sectional view of the SI device, for explaining the above. As shown, p+-type buried regions 4 just under an n+-type cathode region 11 spread wider than those formed not directly under it. As is evident from FIG. 46, the distance between the gate and cathode varies according to the position of the respective buried region. It is also clear that such variations in the distance between the gate and cathode is liable to cause dispersion in the breakdown voltage between the p+-type gate region and the n+-type cathode region in each segment forming the SI thyristor. Since the p+-type gate region just under the n+-type cathode region, in particular, spreads quickly toward the cathode region as well, the substantial distance between the gate and cathode decreases and the breakdown voltage there between is determined accordingly. Hence, it is necessary to control the setting of conditions for obtaining a predetermined breakdown voltage and suppress variations in the breakdown voltage in respective segment and among segments.

In the prior art examples described above, too, there is not proposed any particular cathode layout pattern aimed to suppress the dispersion in the breakdown voltage that is caused by the above-mentioned variations in the diffusion of individual buried regions. The reason for this is that the cathode region in the prior art is usually formed uniform and homogeneous unlike a nonuniform, inhomogeneous distributed structure proposed by the present invention.

FIG. 47 shows schematic longitudinal, cross-sectional and top views of a unit segment of the SI thyristor with a conventional buried gate structure in which the cathode region is formed uniform and homogeneous.

As is evident from FIG. 47, the cathode electrode 7a is disposed substantially all over the n+-type cathode region 11 without lying off its edge, and hence is not in touch with the n-type epitaxial layer 10. FIG. 48 shows an typical switching waveform of such a conventional SI thyristor during 1200 V–100 A switching conditions. Reference character $I_T$ denotes an anode current, $V_D$ an anode voltage, $I_{GP}$ a gate peak current, $I_{RG}$ a gate current and $V_{RG}$ a gate voltage.

FIG. 49 through 52 schematically show how holes and electrons move or migrate in the unit cell structure of the SI thyristor during an on-state period $t_0$, minority carrier storage period $t_1$, a fall period $t_2$ and a tail period $t_3$ in the waveform of FIG. 48, respectively. White circles indicate holes and black circles indicate electrons.

In the on-state period $t_0$, even if the application of a forward bias between the gate and cathode is not continued, electrons inject from the cathode to the anode, whereas holes flow from the anode to the cathode via the channel or gate (FIG. 49). When a reverse bias is applied between the gate and cathode, the hole current from the anode flows into the gate and holes distributed in the channel near the gate and in the n-type epitaxial layer between the gate and cathode are also drifted by the reverse biased electric field into the gate. On the other hand, electrons keep on flowing from the cathode to the anode, but as the potential barrier height in the channel increases owing to the reverse gate, some of the electrons flow back into the cathode region. In FIG. 50, reference character "iha" the hole current from the anode to the cathode in the minority carrier storage period $t_1$, "Qha" the quantity of its charges, "ihb" the hole current from the vicinity of the channel and from the n-type epitaxial layer between the gate and the cathode into the gate, "Qhb" the quantity of its charges, "ie" the electron current flowing back into the cathode region and "Qe" the quantity of its charges.

The quantity of charges extracted from the gate at turn-off under 1250 V–300 A switching conditions was Qha+Qhb+Qe=456.6($\mu$C). This value was obtained from a switching waveform of the conventional SI thyristor under L inductive load switching conditions described later with reference to FIG. 54.

When a depletion layer spreads between the individual gate regions and a sufficiently high potential barrier is formed in the channel, the injection of electrons from the cathode region stops and the switching waveform enters the fall period $t_2$ (FIG. 51).

FIG. 52 shows how a tail current flows in the tail period $t_3$.

It is a problem of the conventional SI thyristor that the quantity of charges to be extracted from the gate, Qha+Qhb+Oe, is very large. An important problem, in particular, is that the quantity of charges, Qhb, is large. The large quantity of charges to be pulled out of the gate inevitably calls for a bulky gate driver and also constitutes a serious obstacle to the speeding up of the switching operation of the SI thyristor. It may sometimes form the cause leading to the destruction of the device with an increase in a gate loss at turn-off under high temperature conditions.

SUMMARY OF THE INVENTION

It is an object of the present invention to provide a static induction semiconductor device with a distributed main electrode structure which allows the shortening of the minority carrier storage time and the fall time and substantial reduction of the quantity of charges to be extracted from the gate electrode and hence is excellent in turn-off performance and easy to use.

Another object of the present invention is to provide a static induction semiconductor device with a distributed main electrode structure in which the breakdown voltage between the gate and the source or between the gate and the cathode is suppressed from variations and hence is uniform.

Another object of the present invention is to provide a static induction semiconductor device with a distributed main electrode structure in which the source or cathode is laid out in a manner to minimize variations in the distance between the gate and the source or between the gate and the cathode after diffusion to provide therebetween a uniform breakdown voltage.

Another object of the present invention is to provide a static induction semiconductor device with a distributed main electrode structure which permits extraction of charges from the cathode or source electrode as well as from the gate electrode at turn-off.

Another object of the present invention is to provide a static induction semiconductor device which employs a distributed structure in the cathode or source region so as to permit easy extraction of charges from the cathode or source electrode as well as from the gate electrode at turn-off.

Another object of the present invention is to provide an easy-to-use static induction semiconductor device with a distributed main electrode structure which permits reduction of the quantity of charges to be extracted from the gate electrode at turn-off and hence allows simplification of the gate driver.

Another object of the present invention is to provide a static induction semiconductor device with a distributed main electrode structure which has decreased gate-loss to improve the device durability at high temperature through reduction of the quantity of charges to be extracted from the gate electrode.

Another object of the present invention is to provide a static induction semiconductor device with an SI main electrode shorted structure which allows the shortening of the minority carrier storage time and the fall time and substantial reduction of the quantity of charges to be extracted from the gate electrode at turn-off and hence is excellent in turn-off performance and easy to use.

Another object of the present invention is to provide a static induction semiconductor device with an SI main electrode shorted structure in which the breakdown voltage between the gate and the source or between the gate and the cathode is suppressed from variations and hence is uniform.

Another object of the present invention is to provide a static induction semiconductor device with an SI main electrode shorted structure in which the source or cathode is laid out in a manner to minimize variations in the distance between the gate and the source or between the gate and the cathode after diffusion to provide therebetween a uniform breakdown voltage.

Another object of the present invention is to provide a static induction semiconductor device with an SI main electrode shorted structure which permits effective extraction of charges from the cathode or source electrode as well as from the gate electrode at turn-off.

Another object of the present invention is to provide a static induction semiconductor device which employs a distributed structure and an SI main electrode shorted structure in the cathode or source region so as to permit easy extraction of charges from the cathode or source electrode as well as from the gate electrode at turn-off.

Another object of the present invention is to provide an easy-to-use static induction semiconductor device with an SI main electrode shorted structure which permits reduction of the quantity of charges to be extracted from the gate electrode at turn-off and hence allows simplification of the gate driver.

Still another object of the present invention is to provide a static induction semiconductor device with an SI main electrode shorted structure which has increased gate-loss device durability at high temperature through reduction of the quantity of charges to be extracted from the gate electrode.

The static induction semiconductor device according to the present invention has a distributed main electrode structure in which the cathode or source electrode is formed not only over the cathode or source diffused layer but also in contact with the surface of a semiconductor substrate just above channels formed therein. Furthermore, the static induction semiconductor device has an SI cathode or source shorted structure surrounded by the cathode or source diffused regions.

The static induction (SI) main electrode (cathode or source) shorted structure mentioned herein is a structure in which a shorted structure by the static induction (SI) effect is implemented in the cathode or source region. More specifically, it is a distributed main electrode structure in which a shorted region of a conductivity type opposite to that of the main electrode region but identical with that of a control region is formed in a low impurity density region surrounded by a region of a high impurity density relative to that of the former. The main electrode region and the shorted region are connected via the main electrode. The shorted region is surrounded by a depletion layer that spreads from the high impurity density region toward the low impurity density region. Between the shorted region and the control region there is formed a potential barrier whose height is controlled by the static induction (SI) effect. Consequently, carriers between the gate region acting as the control region and the shorted region are placed under the control of the potential barrier by the static induction (SI) effect. The provision of such a shorted region heightens the effect of drifting minority carriers to the main electrode.

Furthermore, the main electrode shorted structure is provided in the distributed main electrode structure in which cathode or source diffused regions are distributed so as to suppress variations in the breakdown voltage.

To facilitate extraction of charges from the cathode or source electrode as well as from the gate electrode at turn-off, the main electrode region is formed by regions each having an impurity density high or low relative to the other, and a short-circuit region is formed in the low impurity density region in contact with the cathode or source electrode. The low impurity density region is what is called a conduction channel for bypassing minority carriers that ought to be extracted from the gate region, and the short-circuit region serves as a so-called drain, further heightening the effect that allows easy extraction of the minority carriers from the cathode or source electrode as well.

The distributed main electrode structure mentioned herein is a structure in which the impurity density in the main electrode region is distributed nonuniformly and inhomogeneously throughout it. The distributed main electrode structure also includes a structure in which high and low impurity density regions are distributed throughout the main electrode region; in this case, the both regions may be of the same conductivity type or opposite to each other. The cathode or source electrode is partly connected to the both regions. The point is that this structure has a minority carrier conduction channel formed in the main electrode region as well.

The static induction (SI) semiconductor device with the distributed main electrode structure according to the present invention, comprises a first main electrode region formed in a first main surface of a high resistivity region, a second main electrode region formed in the first or second main surface of the high resistivity region, and a control region formed near the first main electrode region. The control region forms a channel region in the high resistivity region and controls the main current between the first and second main electrode regions by controlling the height of a potential barrier in the channel region. The first main electrode region has a structure in which high and low impurity density regions are distributed, and the electrode that makes contact with the first main electrode region is partly in contact with both of the high and low impurity density regions. The high and low impurity density regions forming the first main electrode region are identical in conductivity type with each other but opposite to the control region.

According to another aspect of the invention, in the SI semiconductor device with the distributed main electrode structure the electrode that makes contact with the first main electrode region has ohmic contact with the high impurity density region and non-ohmic or Schottky contact with the low impurity density region.

According to another aspect of the invention, in the SI semiconductor device with the distributed main electrode structure the electrode that makes contact with the low impurity density region of the first main electrode region is formed of aluminum (Al), molybdenum (Mo), tungsten (W), platinum (Pt), titanium (Ti) or nickel (Ni), or their silicon-base alloys or silicides.

According to another aspect of the invention, in the SI semiconductor device with the distributed main electrode structure the high impurity density region in the first main electrode region is composed of separated regions.

According to another aspect of the invention, in the SI semiconductor device with the distributed main electrode structure the control region has a buried structure.

According to another aspect of the invention, in the SI semiconductor device with the distributed main electrode structure the control region has a recessed structure.

According to another aspect of the invention, in the SI semiconductor device with the distributed main electrode structure the control region has a planar structure.

According to another aspect of the invention, the SI semiconductor device with the distributed main electrode structure is an SI thyristor.

According to another aspect of the invention, the SI semiconductor device with the distributed main electrode structure is an SI transistor.

The static induction (SI) main electrode shorted structure mentioned herein is a structure in which a main electrode structure is introduced into the distributed main electrode structure and carriers flowing into the short-circuit region are controlled through potential barrier control by the static induction (SI) effect.

The static induction (SI) semiconductor device with the static induction (SI) main electrode shorted structure according to the present invention comprises a first main electrode region formed in a first main surface of a high resistivity region, a second main electrode region formed in the first or second main surface of the high resistivity region, and a control region formed near the first main electrode region. The control region forms a channel region in the high resistivity region and controls the main current between the first and second main electrode regions by controlling the height of a potential barrier in the channel region. The first main electrode region has a structure in which a high impurity density region, a low impurity density region and a short-circuit region formed in the low impurity density region surrounded by the high impurity density regions are distributed. The electrode that makes contact with the first main electrode region partly contacts both of the high and low impurity density regions. The short-circuit region has the same conductivity type as that of the control region but opposite in conductivity to the high impurity density region of the first main electrode region. A potential barrier is formed in the low impurity density region between the short-circuit region and the control region by a depletion layer which spreads from the high impurity density region into the low impurity density region, and, the high and low impurity density regions forming the first main electrode region have the same conductivity type but are opposite in conductivity to the control region.

According to another aspect of the invention, in the SI semiconductor device with the SI main electrode shorted structure, the electrode makes contact with the first main electrode region makes ohmic contact with the high impurity density region and non-ohmic or Schottky contact with the low impurity density region.

According to another aspect of the invention, in the SI semiconductor device with the SI main electrode shorted structure, the electrode that makes contact with the low impurity density region of the first main electrode region is formed of aluminum (Al), molybdenum (Mo), tungsten (W), platinum (Pt), titanium (Ti) or nickel (Ni), or their silicon-base alloys or silicides.

According to another aspect of the invention, in the SI semiconductor device with the SI main electrode shorted structure, the high impurity density region in the first main electrode region is composed of separated regions.

According to another aspect of the invention, in the SI semiconductor device with the SI main electrode shorted structure, the control region has a buried structure.

According to another aspect of the invention, in the SI semiconductor device with the SI main electrode shorted structure, the control region has a recessed structure.

According to another aspect of the invention, in the SI semiconductor device with the SI main electrode shorted structure, the control region has a planar structure.

According to another aspect of the invention, in the SI semiconductor device with the SI main electrode shorted structure is an SI thyristor.

According to another aspect of the invention, in the SI semiconductor device with the SI main electrode shorted structure is an SI transistor.

BRIEF DESCRIPTION OF THE DRAWINGS

FIG. 17 is a schematic diagram showing the motion of carriers during the ON-state period $t_0$;

FIG. 18 is a schematic diagram showing the motion of carriers during the minority carrier storage period $t_1$;

FIG. 19 is a schematic diagram showing the motion of carriers during the fall period $t_2$;

FIG. 20 is a schematic diagram showing the motion of carriers during the tail period $t_3$;

DESCRIPTION OF THE PREFERRED EMBODIMENT

Now, a description will be given first of the principles of operation of the SI semiconductor device with the distributed main electrode structure and the SI semiconductor device with the SI main electrode shorted structure according to the present invention.

Figure 16:
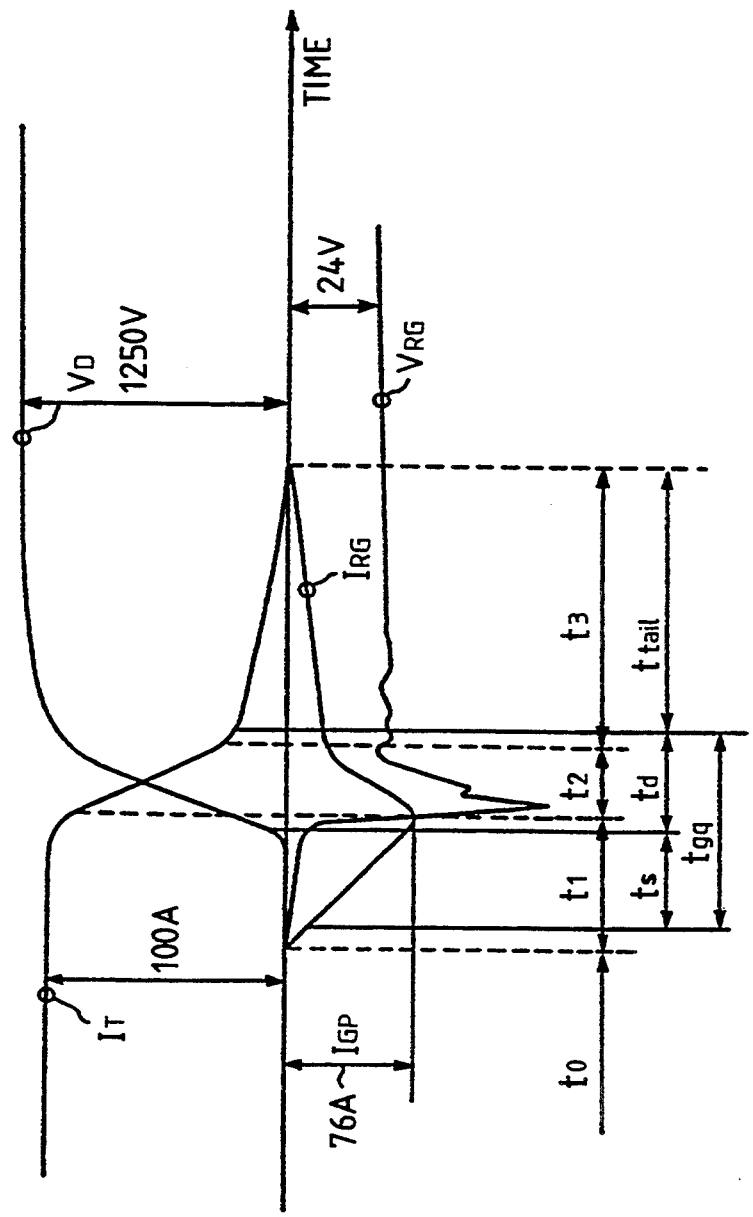
FIG. 16 schematically shows an example of a switching waveform of an SI thyristor with the distributed cathode structure (under 1250 V–100 A switching conditions)
Figure 21:
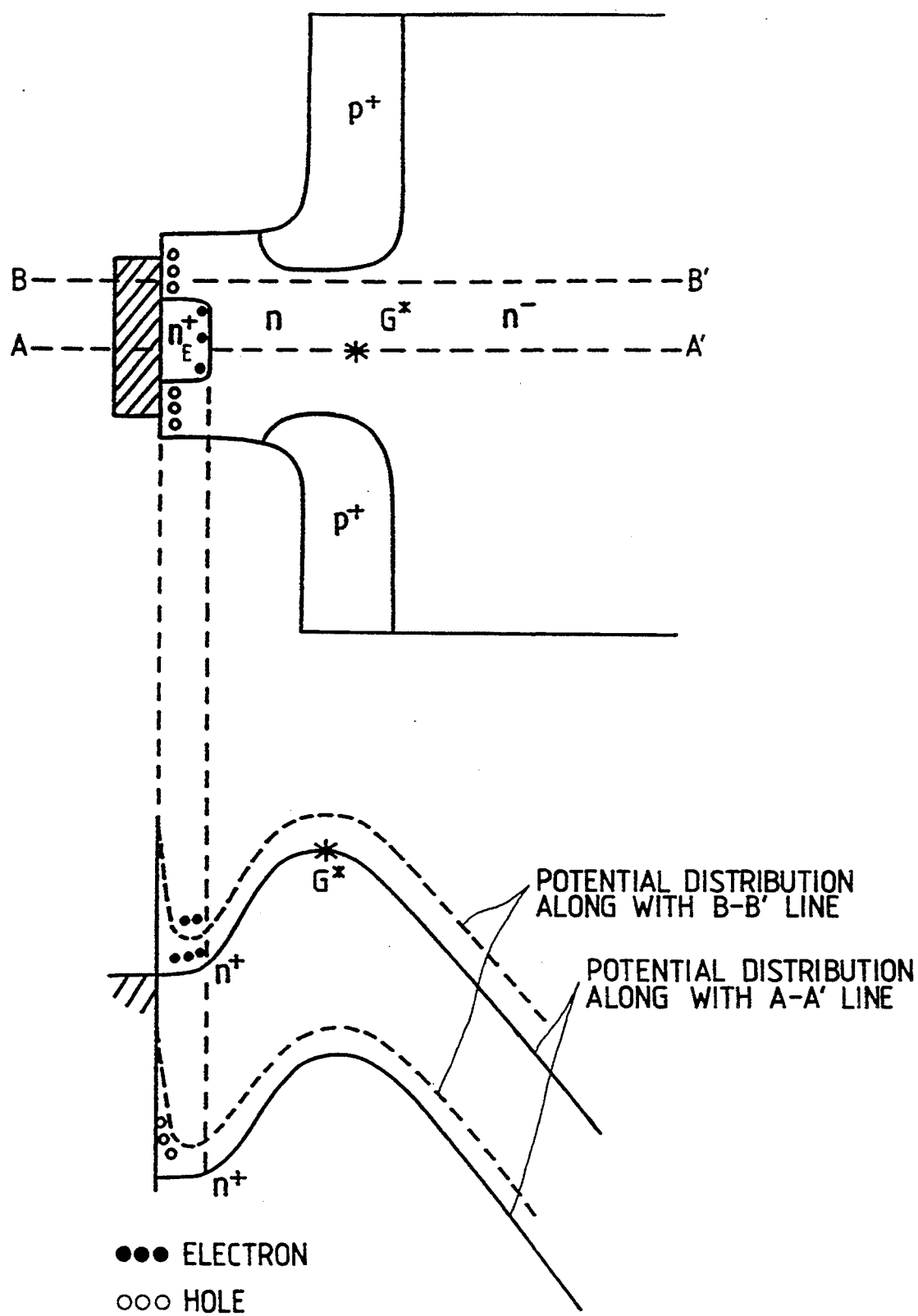
FIG. 21 is a diagram for explaining the distributed main electrode structure according to the present invention and the potential distribution therein.

FIG. 16 through 21 are diagrams for explaining the principles of operation of the SI thyristor with the distributed main electrode (cathode) structure according to the present invention. FIG. 16 shows an example of a switching waveform of the SI thyristor at turn-off under 1250 V–100 A conditions, and FIGS. 17 through 20 are schematic diagrams for explaining the motion or migration carrier of carriers in the on state period ($t_0$), the minority storage period ($t_1$), fall period ($t_2$) and tail period ($t_3$). FIG. 21 schematically shows the potential distribution in the distributed cathode structure and its vicinity. Incidentally, FIGS. 16 through 21 correspond to FIGS. 48 through 52 referred to previously for explaining the principles of operation of the prior art.

Figure 48:
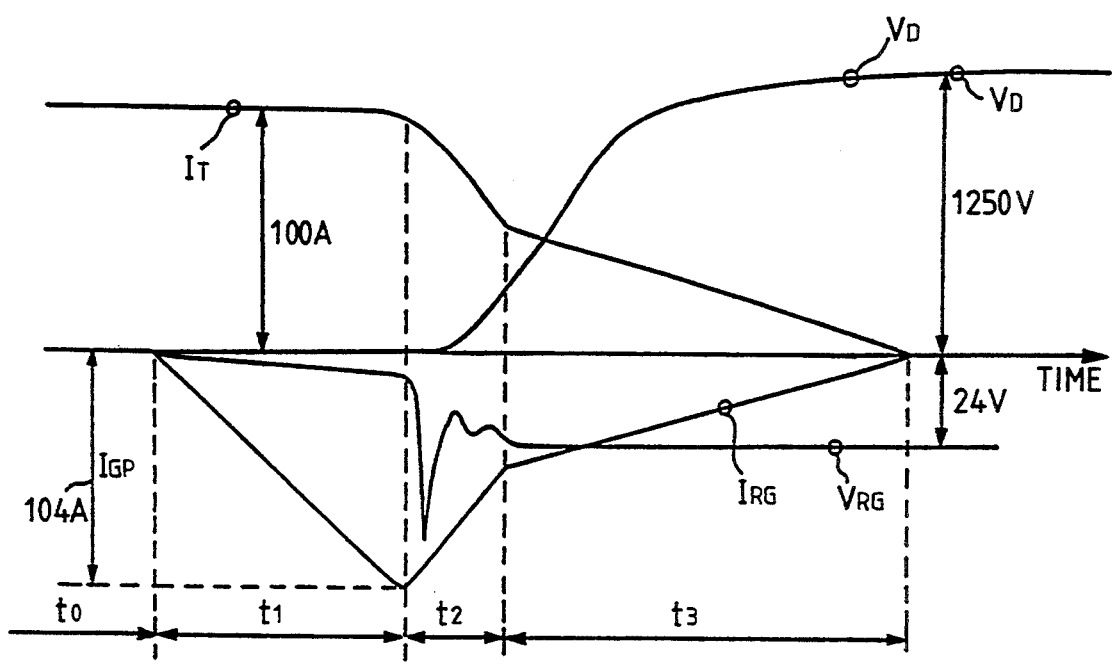
FIG. 48 schematically shows a typical switching waveform (under 1250 V–100 A switching conditions) in a conventional structure with no distributed cathode)

As is evident from FIGS. 16 and 48, the device of the present invention is faster in operation, smaller in the gate peak current value $I_{GP}$ at turn-off and smaller in the quantity of charges extracted from gate at turn-off than in the prior art.

Figure 49:
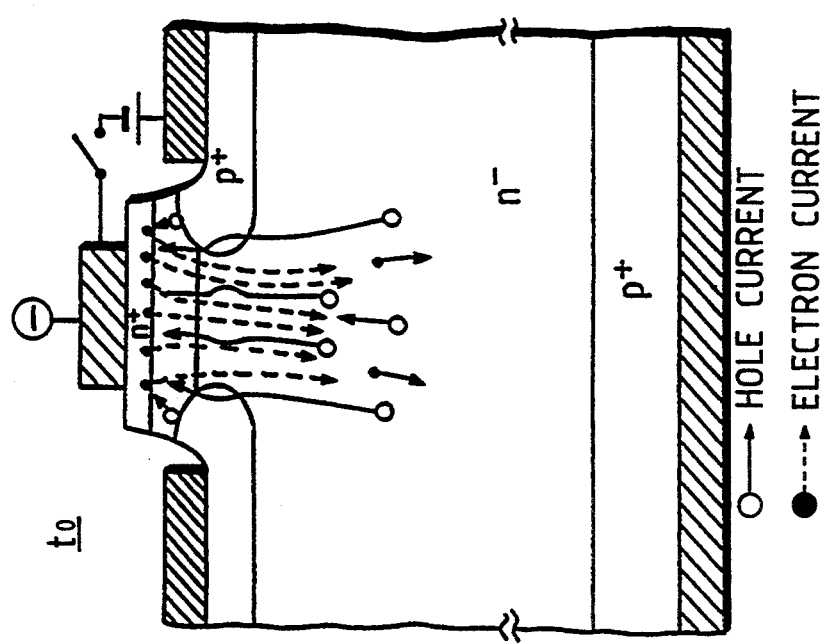
FIG. 49 is a schematic diagram showing the motion of carriers during the ON-state period $t_0$.
Figure 52:
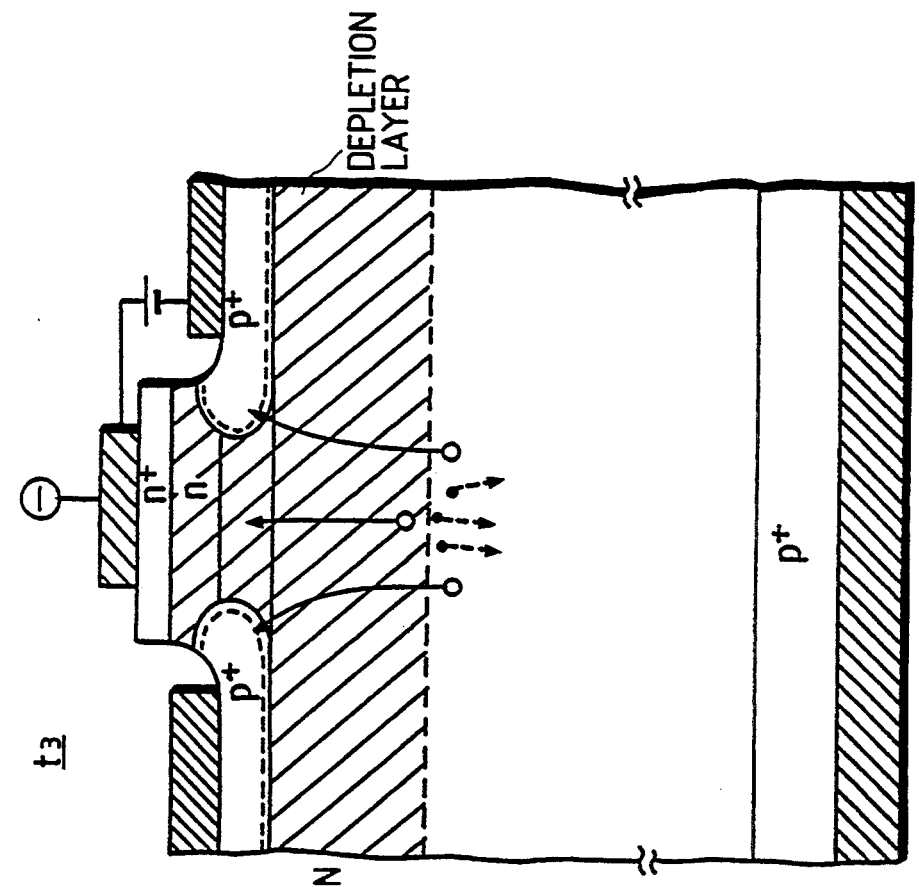
FIG. 52 is a schematic diagram showing the motion of carriers during the tail period $t_3$.
Figure 51:
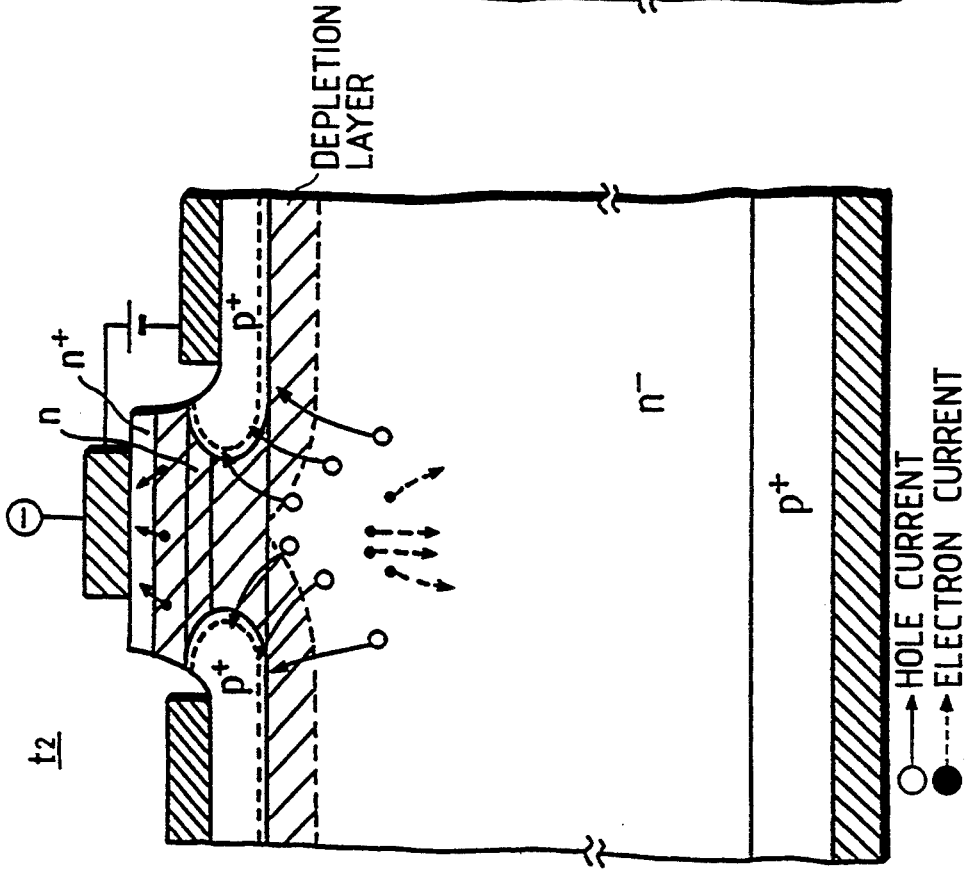
FIG. 51 is a schematic diagram showing the motion of carriers during the fall period $t_2$.
Figure 53:
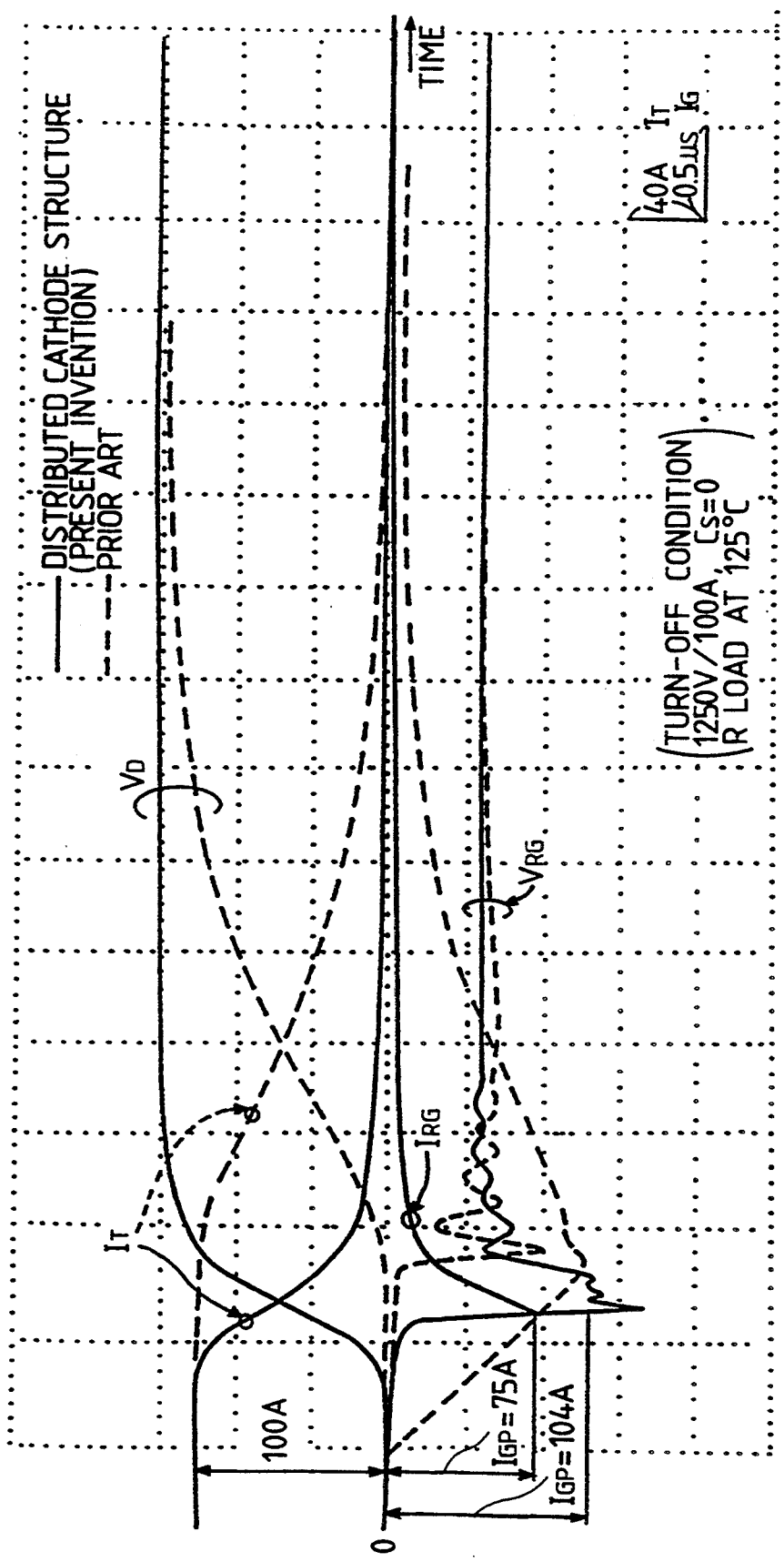
FIG. 53 is a schematic diagram showing turn-off waveforms of a conventional thyristor and the SI thyristor with the distributed cathode structure according to the present invention (under 1250 V–100 A switching conditions)

In the on state period to there is no particular difference in the motion or migration of carriers between the device of the present invention and the prior art device, as seen from FIGS. 17 and 49. In the device of the present invention, since the cathode electrode is in contact with the n-type epitaxial layer as well, the hole current flows into the cathode electrode through the n-type epitaxial layer as well as through the $n^+$-type cathode region during the on state $t_0$. In fact, the hole current rather tends to flow toward the cathode electrode through the n-type epitaxial layer, which has a relatively lower impurity density than that of the $n^+$-type cathode region.

An operational feature of the present invention accounts for movements of carriers during the minority carrier storage period $t_1$ in FIG. 18. When a reverse bias is applied across the gate and the cathode, the potential of the gate rises and the potential barrier height in the channel increases. As a result, holes are pulled out from the gate but they are mostly those (Qha) of the hole current iha from the anode. The charges Qhb of the current ihb of holes distributed in the n-type epitaxial layer near the gate region and between the gate and the cathode are partly extracted from the gate region but not completely, because the hole current ihb mostly flows into the cathode electrode. The reason for this is that holes distributed in the n-type epitaxial layer near the cathode electrode readily flow into the latter through their contact portion as will be seen from the potential distribution profile for holes described later on. The electron current ie behaves in the same fashion as in the prior art.

Figure 50:
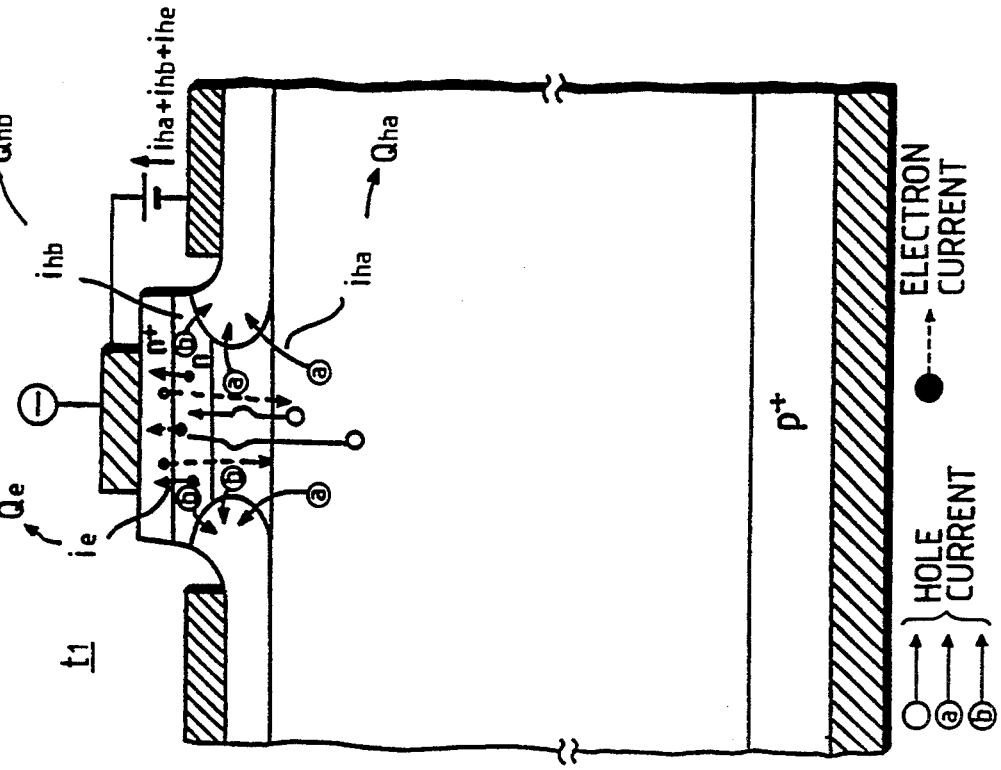
FIG. 50 is a schematic diagram showing the motion of carriers during the minority carrier storage period $t_1$.

Thus, in the conventional structure the pull-out gate current is iha+ihb+ie and the quantity of charges pulled out of the gate is Qha+Qhb+Qe as shown in FIG. 50, whereas in the present invention the former is iha−ihb+ie and the latter Qha−Qhb+Qe as shown in FIG. 18.

Figure 54:
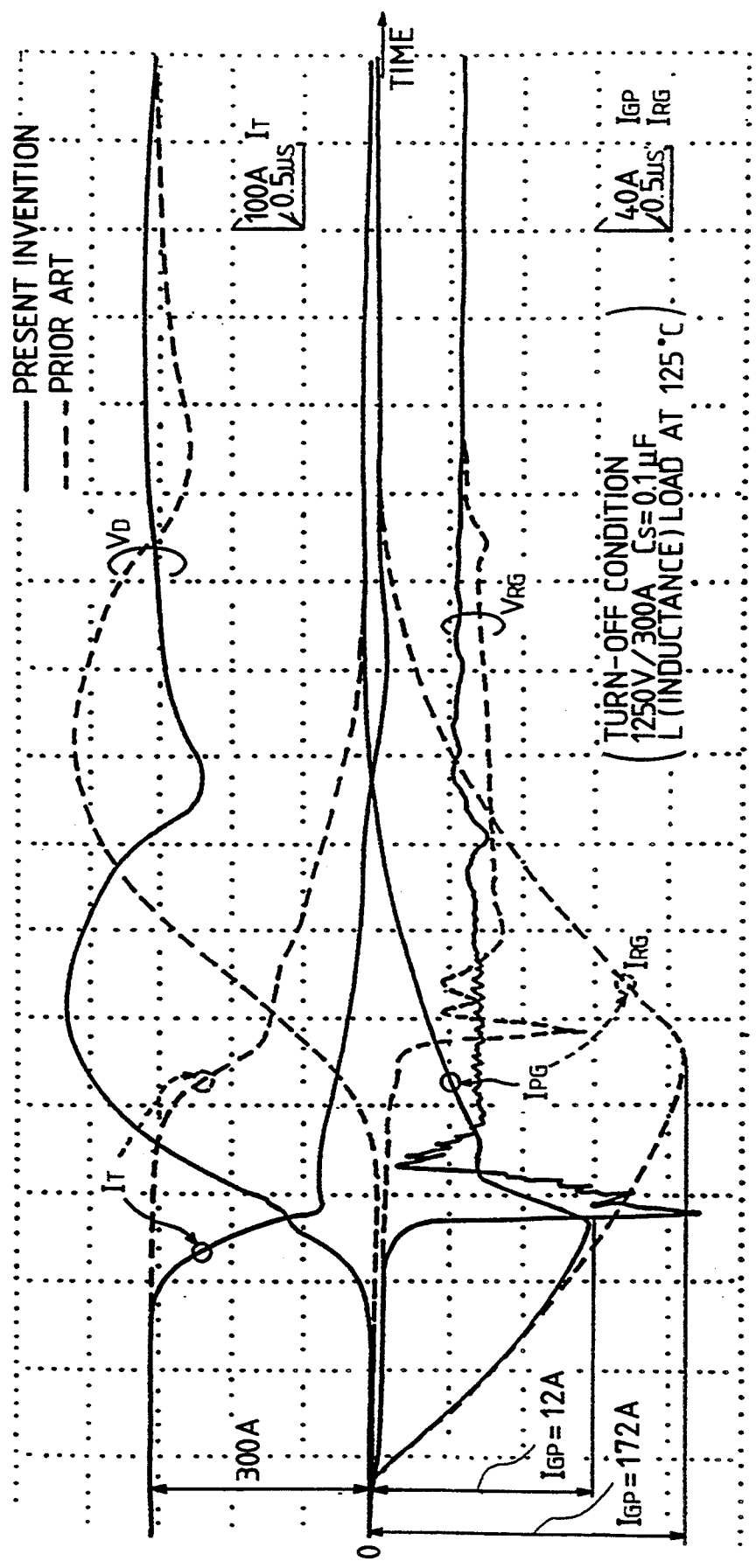
FIG. 54 is a schematic diagram similarly showing turn-off waveforms of the conventional thyristor and the SI thyristor with the distributed cathode structure according to the present invention (under 1250 V–300 A switching conditions)

According to the present invention, the quantity of charges extracted from the gate at turn-off under 1250 V–300 A switching conditions, based on the numeral values in FIG. 54, is given as follows:

Qha−Qhb+Qe=175.8 ($\mu$C) Therefore, it can be understood that Qha+Qe=316.2 ($\mu$C) and Qhb=140.0 ($\mu$C).

With the introduction of the distributed main electrode structure according to the present invention, the quantity of charges extracted from the gate at turn-off is reduced down to as small as about 38% of that in the prior art. Concrete switching data will be described later on.

The movements of carriers in the fall and tail periods $t_2$ and $t_3$, shown in FIGS. 19 and 20, are the same as in the conventional structure.

FIG. 21 schematically illustrates the distributed cathode structure of the SI thyristor according to the present invention and the potential distributions in the vicinity of the cathode electrode. The solid and broken lines indicate the potential distributions along the lines A—A′ and B—B′, respectively. As is evident from the potential distributions, holes are likely to be stored in the interface between the cathode electrode and the n-type epitaxial layer, and hence at turn-off the hole current ihb mostly tends to flow into the cathode electrode. Consequently, the quantity of charges that are extracted from the gate at turn-off is reduced by the quantity of charges Qhb of the hole current ihb.

Figure 23:
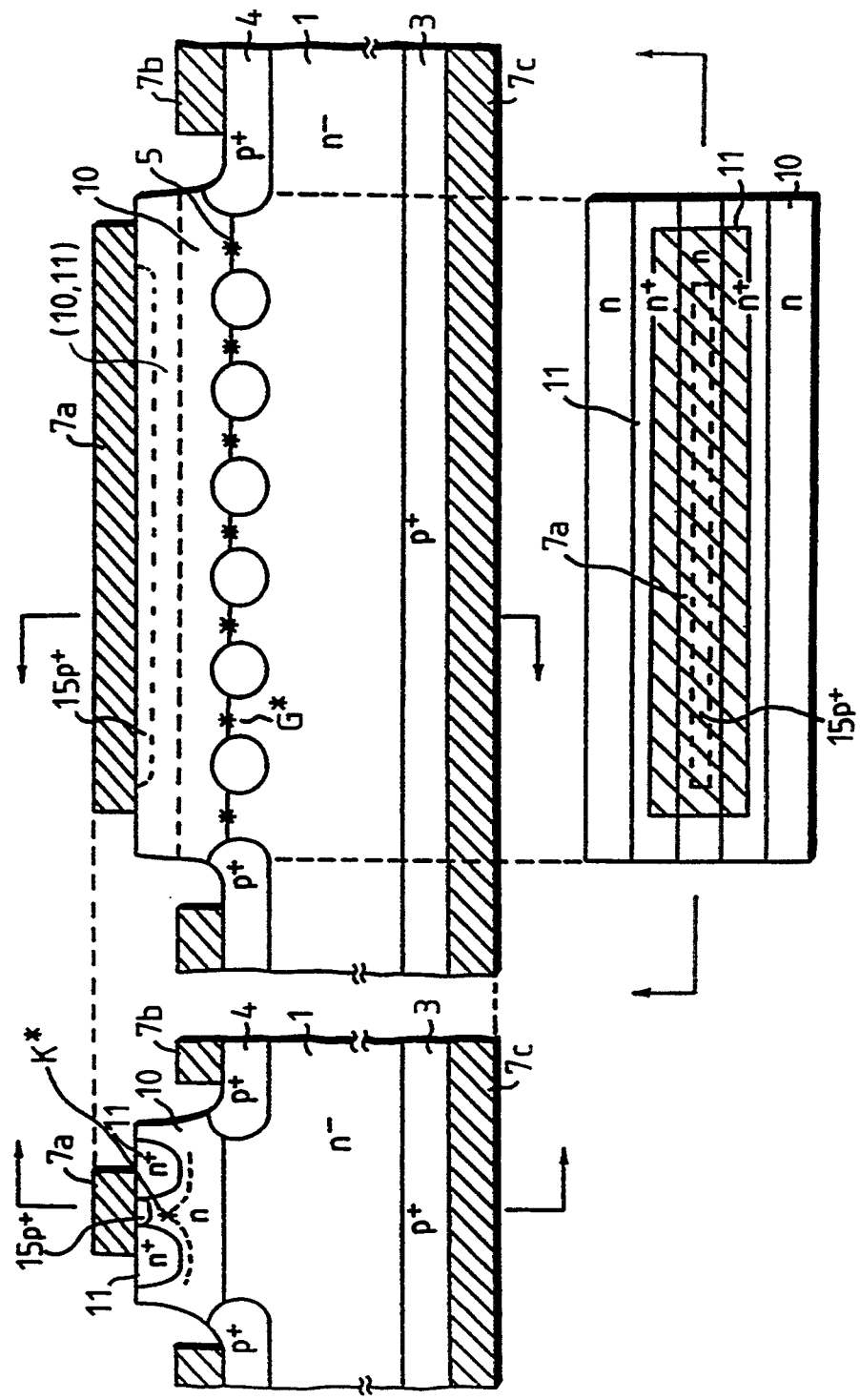
FIG. 23 schematically shows a sectional view and a top view of one unit segment portion of the SI semiconductor device with the SI main electrode shorted structure according to a sixteenth embodiment of the present invention.
Figure 37:
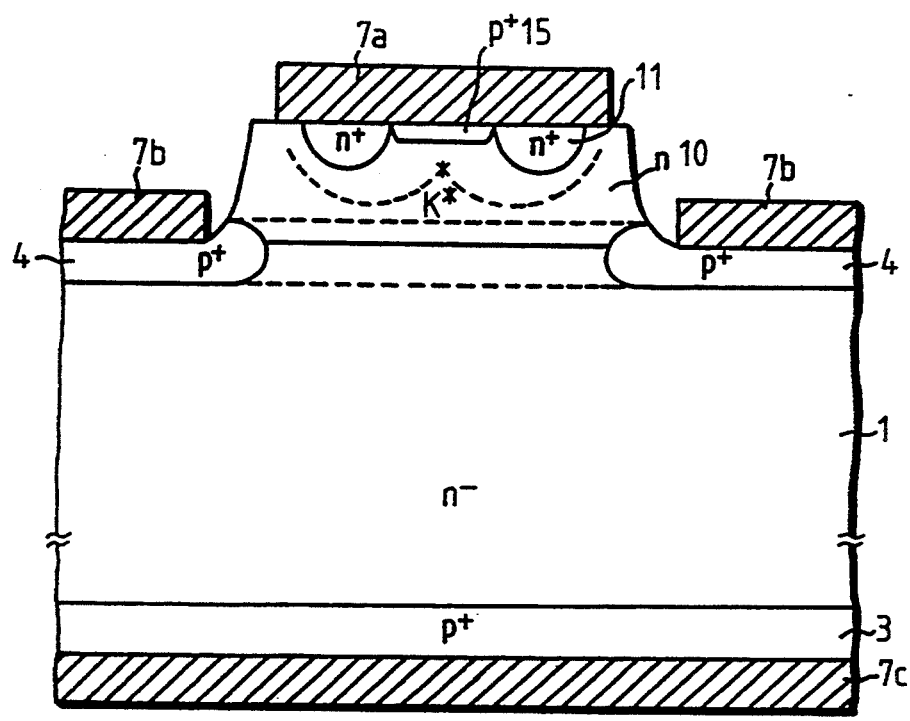
FIG. 37 is a schematic diagram for explaining the principles of operation of the present invention (a combination of the distributed cathode structure and the SI main electrode shorted structure)
Figure 40:
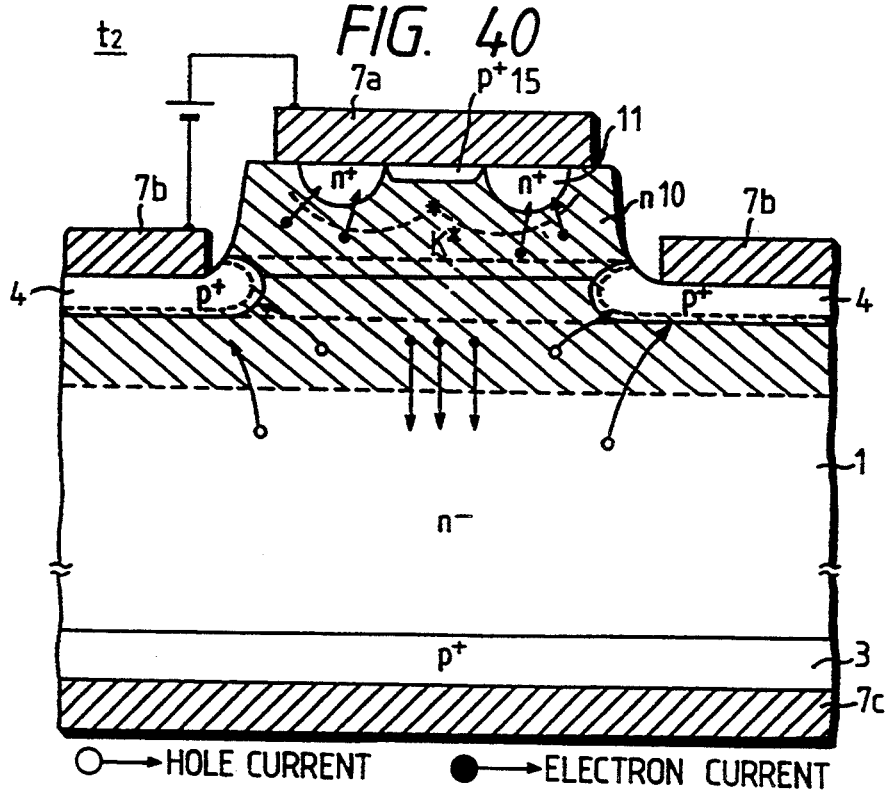
FIG. 40 is a schematic diagram showing the motion of carriers during the fall period $t_2$.
Figure 41:
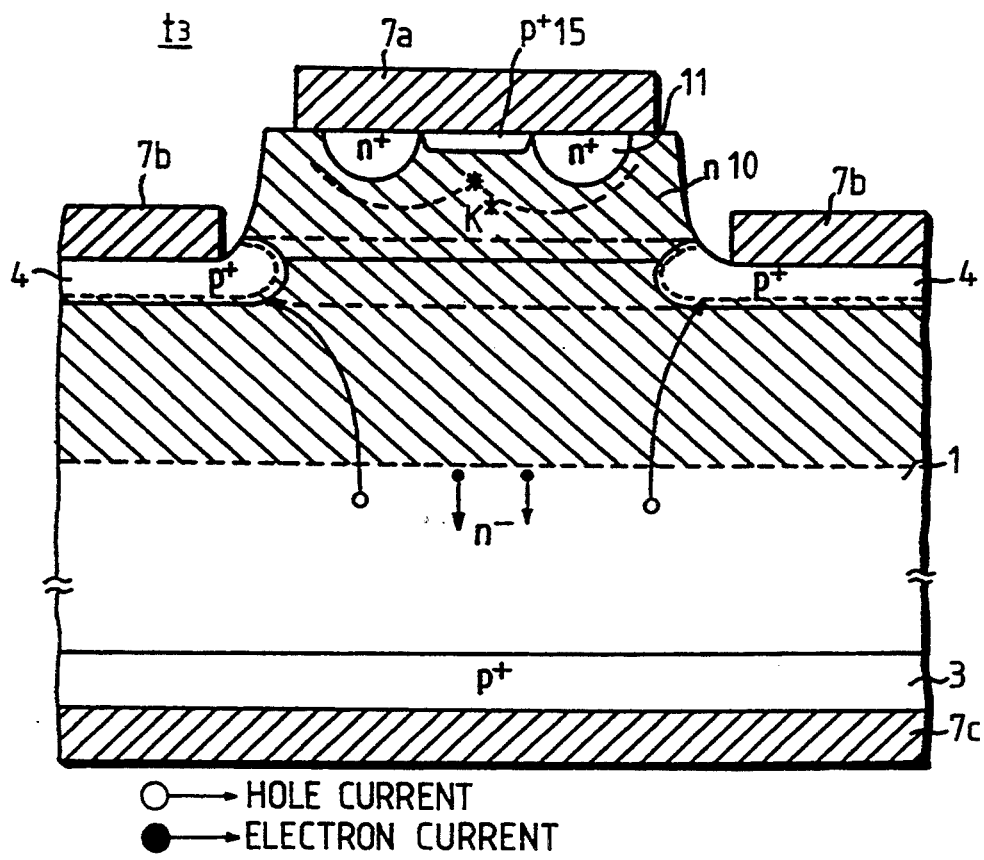
FIG. 41 is a schematic diagram showing the motion of carriers during the tail period $t_3$.
Figure 43:
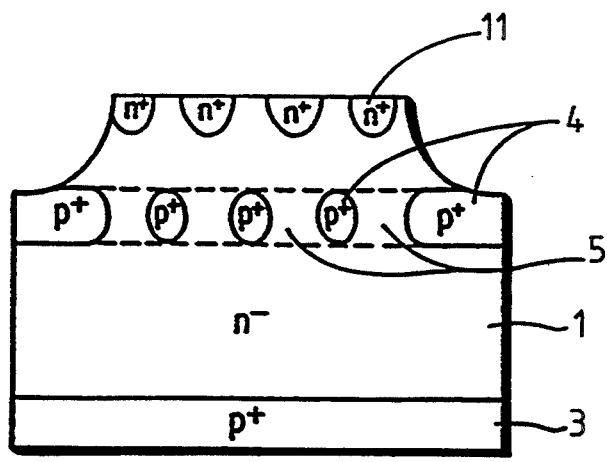
FIG. 43 is a schematic sectional view showing a conventional SI thyristor as a first prior art example.
Figure 42:
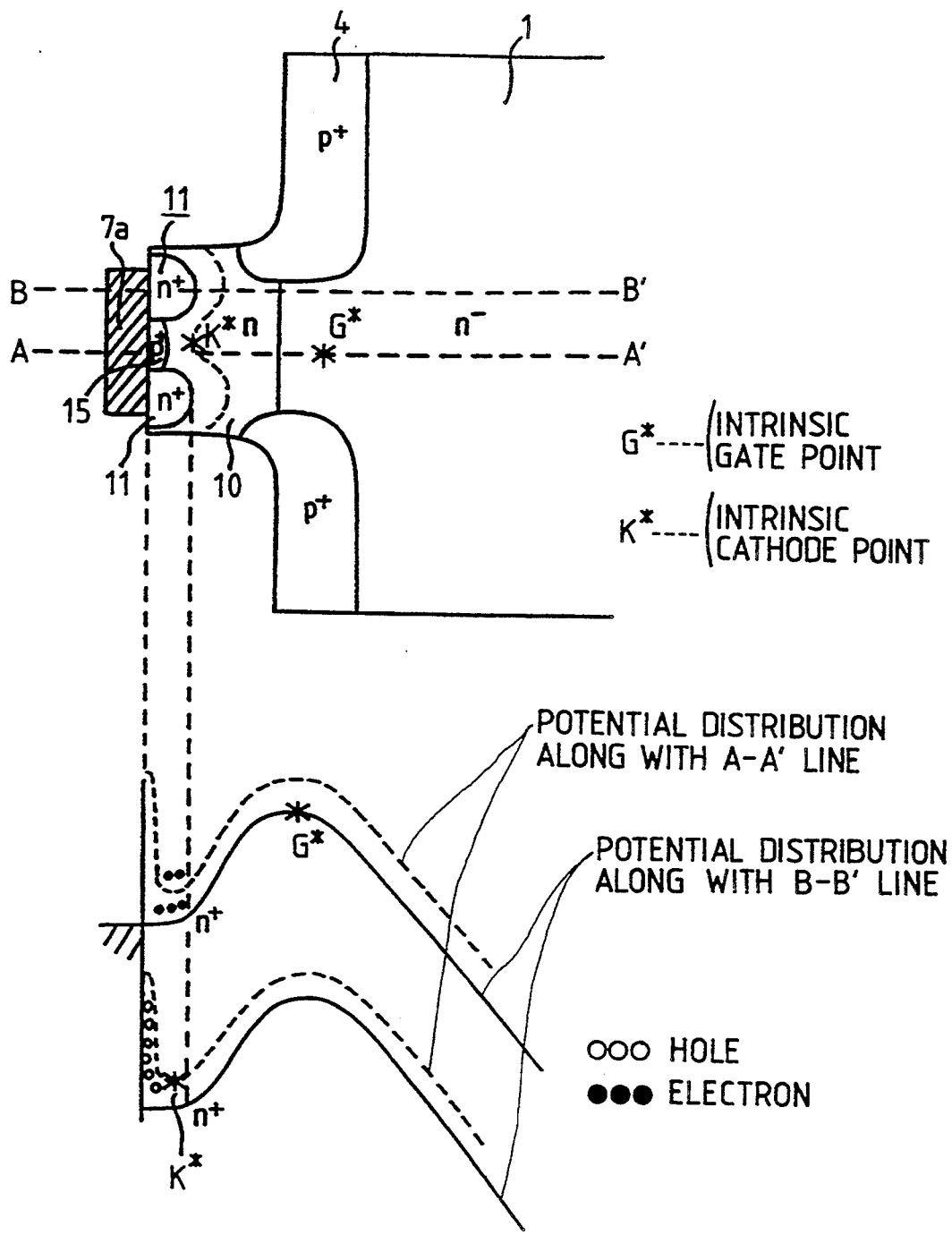
FIG. 42 is a schematic diagram for explaining the SI main electrode shorted structure and the potential distribution therein.
Figure 44:
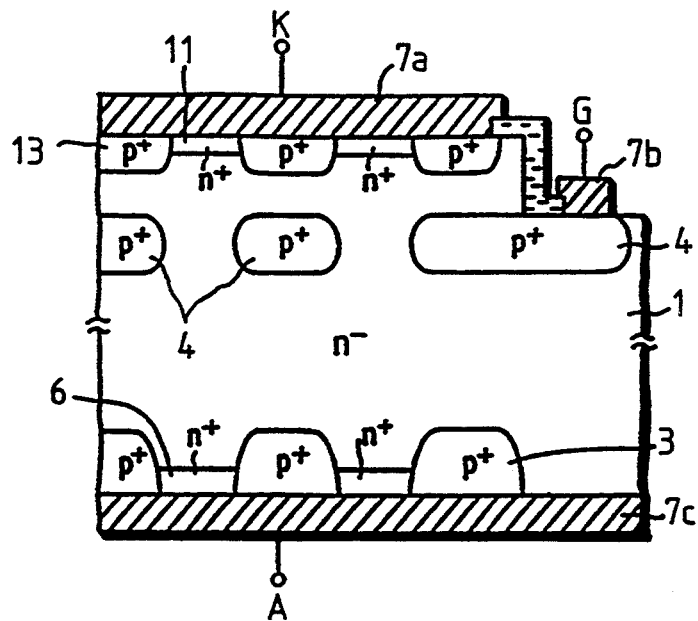
FIG. 44 is a schematic sectional view showing another conventional SI thyristor as a second prior art example.
Figure 45:
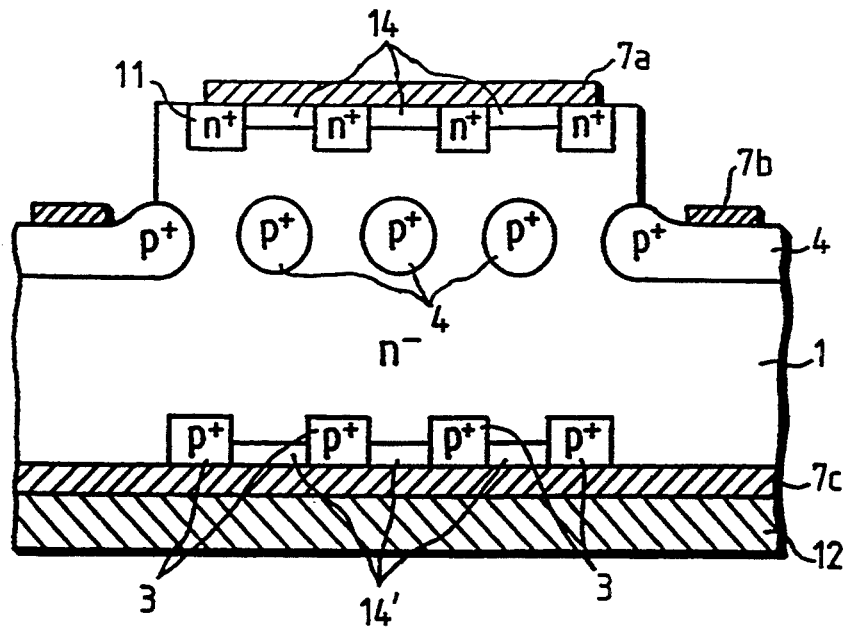
FIG. 45 is a schematic sectional view showing another conventional SI thyristor as a third prior art example.
Figure 46:
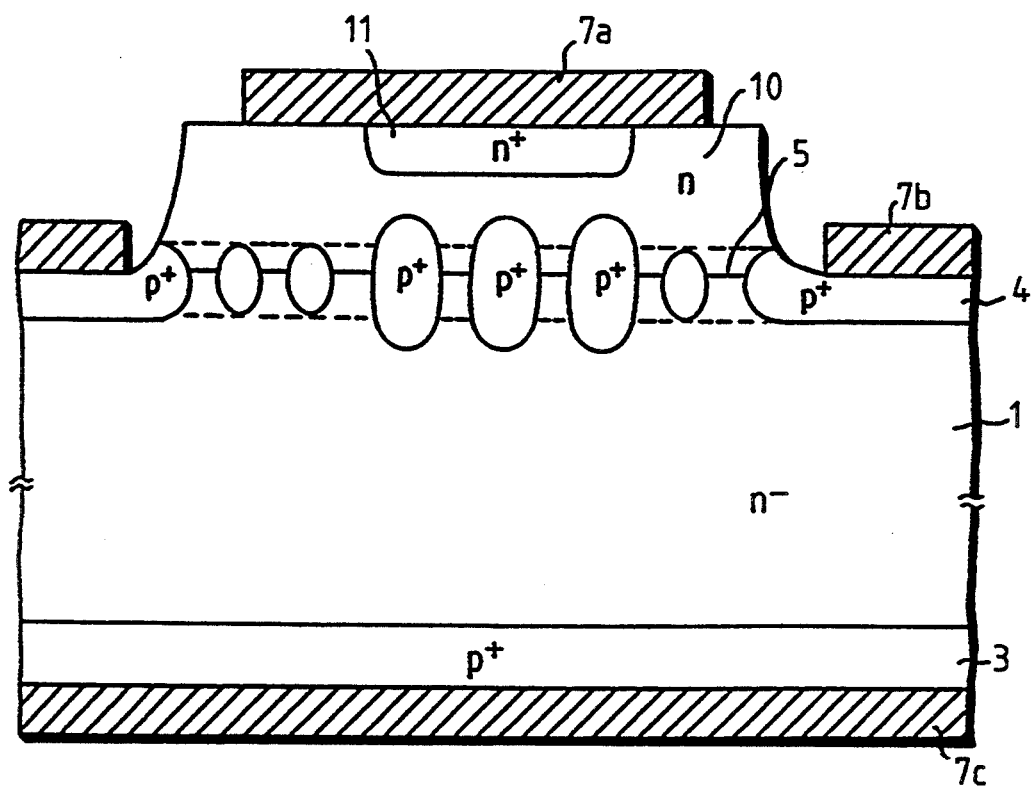
FIG. 46 is a schematic diagram showing how buried regions directly under an $n^+$-type cathode region are formed large.

FIG. 37 through 42 are diagrams for explaining the principles of operation of the SI thyristor with the SI main electrode (cathode) shorted structure according to the present invention. FIG. 37 illustrates, by way of example, the same structure as depicted in FIG. 23, in which the cathode electrode 7a is partly in contact with the n-type region 10. This is a combination of the SI cathode shorted structure and the distributed cathode structure. FIGS. 38 through 41 are diagrams for explaining the movements of carriers in the on state period $t_0$, the minority carrier storage period $t_1$, the fall period $t_2$ and the tail period $t_3$, respectively. FIG. 42 schematically illustrates the cathode structure according to the present invention and the corresponding potential distributions, from which it will be seen that the structure of this example permits easy flowing of holes into the cathode electrode.

FIG. 38 through 41 respectively correspond to FIGS. 49 through 52 explanatory of the principles of operation of the conventional structure referred to previously.

By virtue of the combination of the distributed cathode structure and the SI cathode shorted structure, the device of the present invention is high-speed in operation and small in the gate peak current $I_{GP}$ at turn-off and also in the quantity of charges extracted from the gate at turn-off, as compared with the prior art device.

Figure 38:
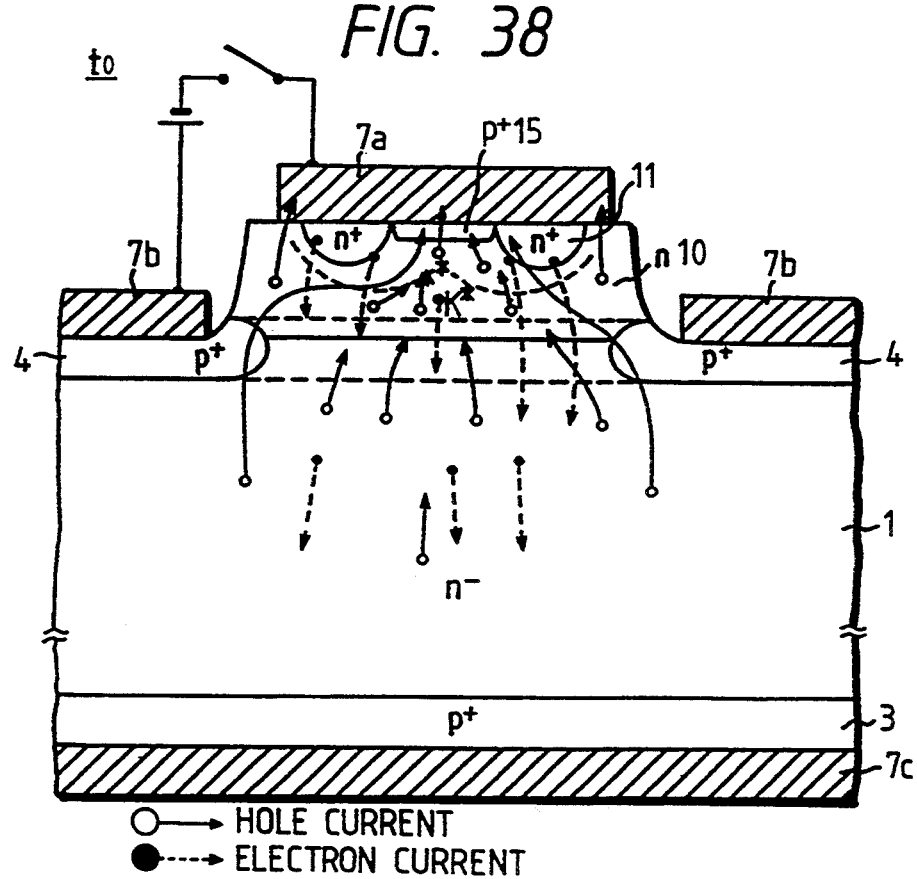
FIG. 38 is a schematic diagram showing the motion of carriers during the ON-state period $t_0$.

A comparison of FIG. 38 and 49 reveals that no particular difference in the movements of carriers during the on-state period $t_0$ between the device of the present invention and the conventional device. In the present invention, since the cathode electrode 7a is in contact with the n-type epitaxial region 10 and the p +-type cathode short-circuit region 15 as well as the n+-type cathode region 11, the hole current flows into the cathode electrode 7a through the n-type epitaxial region 10, which has relatively lower impurity density than that of the n+-type cathode region 11, and the p+-type cathode short circuit region 15 as well as through the n+-type cathode region 11 during the on-state period $t_0$. In this period $t_0$ the hole current rather tends to flow into the cathode electrode 7a through the n-type epitaxial region 10 and the p+-type cathode short-circuit region 15.

Figure 39:
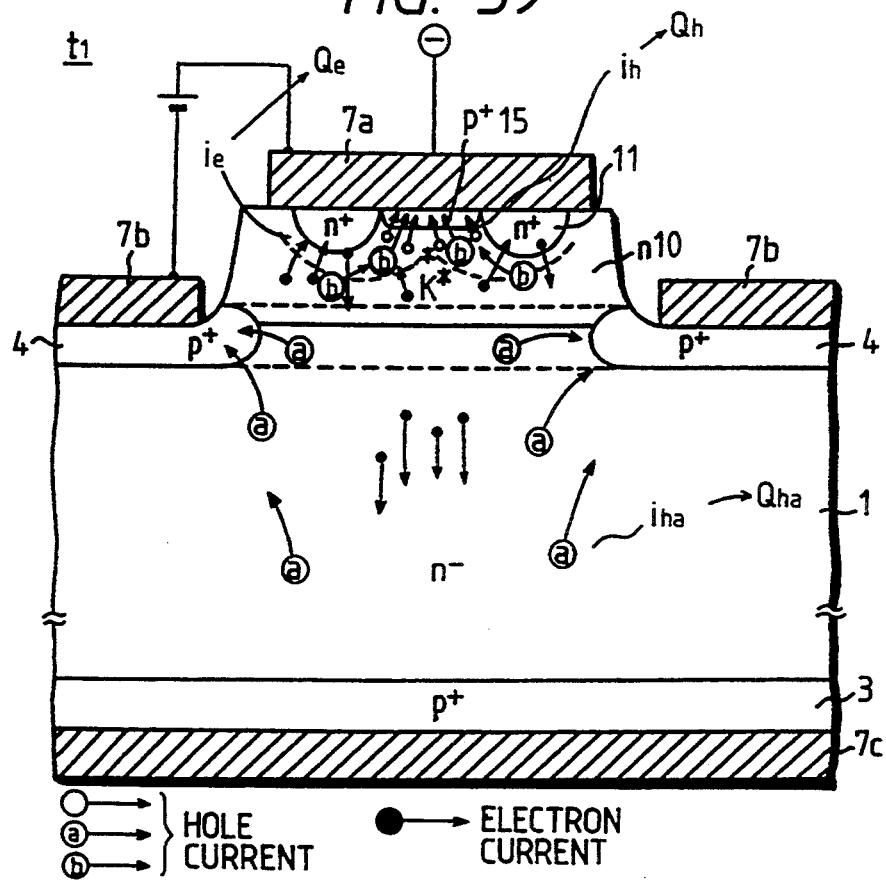
FIG. 39 is a schematic diagram showing the motion of carriers during the minority carrier storage period $t_1$.

An operational feature of the device of this embodiment accounts for movements of carriers in the minority carrier storage period $t_1$ in FIG. 39. When a reverse bias is applied across the gate and cathode, the gate potential rises and the potential barrier height in the channel increases accordingly. As a result, holes are pulled out of the gate but they are mostly those (Qha) of the hole current iha from the anode. The charges Qhb of the current ihb of holes distributed in the n-type epitaxial layer 10 near the gate region and between the gate and cathode are partly extracted from the gate but not completely, because the hole current ihb most flows into the cathode electrode 7a through the p+-type cathode short-circuit region 15 and the n-type region 10 epitaxial. The reason for this is that the holes near the cathode readily flow into the cathode electrode 7a via the p+type cathode short-circuit region 15 in the n-type epitaxial region 10, as will be seen from the distribution profile for holes described later on. The electron current ie behaves in the same fashion as in the conventional device.

Thus, in the prior art the pull-out gate current is iha+ihb+ie and the quantity of charges extracted from the gate is Qha+Qhb+Qe, whereas in the present invention that are iha−ihb+ie and Oha−Ohb+Oe, respectively. It must be noted here that the quantity of charges extracted from the gate in this structure is smaller than in the distributed main electrode structure without the p+-type short-circuit region 15.

With the introduction of the SI main electrode shorted structure according to the present invention, the quantity of charges that are pulled out of the gate at turn-off is appreciably reduced as compared with that in the prior art.

The movements of carriers shown in the fall and tail periods $t_2$ and $t_3$, shown in FIGS. 40 and 41, are the same as in the conventional device.

FIG. 42 schematically illustrates the cathode structure of the SI thyristor with the SI cathode shorted structure according to the present invention and potential profiles in the cathode and its vicinity. The full and broken lines indicate potential distributions along the lines A—A′ and B—B′. In front of the p+-type cathode short-circuit region 15 there is an intrinsic cathode point K* where the potential barrier against holes is highest, and in the channel region between adjacent gate regions 4 there is an intrinsic gate point G*. The currents of holes and electrons are controlled accordingly. As is evident from the potential distribution profiles, holes are readily stored in the interface between the cathode electrode 7a and the n-type epitaxial layer 10 and in the cathode short-circuit region 15, and consequently, the hole current ihb mostly tends to flow into the cathode electrode 7a at turn-off. Thus, the quantity of charges that are pulled out of the gate at turn-off is reduced accordingly.

Embodiment 1

Figure 1:
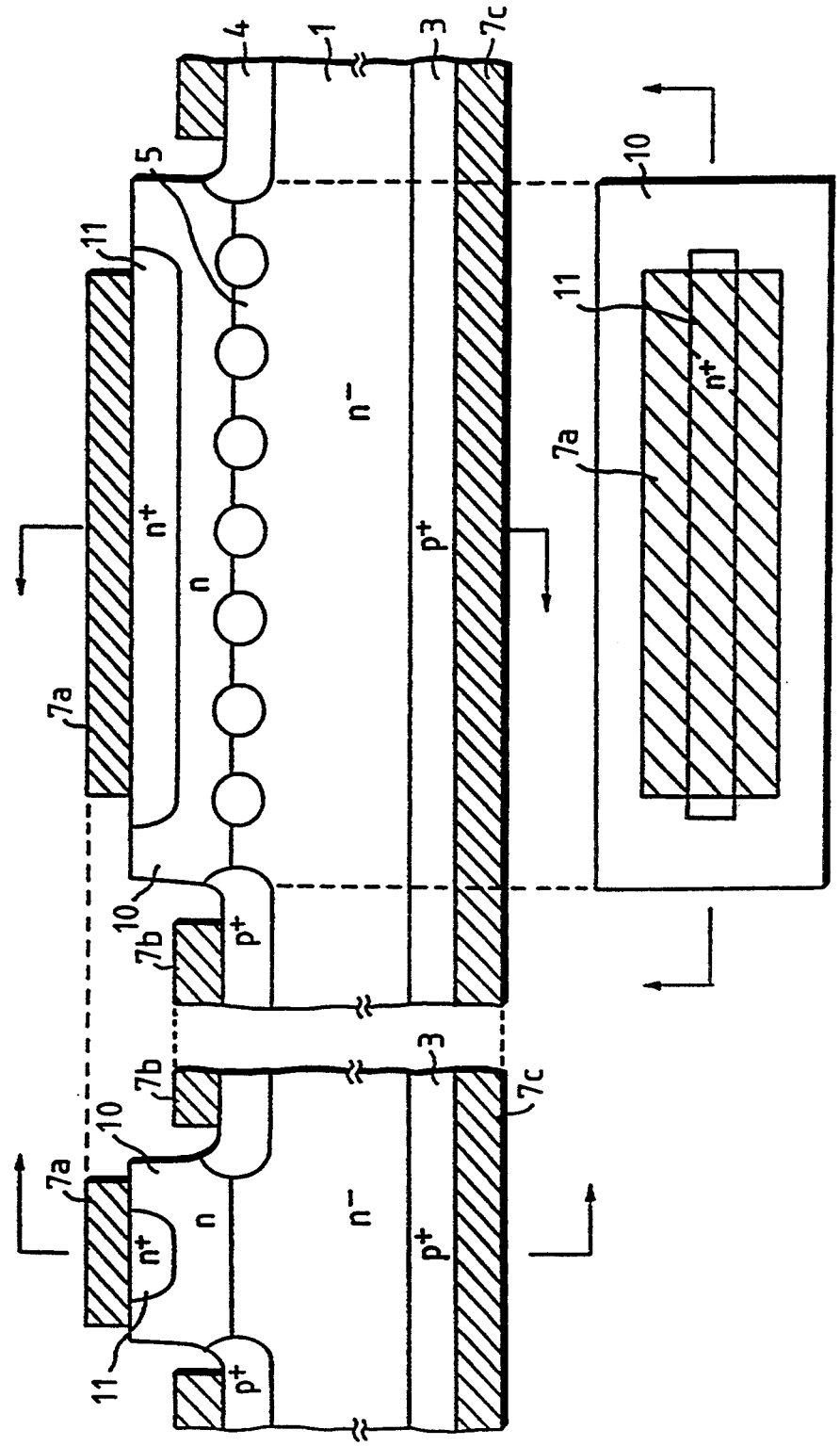
FIG. 1 schematically shows a sectional view and a top view of one unit segment portion of the SI semiconductor device with the distributed man electrode structure according to a first embodiment of the present invention.

FIG. 1 schematically shows a sectional view and a top plan view of one unit segment portion of the SI semiconductor device with the distributed main electrode structure according to a first embodiment of the present invention. Since the p+-type region 3, is an anode region, the device shown in FIG. 1 is an SI thyristor. When the region 3 is n+-type, the device is an SI transistor. Reference numeral 1 denotes an n−-type high resistivity layer; 4 denotes p+-type buried gate regions; 5 denotes a channel region defined between adjacent gate regions 4; 7a, 7b and 7c denote cathode, gate and anode electrodes, respectively; 10 denotes an n-type region formed by epitaxial growth, for example; and 11 denotes an n+-type cathode region. A structural feature of this embodiment is that the cathode electrode 7a is in contact with the n-type region 10 as well as the n+-type cathode region 11. The cathode electrode 7a is formed of Al, Al—Si, Mo, W, Pt, Ti or Ni, or their alloys or silicides. The cathode electrode 7a makes ohmic contact with the n+-type cathode region 11 but makes non-ohmic or Schottky contact with the n-type region 10. A difference in impurity density is set between the n+-type cathode region 11 and the n-type region 10 so that holes distributed in the n-type region 10 are easily stored in the interface between the regions 11 and 10. As is evident from the top plan view, the n+-type cathode region 11 is provided in a stripe form and is surrounded by the n-type region of an impurity density lower than that of the region 11 and the cathode electrode 7a makes contact with both of the regions 10 and 11 of different impurity densities to form a distributed cathode electrode structure.

The n-type region 10 needs only to facilitate the storage therein of holes and may also be formed as a p+-or p-type region lower in impurity density than the p+-type gate region 4. In such an instance, it is desirable that the cathode electrode 7a make Schottky contact with the region 10.

Embodiment 2

Figure 2:
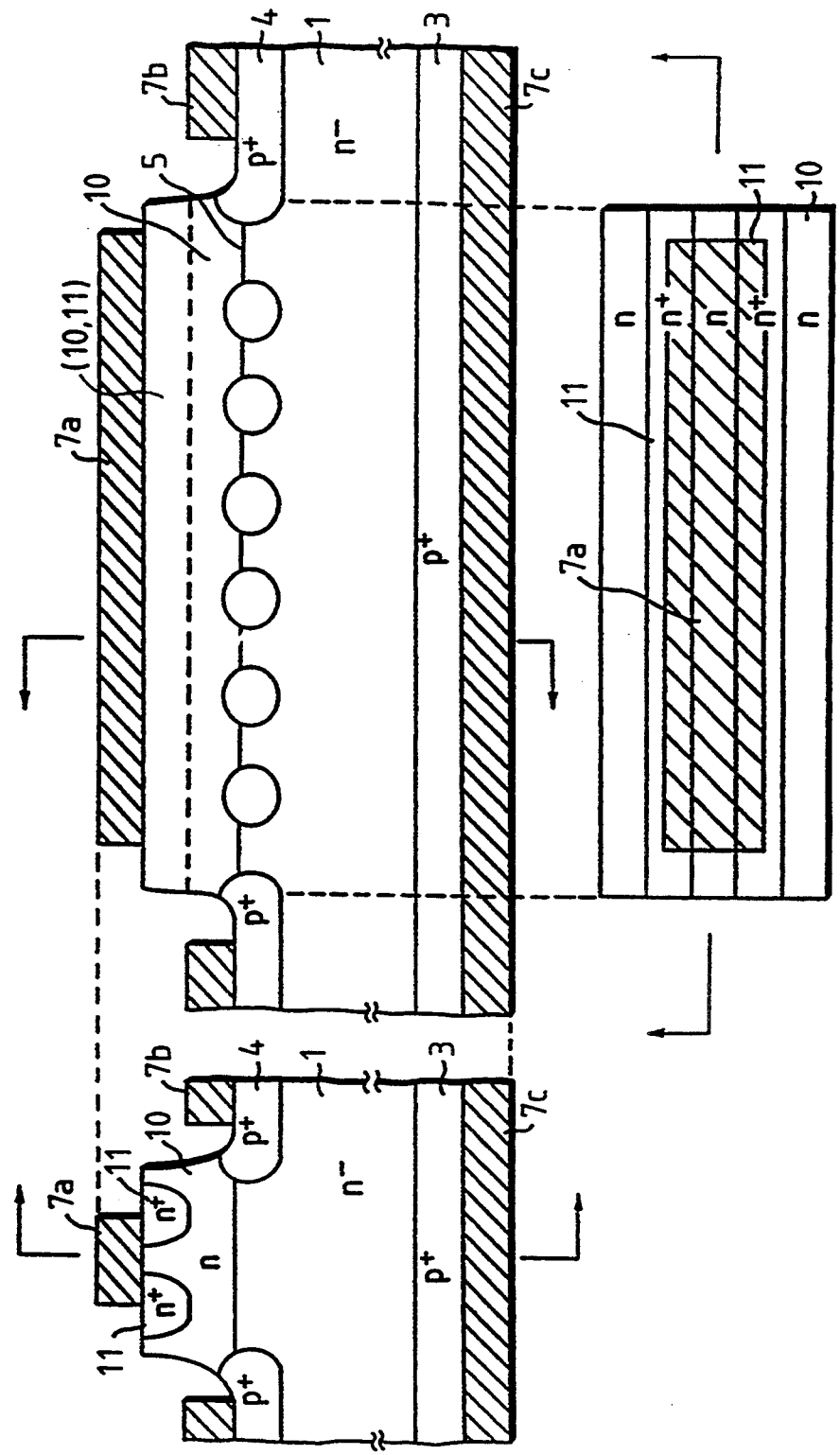
FIG. 2 schematically shows a sectional view and a top view of one unit segment portion of the SI semiconductor device with the distributed main electrode structure according to a second embodiment of the present invention.

FIG. 2 schematically shows a sectional view and a top plan view of one unit segment portion of the SI semiconductor device with the distributed main electrode structure according to a second embodiment of the present invention. The device of this embodiment is a buried gate type SI thyristor. A structural feature of this embodiment is that the cathode electrode 7a makes contact with the n-type region 10, which is surrounded by two parallel n+-type cathode regions 11.

With such a distributed cathode structure, holes that are stored in the low impurity density n-type region 10 can efficiently be absorbed into the cathode electrode 7a. As is evident from the top plan view, the n+-type region 11 is composed of two stripe-shaped regions and the cathode electrode 7a makes contact with the combined n+(11)−n(10)−n+(11) region transversely thereof. The cathode electrode 7a makes ohmic contact with the n+-type cathode region 11 and makes ohmic, non-ohmic or Schottky contact with the n-type region 10. The n-type region 10 may also be formed as a p−-or p-type region of a lower impurity density than the p+-gate region 4.

Embodiments 3 and 4

Figure 3:
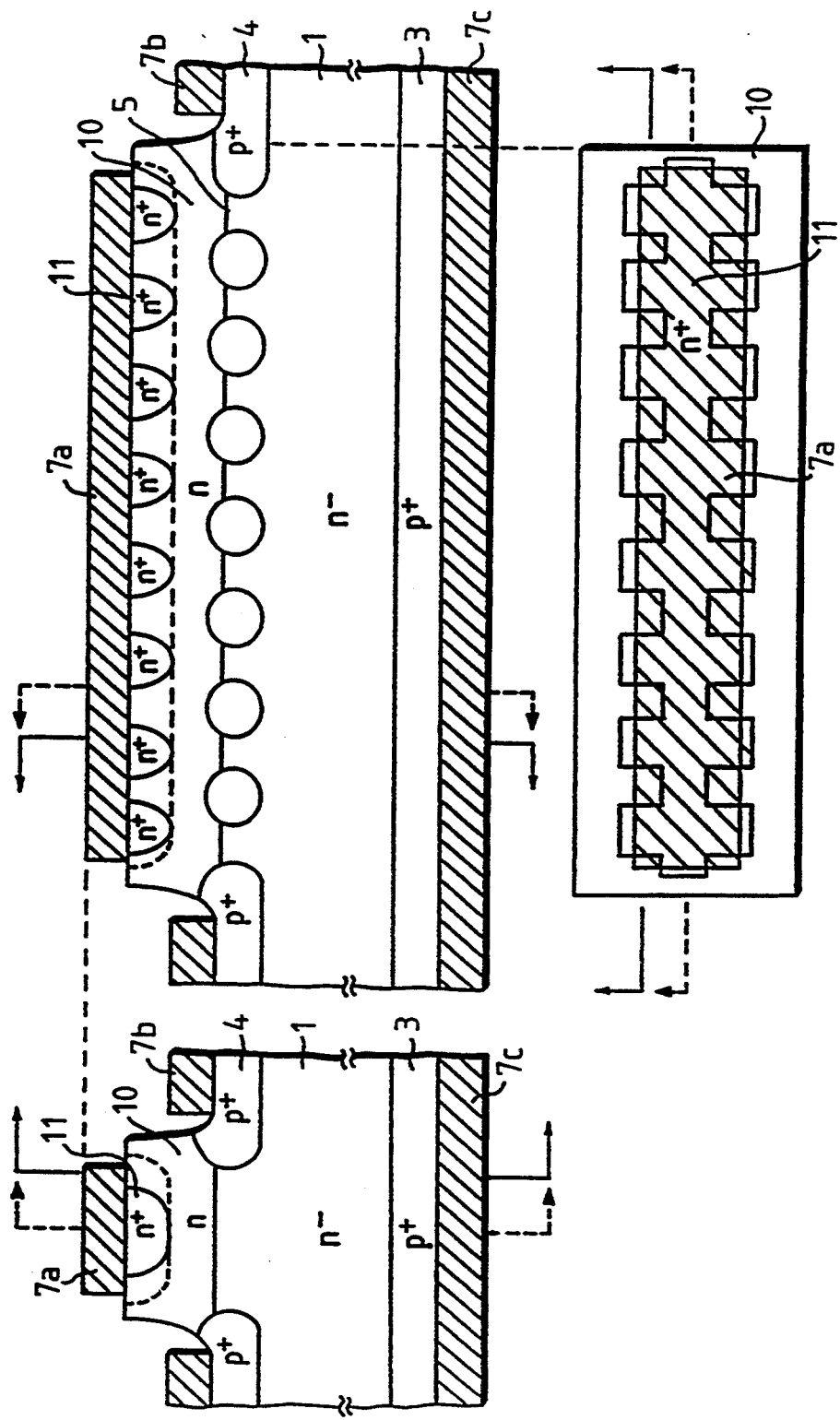
FIG. 3 schematically shows a sectional view and a top view of one unit segment portion of the SI semiconductor device with the distributed main electrode structure according to a third embodiment of the present invention.
Figure 4:
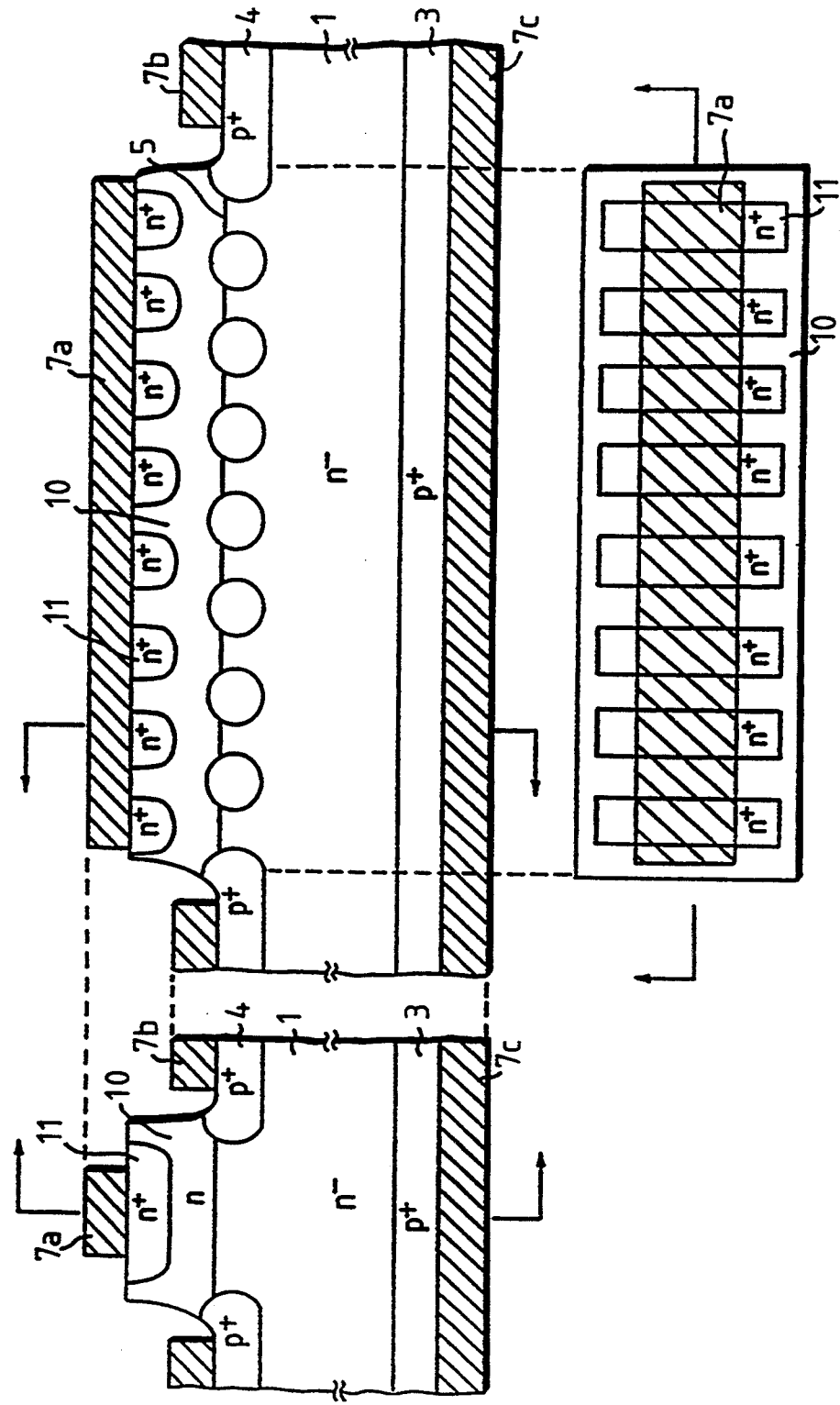
FIG. 4 schematically shows a sectional view and a top view of one unit segment portion of the SI semiconductor device with the distributed main electrode structure according to a fourth embodiment of the present invention.

FIGS. 3 and 4 schematically show sectional views and top plan views of one segment portion of SI semiconductor devices with the distributed main electrode structure according to third and fourth embodiments of the present invention.

A structural feature common to these embodiment resides in the layout pattern of the n+-type cathode region 11. That is, the n+-type cathode region 11 is subdivided into smaller regions, which are distributed throughout the unit segment—this aims to solve the afore-mentioned problem of the prior art that the p+-type buried regions 4 directly below the n+-type cathode region 11 spread or diffuse deeper than those not below the cathode region 11, leading to dispersion in the gate-cathode breakdown voltage distribution. In these embodiments, since the subdivided cathode regions 11 are formed in the surface of the unit segment just above the channel regions 5 between adjacent p+ gate regions, the dispersion in the diffusion depth between the gate and the cathode in the unit segment is small and the breakdown voltage distribution is also uniform.

In the FIG. 3 embodiment, the subdivided n+-type cathode regions 11 are formed as a unitary structure combined with a stripe-shaped cathode region and the cathode electrode 7a is deposited over such a distributed cathode region composed of the n+-type cathode regions 11 and the n-type region 10, as shown in FIG. 3.

In the FIG. 4 embodiment, however, the n+-type cathode regions 11 remain subdivided. The cathode electrode 7a is deposited over such a distributed cathode region [n+(11)−n(10)−n+(11)−n(10) . . . ] as shown in FIG. 4.

In these embodiments, too, the cathode electrode 7a makes ohmic contact with the n+-type cathode region 11 and makes ohmic contact, non-ohmic or Schottky contact with the n-type region 10. The n-type region 10 may be formed as a p−-or p-type region. The point is a structure in which holes are stored in such a lower impurity density region 10 and are readily absorbed by the cathode electrode 7a.

Embodiments 5 and 6

Figure 5:
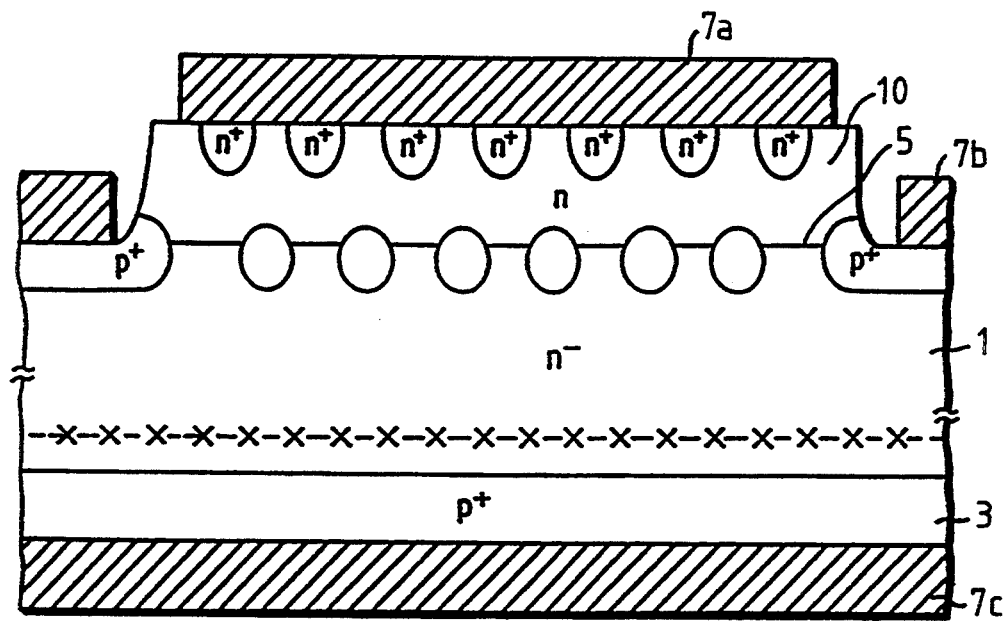
FIG. 5 schematically shows a sectional view and a top view of one unit segment portion of the SI semiconductor device with the distributed main electrode structure according to a fifth embodiment of the present invention.
Figure 6:
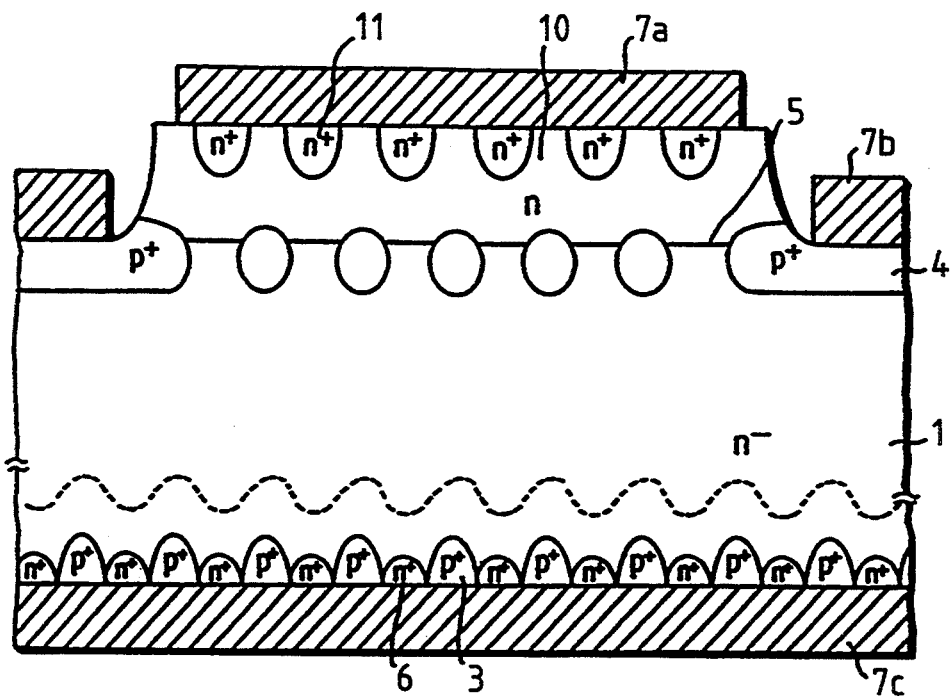
FIG. 6 schematically shows a sectional view and a top view of one unit segment portion of the SI semiconductor device with the distributed main electrode structure according to a sixth embodiment of the present invention.

FIGS. 5 and 6 schematically illustrate, in section, unit segment portions of SI semiconductor devices with the distributed main electrode structure according to fifth and sixth embodiments of the present invention. These devices are buried gate type SI thyristors, in which the n+-type cathode region 11 is subdivided as in Embodiments 3 and 4. The distributed main electrode (cathode) structure of the present invention is one that decreases the quantity of pull-out charges from gate and reduced the turn-off period $t_{gq}$ which is the sum of the minority storage period $t_s$ and the fall period $t_f$. With the distributed main electrode (cathode) structure alone, however, it is difficult to reduce the tail period $t_{tail}$ which is unique to the thyristor structure. Embodiment 5 solves this problem by the combined use of the distributed cathode structure and lifetime control. The lifetime control is effected by proton, electron beam, gamma-ray irradiation or by heavy metal diffusion. In FIG. 5, crosses (X) indicate the position where to form a desirable defect region in the case of employing the proton irradiation method. For example, when the p+-type anode region 3 is about 5 μm thick, the defect region is positioned around 15 μm above the surface of the anode region. With the defect region near the p+-type anode region 3, it is possible to effectively control the life time of electrons to shorten the tail period.

On the other hand, Embodiment 6 combines the distributed cathode structure and the anode shorted structure. Reference numeral 6 denotes n+-type short-circuit regions. The anode shorted structure shown in FIG. 6 is one that utilizes the static induction effect and hence is an SI anode shorted structure. The combined use of the distributed cathode structure and the SI anode shorted structure permits reduction of the tail period $t_{tail}$ as well as the turn-off period $t_{gq}$. Needless to say, the FIG. 6 embodiment may also utilize the lifetime control.

Embodiments 7, 8 and 9

Figure 7:
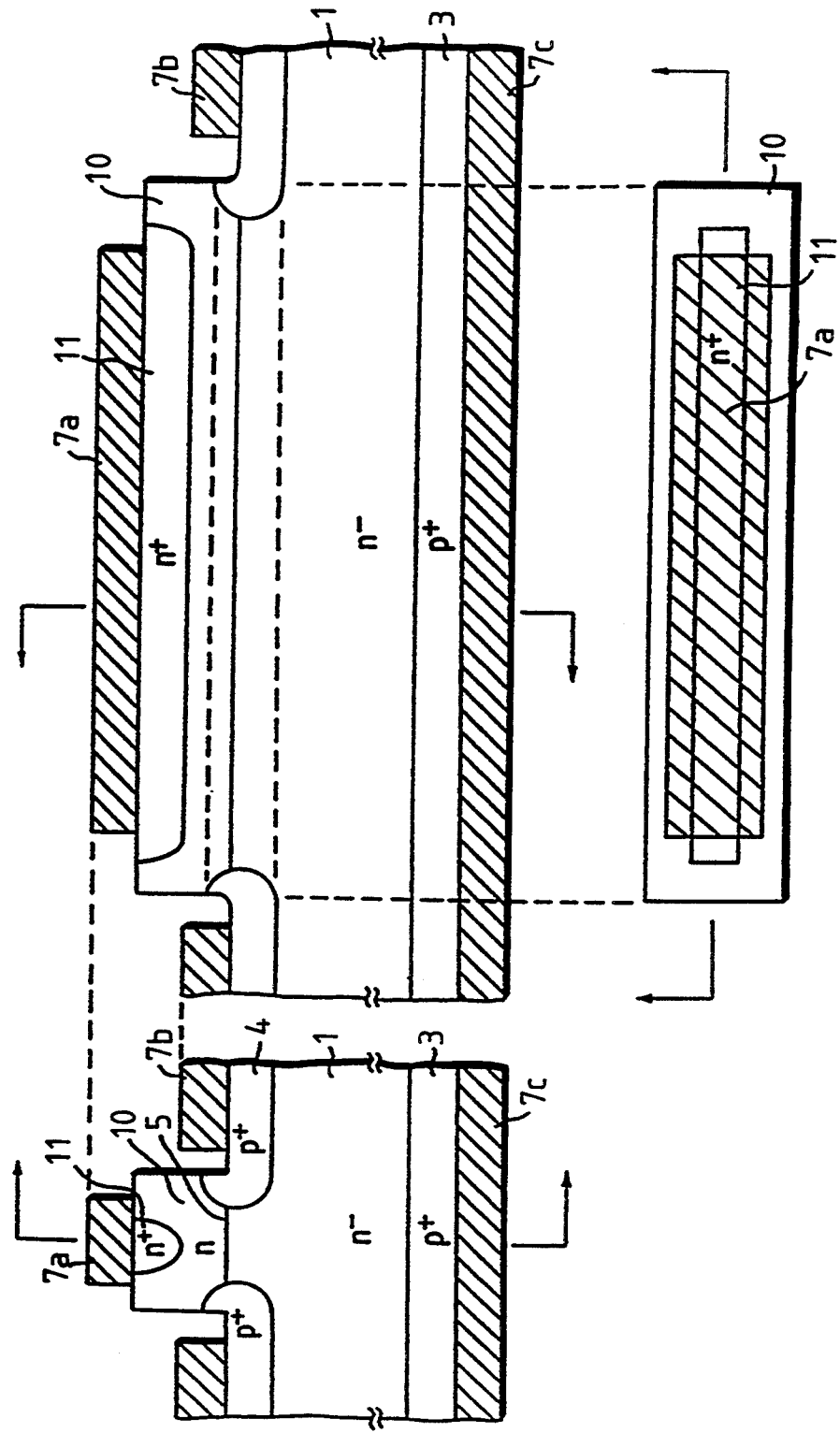
FIG. 7 schematically shows a sectional view and a top view of one unit segment portion of the SI semiconductor device with the distributed main electrode structure according to a seventh embodiment of the present invention.
Figure 8:
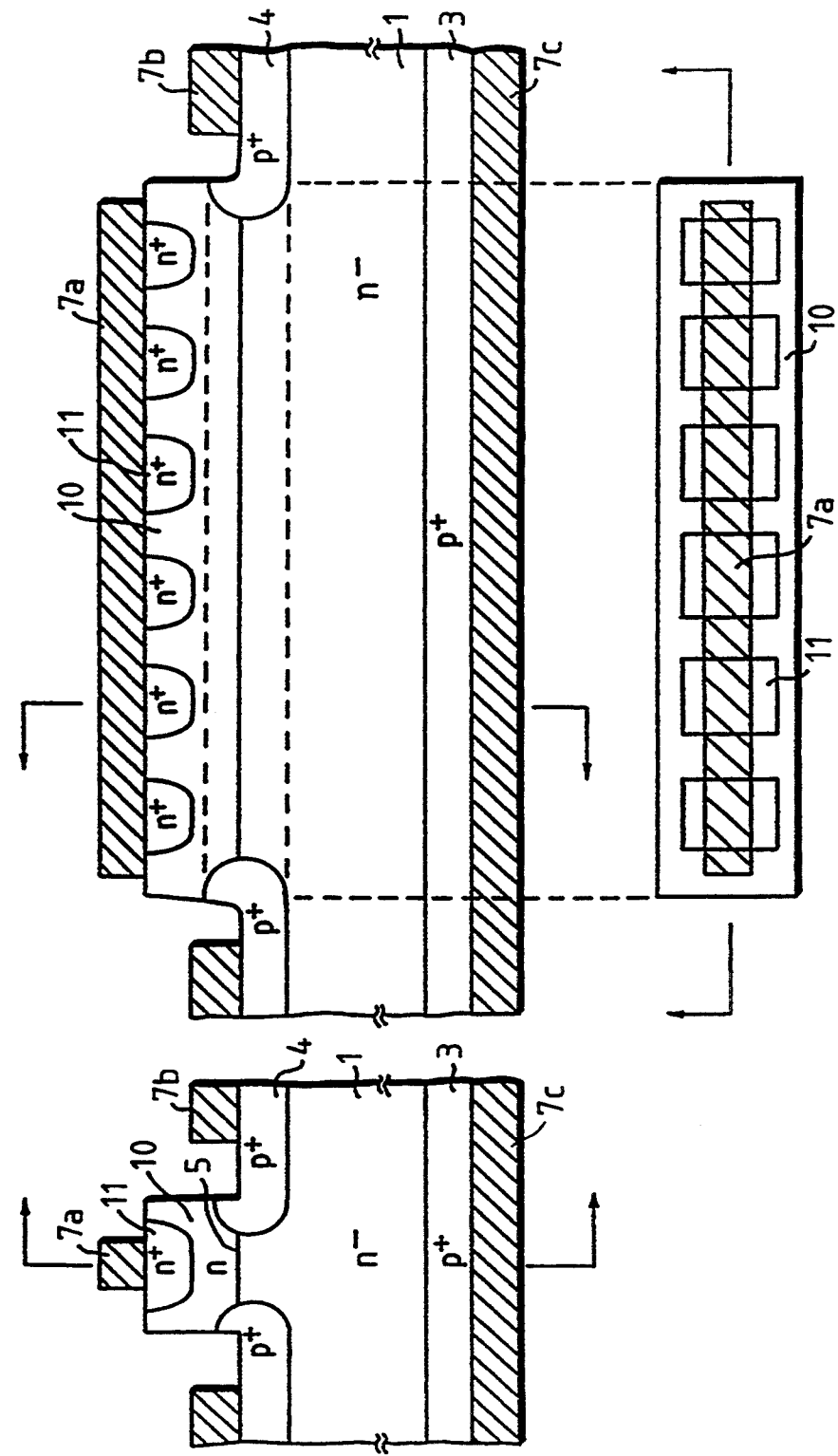
FIG. 8 schematically shows a sectional view and a top view of one unit segment portion of the SI semiconductor device with the distributed main electrode structure according to an eighth embodiment of the present invention.
Figure 9:
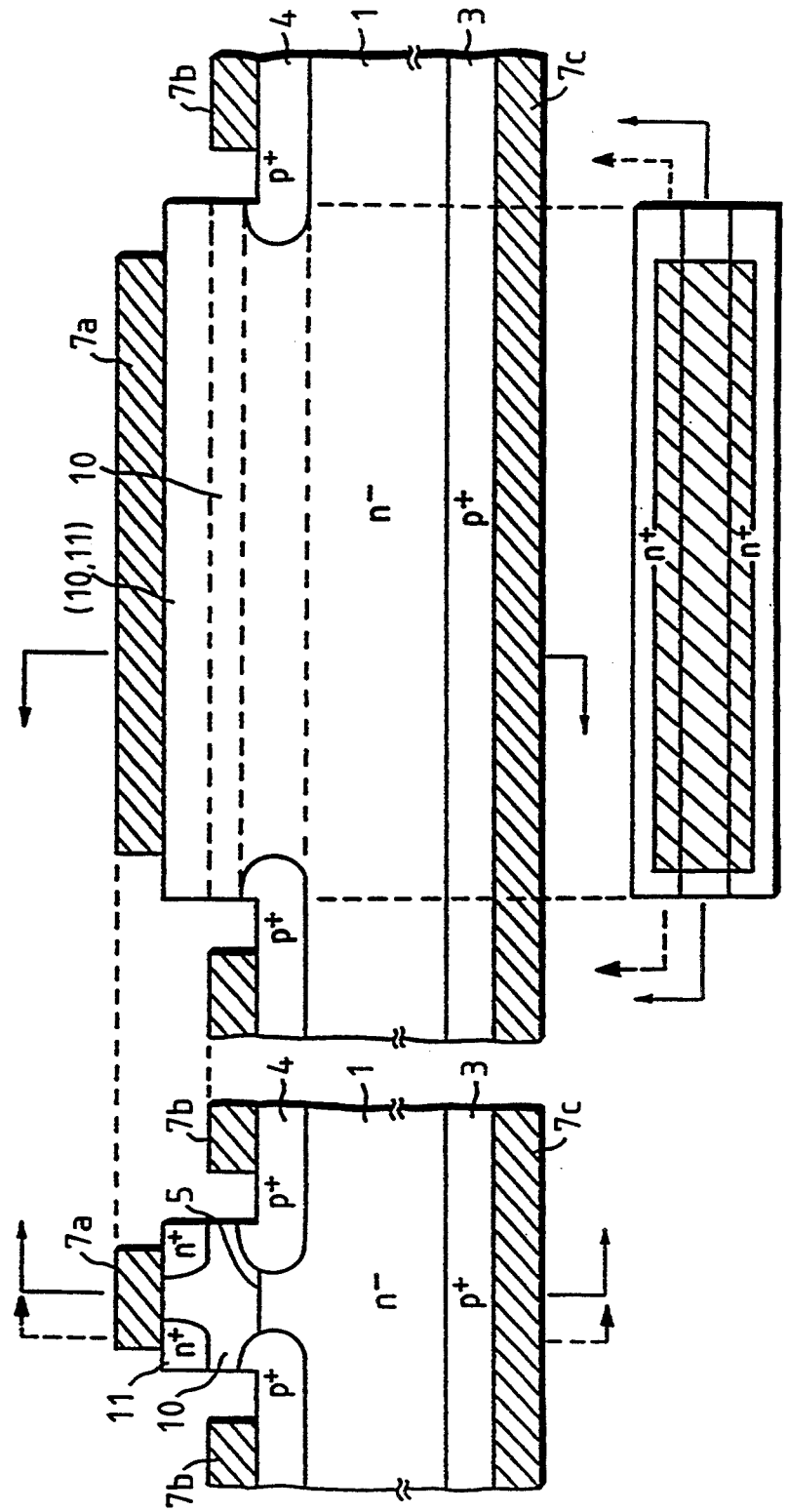
FIG. 9 schematically shows a sectional view and a top view of one unit segment portion of the SI semiconductor device with the distributed main electrode structure according to a ninth embodiment of the present invention.

FIGS. 7, 8 and 9 schematically illustrate seventh, eighth and ninth embodiments of the present invention, respectively. The devices of these embodiments are all SI thyristors with the recessed gate structure and each feature its distributed cathode structure.

In the FIG. 7 embodiment, the n+-type cathode region 11 has a stripe geometry and the cathode electrode 7a extends across the distributed cathode region [n+(11)—n(10)] in contact therewith as shown.

In the FIG. 8 embodiment, the n+-type cathode region 11 is subdivided into smaller regions and the cathode electrode 7a extends across the distributed cathode region [n+(11)—n(10)] in contact therewith as shown.

In the FIG. 9 embodiment, the n+-type cathode region 11 is subdivided into two parallel regions, between which the n-type region 10 is exposed; that is, the cathode electrode 7a extends across the distributed cathode region [n+(11)—n(10)] in contact therewith as shown. This structure permits efficient flowing of holes into the cathode electrode 7a from the n-type region 10 which is surrounded by the n+-type cathode regions 11.

The devices of these embodiments are each shown to be an SI thyristor, but an SI transistor with a recessed gate structure could be obtained by substituting an n+-type cathode region for the p+-type anode region 3.

In these embodiments, the cathode electrode 7a makes ohmic contact with the n+-type cathode region 11 and makes ohmic, non-ohmic or Schottky contact with the n-type region 10. The n-type region 10 may also be formed as a p− -or p-type region of an impurity density lower than that of the p+-type gate region 4, in which case it is preferable that the cathode electrode 7a makes Schottky contact with the region 10.

Embodiments 10 and 1

Figure 10:
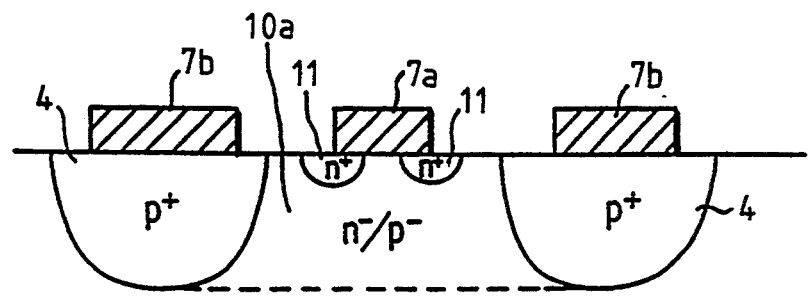
FIG. 10 is a sectional view schematically illustrating the main electrode and its vicinity in the SI semiconductor device with the distributed main electrode structure according to a tenth embodiment of the present invention.
Figure 11:
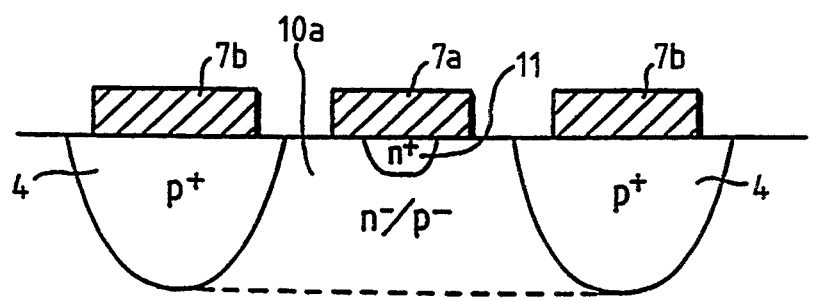
FIG. 11 is a sectional view schematically illustrating the main electrode and its vicinity in the SI semiconductor device with the distributed main electrode structure according to an eleventh embodiment of the present invention.

FIGS. 10 and 11 schematically illustrate, in section, the main electrode and its surrounding portion in the SI semiconductor device with the distributed main electrode structure according to 10th and 11th embodiments of the present invention. These embodiments are each directed to an SI semiconductor device with a planar gate structure, which can be formed as a thyristor or transistor; these embodiments will be described as being applied to a thyristor.

Figure 12:
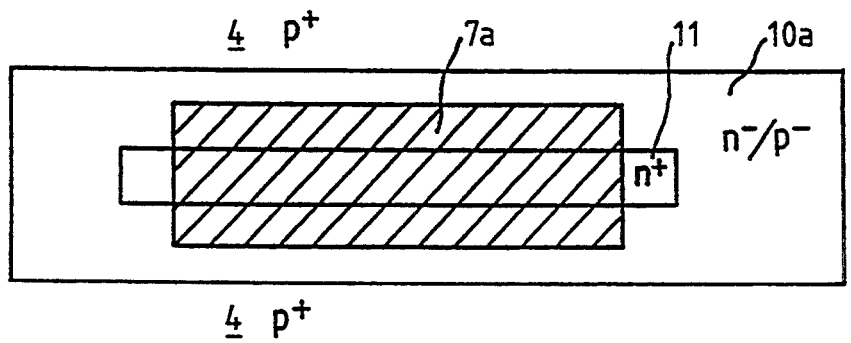
FIG. 12 is a top plan view schematically showing a unit channel portion in FIG. 11 embodiment.

In the FIG. 10 embodiment, the n+-type cathode region 10 is formed as two parallel stripe-like regions and the cathode electrode 7a makes contact with both the n+-type cathode regions 11 and the surrounding n−/p−-type region 10a. That is, the cathode electrode 7a extends across a distributed cathode region [n+(11)n−/p−(10a)] in contact therewith. In this structure, holes stored in the n−/p−-type region 10a are allowed to readily flow therefrom into the cathode electrode 7a mainly through that portion of the region 10a which is surrounded by the cathode regions 11. In the FIG. 11 embodiment, the n+-type cathode region 11 is formed as one stripe-like region and the cathode electrode 7a is contact with the n+-type cathode region 11 but the surrounding n−/p−-type region 10a as well. FIG. 12 is a top plan view of one unit channel portion of the FIG. 11 embodiment, from which it can be understood that the cathode electrode 7a extends across the n+-type cathode region 11 and the n−/p−-type region 10a in contact therewith.

Embodiments 12, 13 and 14

Figure 13:
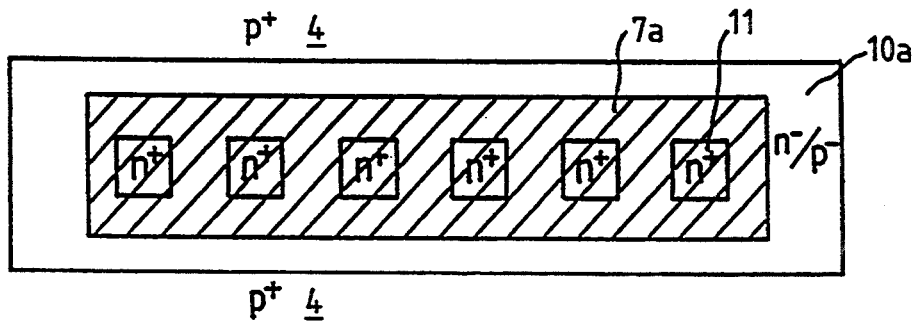
FIG. 13 is a schematic diagram illustrating a distributed cathode structure of the SI semiconductor device with the distributed main electrode structure according to a twelfth embodiment of the present invention.
Figure 14:
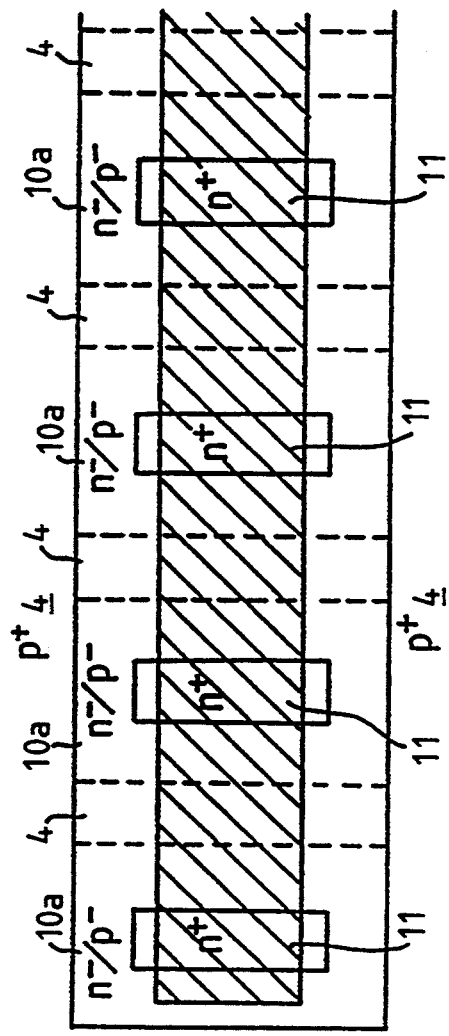
FIG. 14 is a schematic diagram illustrating a distributed cathode structure of the SI semiconductor device with the distributed main electrode structure according to a thirteenth embodiment of the present invention.
Figure 15:
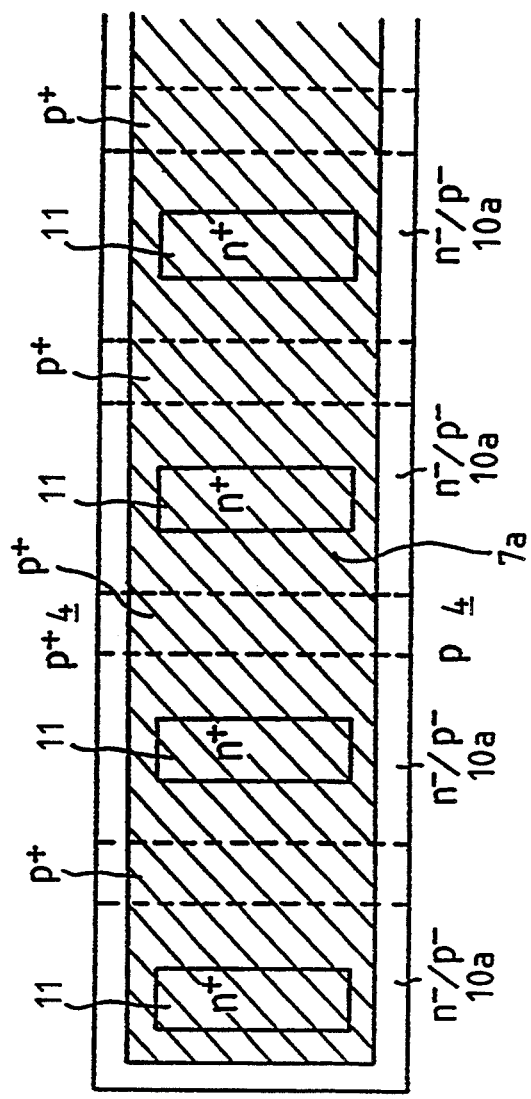
FIG. 15 is a schematic diagram illustrating a distributed cathode structure of the SI semiconductor device with the distributed main electrode structure according to a fourteenth embodiment of the present invention.

Also in the case where the distributed main electrode structure according to the present invention is a planar gate structure, various modifications can be effected by selecting the layout pattern of the n+-type cathode region 11. FIGS. 13 through 15 are top plan views showing different layouts of the cathode region 11. FIG. 13 illustrates a 12th embodiment of the present invention, in which the cathode region 11 is subdivided into smaller regions in the unit channel of the planar structure and the cathode electrode 7a is deposited all over a cathode distributed structure [n+(11)—n−/p−(10a)]. FIG. 14 illustrates a 13th embodiment of the present invention, in which the cathode electrode 7a extends across the n+-type cathode regions 11 disposed in a plurality of channel regions and the surrounding n−/p−regions 10. FIG. 15 illustrates a 14th embodiment of the invention, in which the cathode electrode 7a is formed wider than in the FIG. 14 embodiment and deposited all over the cathode region 11. This construction heightens the effect of absorbing holes distributed in the n−/p−-type region 10.

Figure 58:
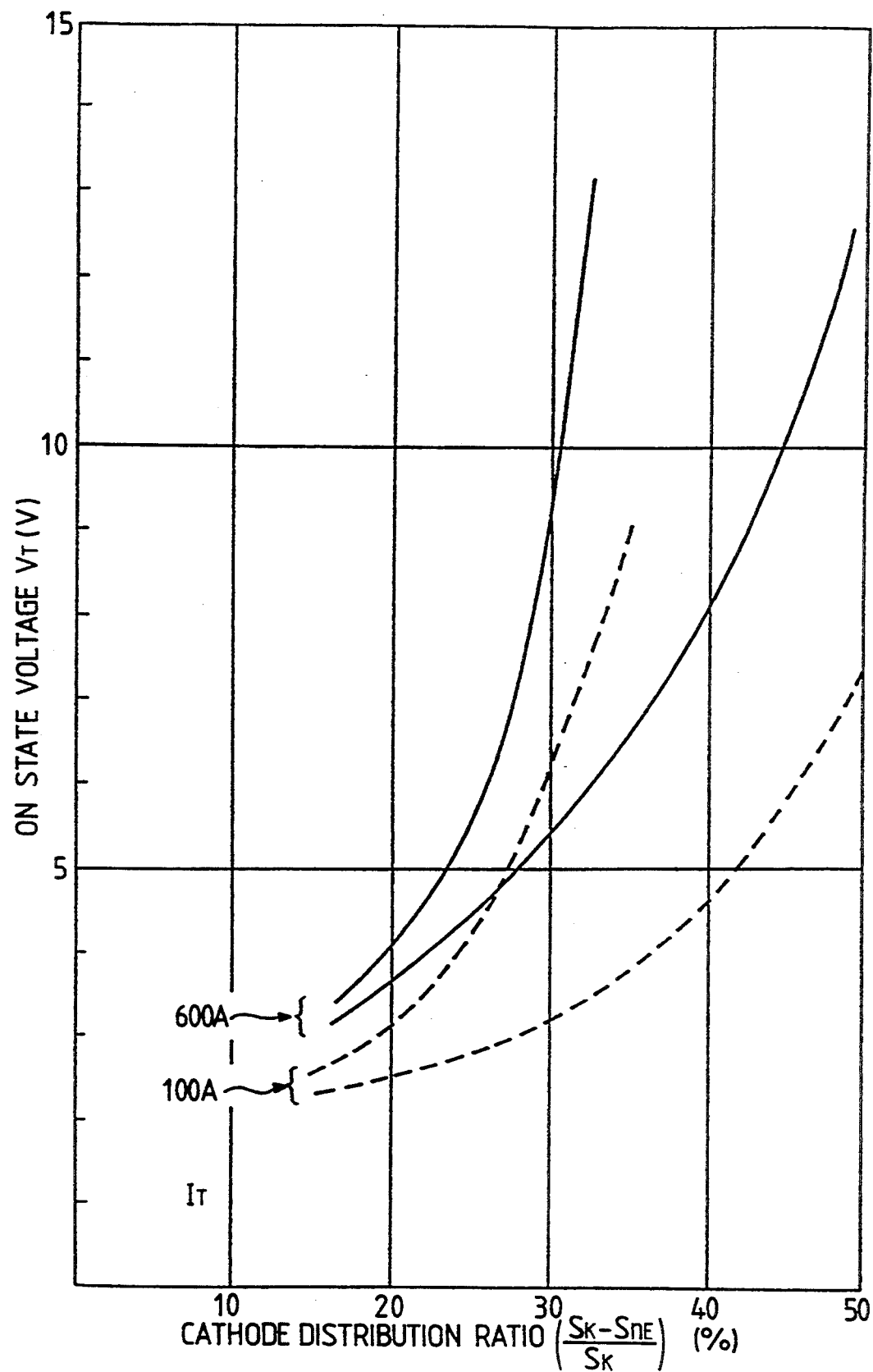
FIG. 58 is a graph showing the relationship between the cathode distribution ratio and the ON state voltage in the SI semiconductor device of the FIG. 3 embodiment.

A description will be given of the results of comparison between the FIG. 1 embodiment and the conventional structure of FIG. 47. FIG. 58 shows turn-off waveforms of the SI thyristor with the distributed cathode structure of the FIG. 1 embodiment and a thyristor of the conventional structure at turn-off under 1250 V-100 A switching conditions. In the both devices, the n−-type high resistivity layer 1 is about 430 μm thick and the n-type region 10 is about 16 μm thick and a number of segment patterns are deposited on a wafer of an about 32 mm φ diameter radially thereof. Table 1 shows values measured when the both devices were turned off with no snubber capacitance, under a resistance load and at 125° C. As is evident from Table 1, the SI thyristor of Embodiment 1 is smaller in the gate peak current value $I_{GP}$, larger in the turn-off gain $G_{OFF}$, shorter in the minority carrier storage period $t_s$ and in the fall period $t_f$ and consequently in the turn-off period $t_{gq}(=t_s+t_f)$ and smaller in the turn-off switching energy $E_{OFF}$(mJ/pulse) than in the conventional device with the homogeneous cathode electrode structure.

TABLE 1

| | \multicolumn{6}{c}{Results of comparison at turn-off under 1250 V-100 A switching conditions} |
|---|---|---|---|---|---|---|
| | $I_{GP}$ [A] | $G_{OFF}$ | $t_s$ [μs] | $t_f$ [μs] | $t_{gq}$ [μs] | $E_{OFF}$ [mJ/pulse] |
| Distributed cathode | 76 | 1.32 | 0.63 | 0.90 | 1.53 | 41.8 |
| Prior art | 104 | 0.96 | 1.39 | 3.63 | 5.02 | 99.9 |

TABLE 1-continued

Results of comparison at turn-off under 1250 V-100 A switching conditions

| | $I_{GP}$ [A] | $G_{OFF}$ | $t_s$ [μs] | $t_f$ [μs] | $t_{gq}$ [μs] | $E_{OFF}$ [mJ/pulse] |
|---|---|---|---|---|---|---|
| example | | | | | | |

FIG. 54 shows turn-off switching waveforms of the same devices as mentioned above, which were turned off under switching conditions of 1250 V-300 A, a snubber capacitance $C_s=0.1$ μF, an L inductive load and 125° C. Table 2 shows measured values in this example, from which it will be seen that the gate peak current value $I_{GP}$, the turn off gain $G_{OFF}$, the minority carrier storage period $t_s$, the fall period $t_f$, the turn-off period $t_{gq}$ and the turn-off switching energy $E_{OFF}$ in the device of the present invention are all improved. In the device of Embodiment 1 the quantity of gate pull-out charges is 175.8 (μC), which is about one-third of 456.6 (μC) in the prior art device.

TABLE 2

Results of comparison at turn-off under 1250 V-300 A switching conditions

| | $I_{GP}$ [A] | $G_{OFF}$ | $t_s$ [μs] | $t_f$ [μs] | $t_{gq}$ [μs] | $E_{OFF}$ mJ/pulse | Q μC |
|---|---|---|---|---|---|---|---|
| Distributed cathode | 121 | 2.55 | 1.16 | 0.34 | 1.50 | 127.4 | 175.8 |
| Prior art example | 172 | 1.80 | 1.98 | 0.36 | 2.34 | 252.6 | 456.6 |

Figure 47:
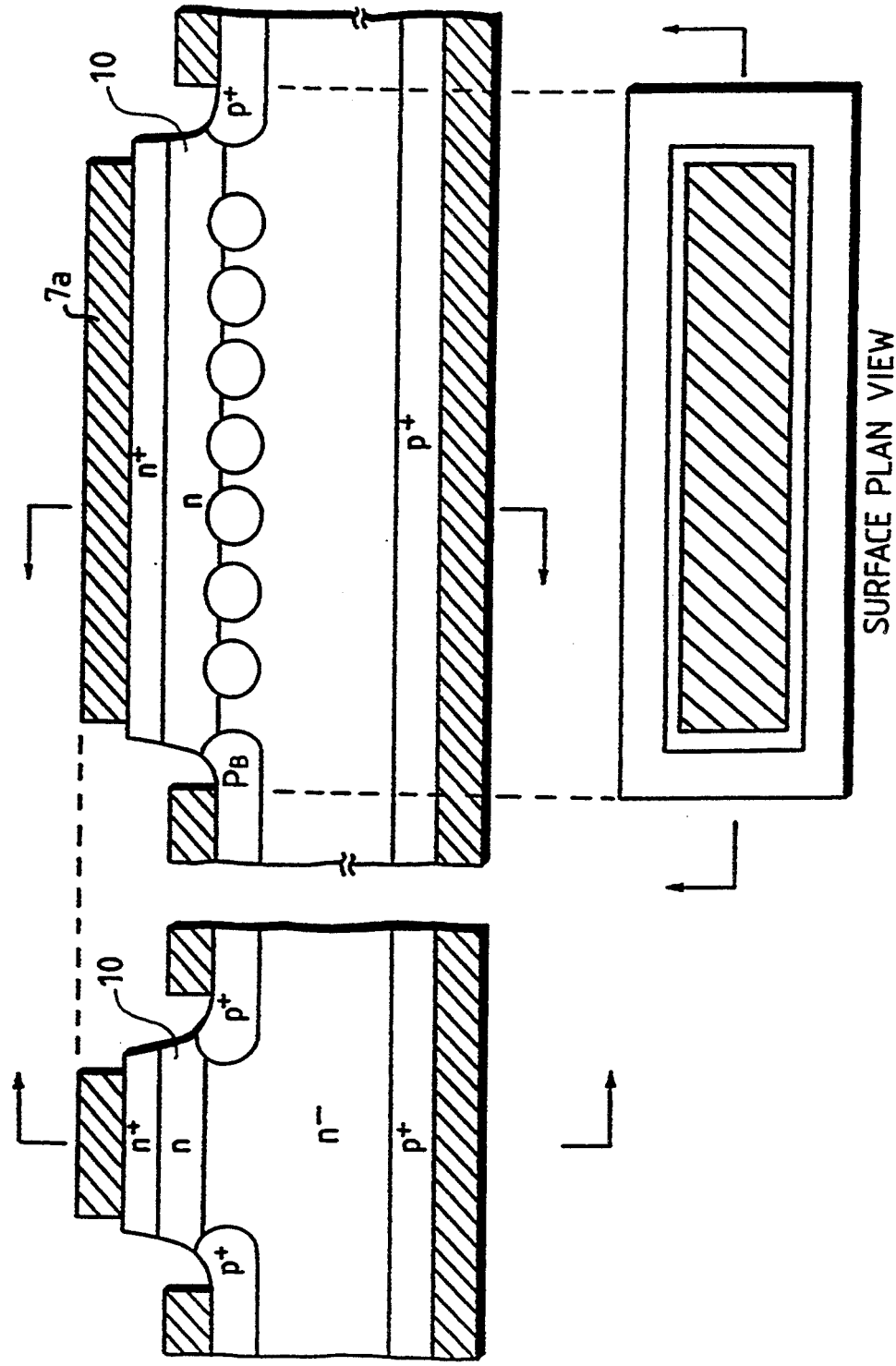
FIG. 47 schematically view shows a sectional view and a top of a conventional SI thyristor with a buried gate structure in which the cathode region is formed uniformly and homogeneously.
Figure 55:
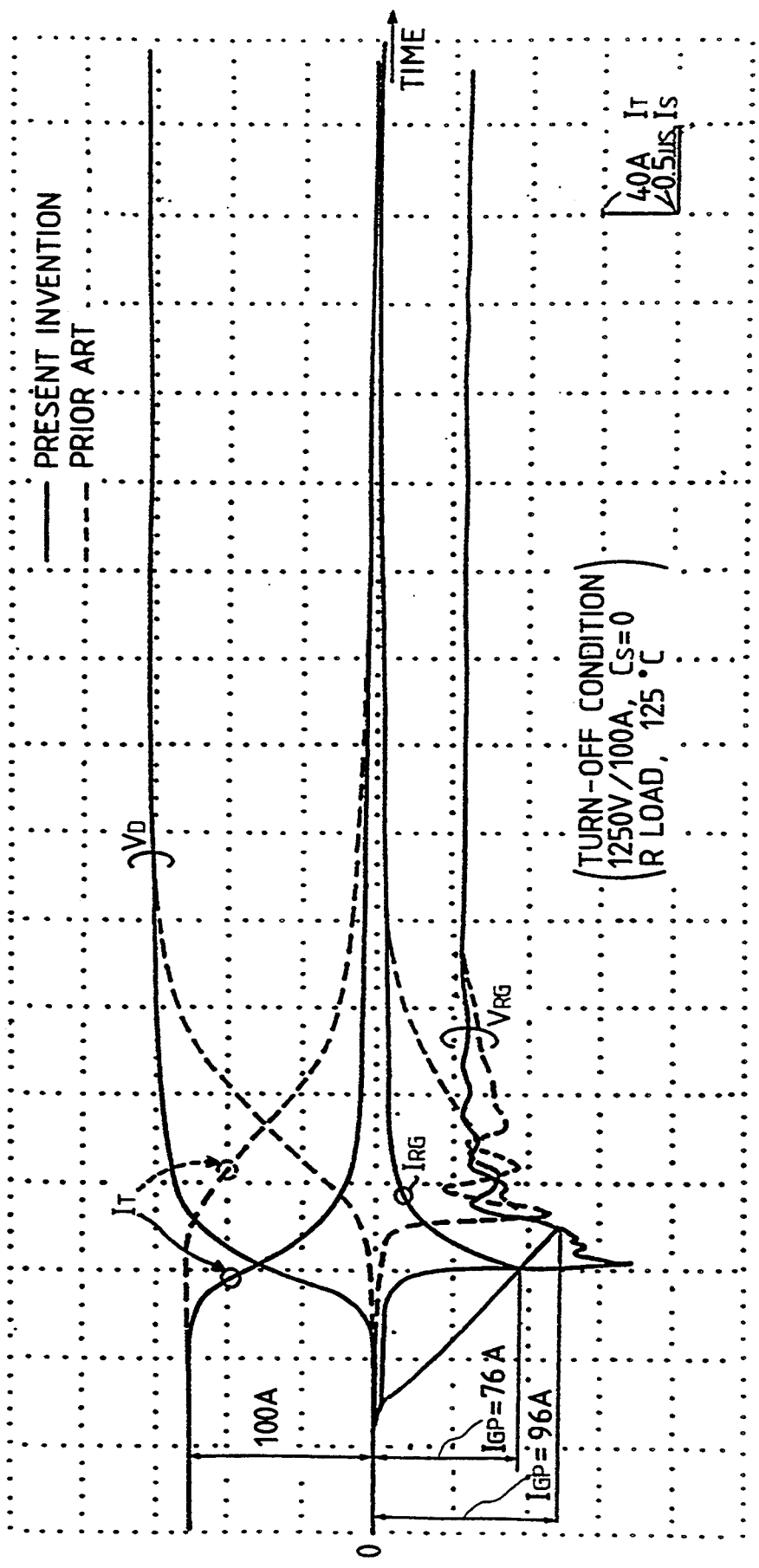
FIG. 55 is a schematic diagram showing turn-off waveforms of the SI thyristor of the FIG. 1 embodiment and the conventional thyristor of FIG. 47 irradiated with gamma ray (under 1250 V–100 A switching conditions )
Figure 56:
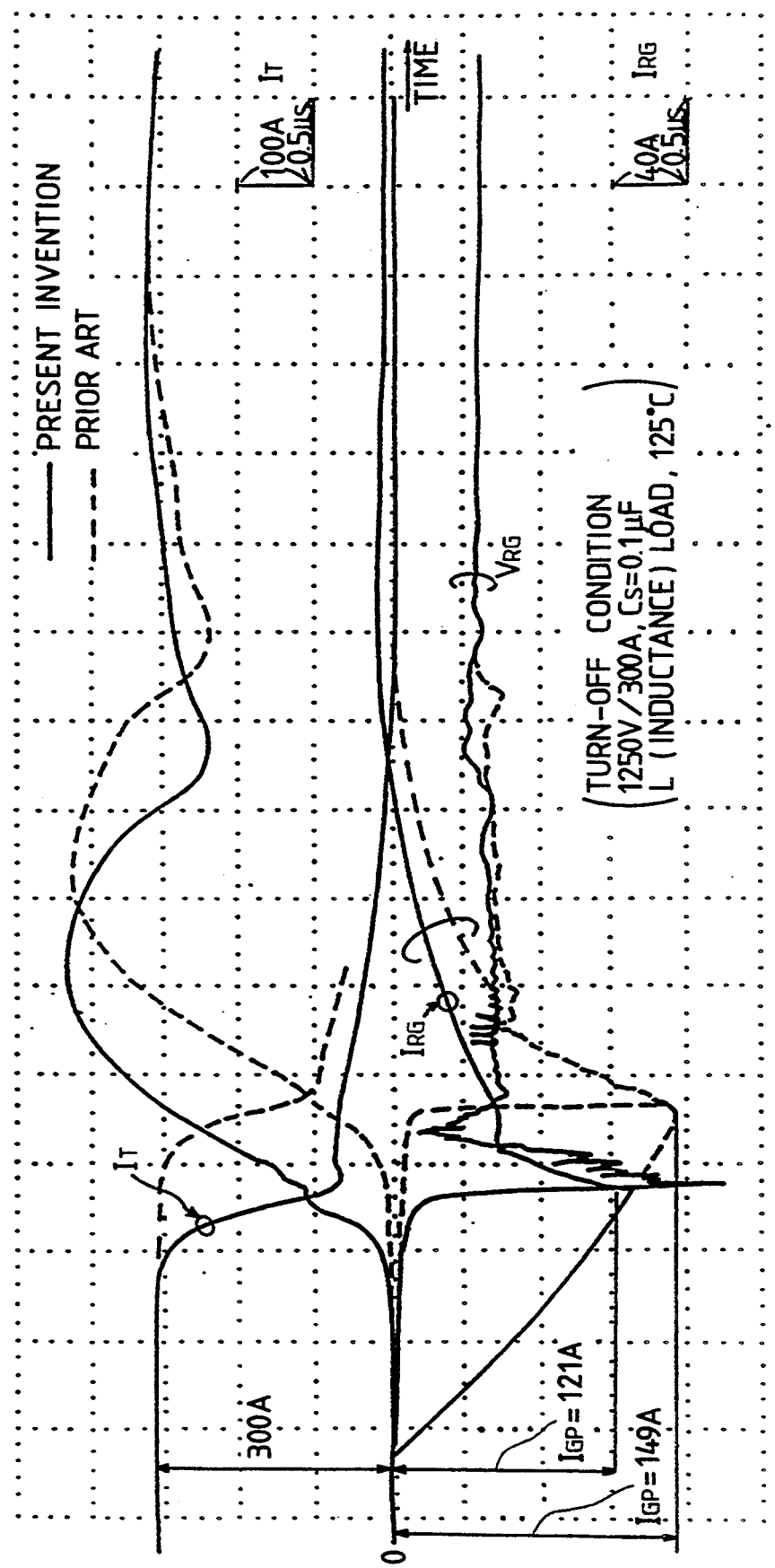
FIG. 56 is a schematic diagram similarly showing turn-off waveforms of the SI thyristor of the FIG. 1 embodiment and the convention thyristor of FIG. 47 irradiated with gamma ray (under 1250 V–300 A switching conditions)

FIGS. 55 and 56 show turn-off waveforms of the device of Embodiment 1 shown in FIG. 1 and the conventional device of the FIG. 47 structure which was irradiated with gamma rays under predetermined conditions for lifetime control. The both devices were turned off under 1250 V-100 A and 1250 V-300 A switching conditions. Tables 3 and 4 show measured values, from which it is evident that the SI thyristor with the distributed cathode structure according to the present invention is highly excellent in performance over the conventional device of the FIG. 47 structure irradiated with gamma rays for lifetime control.

TABLE 3

Results of comparison at turn-off under 1250 V-100 A switching conditions

| | $I_{GP}$ [A] | $G_{OFF}$ | $t_s$ [μs] | $t_f$ [μs] | $t_{gq}$ [μs] | $E_{OFF}$ [mJ/pulse] |
|---|---|---|---|---|---|---|
| Distributed cathode | 76 | 1.32 | 0.63 | 0.90 | 1.53 | 41.8 |
| Prior art example irradiated with Γ rays | 96 | 1.04 | 1.01 | 1.69 | 2.70 | 55.1 |

TABLE 4

Results of comparison at turn-off under 1250 V-300 A switching conditions

| | $I_{GP}$ [A] | $G_{OFF}$ | $t_s$ [μs] | $t_f$ [μs] | $t_{gq}$ [μs] | $E_{OFF}$ [mJ/pulse] |
|---|---|---|---|---|---|---|
| Distributed cathode | 121 | 2.55 | 1.16 | 0.34 | 1.50 | 127.4 |
| Prior art example irradiated with Γ rays | 149 | 2.07 | 1.46 | 0.34 | 1.80 | 127.1 |

TABLE 4-continued

Results of comparison at turn-off under 1250 V-300 A switching conditions

| | $I_{GP}$ [A] | $G_{OFF}$ | $t_s$ [μs] | $t_f$ [μs] | $t_{gq}$ [μs] | $E_{OFF}$ [mJ/pulse] |
|---|---|---|---|---|---|---|
| with Γ rays | | | | | | |

Figure 57:
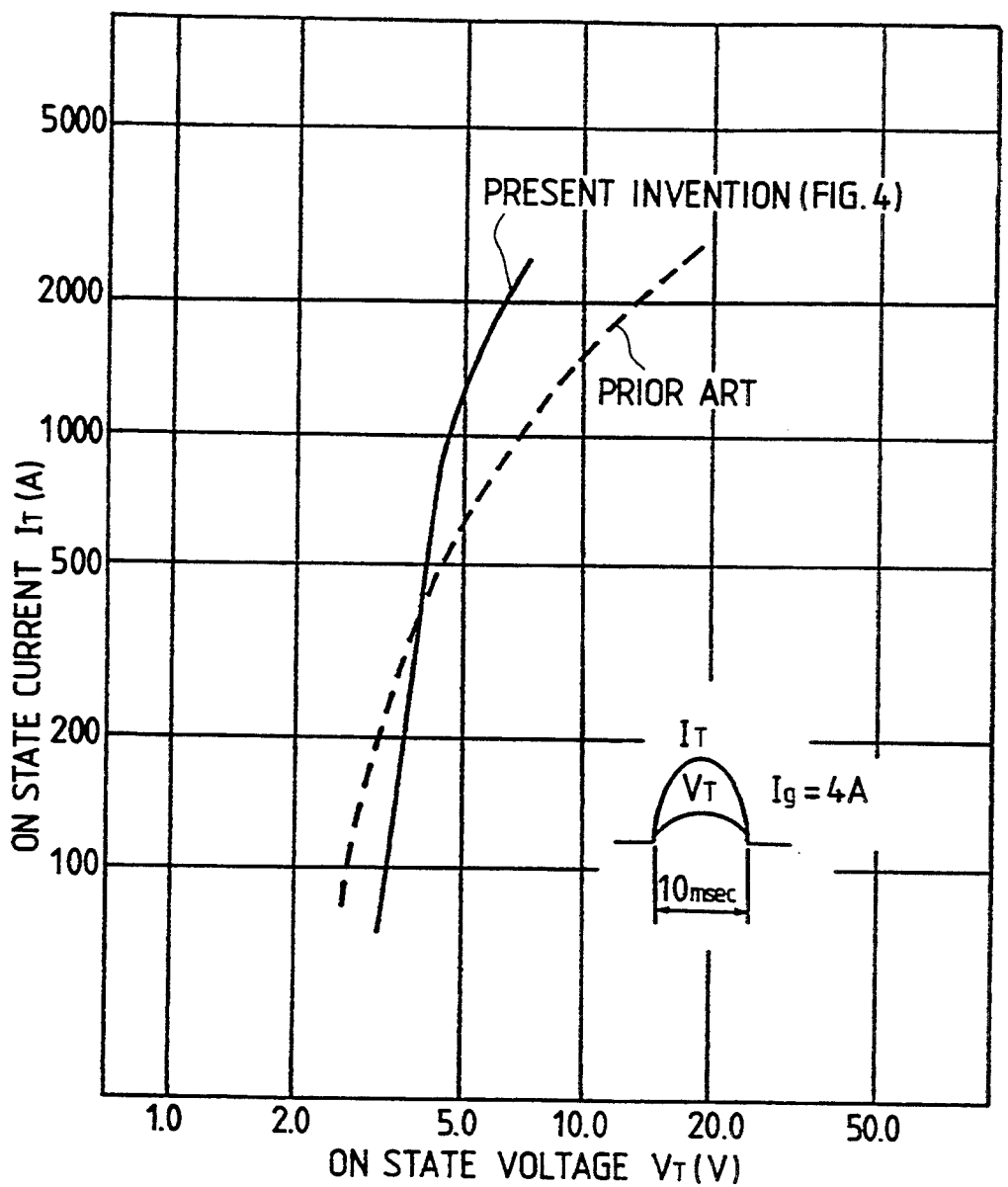
FIG. 57 is a graph showing the forward current-voltage characteristic of the SI semiconductor device of the FIG. 4 embodiment in comparison with the corresponding characteristic of the prior art.

FIG. 57 is a graph showing the forward current-voltage characteristics of the device with the structure of Embodiment 4 and a conventional device. As compared with the conventional device, the device according to the present invention is large in the forward voltage drop (on-state voltage) $V_T$ in the low current region but small in the high current region. Hence, the SI thyristor with the distributed cathode structure according to the present invention is high in surge capability.

FIG. 58 is a graph showing the relationship between the distribution ratio of the n+-type and n-type cathode region in the distributed cathode structure of Embodiment 3 and the on-state voltage. Letting the surface area of the n+-type cathode region 11 and the area of the cathode electrode 7a be represented by $S_{nE}$ and $S_K$, respectively, the above mentioned distribution ratio can be defined substantially as follows;

$$\frac{S_K - S_{nE}}{S_K}$$

The distribution ration may preferably be below 30%, because the on-state voltage $V_T$ abruptly rises when the ratio exceeds 30%.

Embodiment 1

Figure 22:
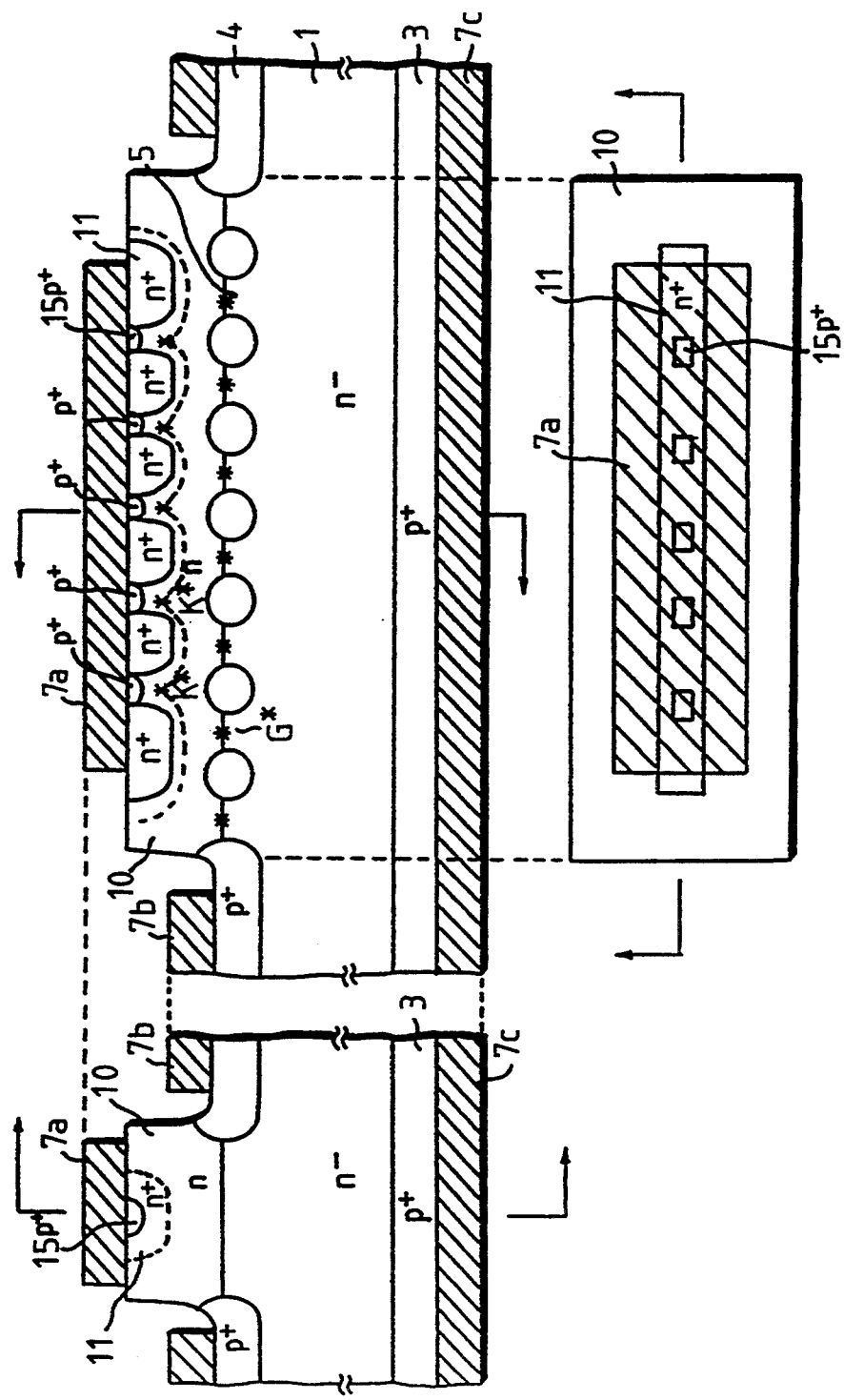
FIG. 22 schematically shows a sectional view and a top view of one unit segment portion of the SI semiconductor device with the SI main electrode shorted structure according to a fifteenth embodiment of the present invention.

FIG. 22 schematically shows a sectional view and a top plan view of one segment portion of the SI semiconductor device with the SI main electrode shorted structure according to a 15th embodiment of the present invention. Since the p+-type region 3 is an anode region, the illustrated device is an SI thyristor. When the region 3 is an n+-type region, the device is an SI transistor. This embodiment will be described as being applied to the thyristor. Reference numeral 1 denotes an n−-type high resistivity layer; 4 denotes p+-type buried gate regions; 5 denotes channel regions; 7a, 7b and 7c denote cathode, gate and anode electrodes, respectively; 10 denotes an n-type region formed by epitaxial growth, for example; 11 denotes an n+-type cathode region; and 15 denotes p+-cathode short-circuit regions. A structural feature of this embodiment resides in that the cathode electrode 7a is in contact with the n-type region 10 and the p+-type cathode short-circuit regions 15 as well as the cathode region 11. The n+-type cathode region 11 and the p+-type cathode short-circuit regions 15 are shorted by the cathode electrode 7a. The cathode electrode 7a is formed of Al, Al—Si, Mo, W, Pt, Ti, or Ni, or their alloys or silicides. The cathode electrode 7a makes ohmic contact with the n+-type cathode region 11 and the cathode short-circuit regions 15 but makes ohmic, non-ohmic or Schottky contact with the n-type region 10. An impurity density difference is set between the n+-type region 11 and the n-type region 10, so that distributed holes in the n-type region 10 are readily stored in the interface between the region 10 and the cathode region 11 and in the cathode short-circuit regions 15 and are readily absorbed by the p+-type regions (the cathode short-circuit regions) 15. As is evident from the top plan view, the n+-type cathode region 11 is formed as a stripe and surrounded by the n-type region 10 low in impurity density relative thereto to form a distributed cathode region [n+(11)−n(10)]. The cathode electrode 7a makes contact with the both regions of the distributed cathode region to form a distributed cathode electrode structure.

The n-type region 10 needs only to permit easy storage of holes therein and it may also be provided as a p−-type region lower in impurity density than the p+-type gate regions 4; in such a case, it may preferably makes Schottky contact with the cathode region 7a.

In a depleted region between each p+-type cathode short-circuit region 15 and the corresponding gate region 4 there is formed a potential barrier whose height is controlled by the static induction effect, by which the flow of carriers (holes) between the gate region 4 and the cathode short-circuit region 15.

That is, the cathode short-circuit regions 15 are each shorted to the cathode region 11 on both side thereof, and in the n-type region 10 surrounded by the opposed portions of the cathode region 11 a depletion layer spreads owing to the built-in potential of the n+(11)n(10) junction. Such depletion layers link together to form a potential barrier against holes directly below the respective cathode short-circuit region 15. The positions of intrinsic cathodes K* where the potential barrier height is maximum are indicated schematically in FIG. 15. As is evident from the potential distribution for holes shown in FIG. 42, holes distributed in the region further to the surface than the intrinsic cathode point K* are efficiently absorbed by the cathode short-circuit regions 15. Such cathode short-circuit regions 15 are each what is called a drain region for the holes that are absorbed by the cathode electrode 7a. With the construction of this embodiment, the hole absorbing effect is heightened by the built-in potential of the p+(15)n(10) junction, as compared with a construction in which holes are absorbed by the cathode electrode 7a through a mere Schottky junction.

In FIG. 22 the cathode electrode 7a is shown to be in contact with the n-type region 10 as well, but need not always be so; that is, the electrode 7a may also be formed in contact with the n+-type region 11 and the p+-type regions 15 alone.

Embodiment 16

FIG. 23 schematically shows a sectional view and a top plan view of one segment portion of the SI semiconductor device with the SI main electrode shorted structure according to a 16th embodiment of the present invention. The device of this embodiment is a buried gate type SI thyristor. This embodiment features a construction in which the n-type region 10 is surrounded by two parallel n+cathode regions 11, a cathode short-circuit region is formed in the thus surrounded n-type region at 10 and the cathode electrode 7a are in contact with the n-type region 10 sandwiched by the n+-type regions 11 and the cathode short-circuit region 15. As shown in the figures the short circuit region 15 has a thickness or depth into the high resistivity layer that is much less than the depth to which the n+-type regions extend into the high resistivity layer.

With the introduction of such a cathode shorted structure into the distributed main electrode (cathode) structure, holes that are stored in the n-type region 10 of the lower impurity density can efficiently be absorbed to the cathode electrode 7a through the cathode short-circuit region 15. As is evident from the top plan view, the n+-type cathode region 11 is divided into two parallel stripe-like regions and the cathode short-circuit region 15 is formed in the n-type region 10 surrounded by the two cathode regions 11. The cathode electrode 7a is deposited so that it makes contact with both an n+(11)−n(10)−n+(11) region and an n+(11)−p+(15)−n+(11) region. The cathode electrode 7a is in ohmic contact with the n+-type cathode regions 11 and the cathode short-circuit region 15 and in ohmic, non-ohmic or Schottky contact with the n-type region 10. The n-type region 10 may also be formed as a p− -or p-type region lower in impurity density than the p+-type gate region 4.

Embodiment 17 and 18

Figure 24:
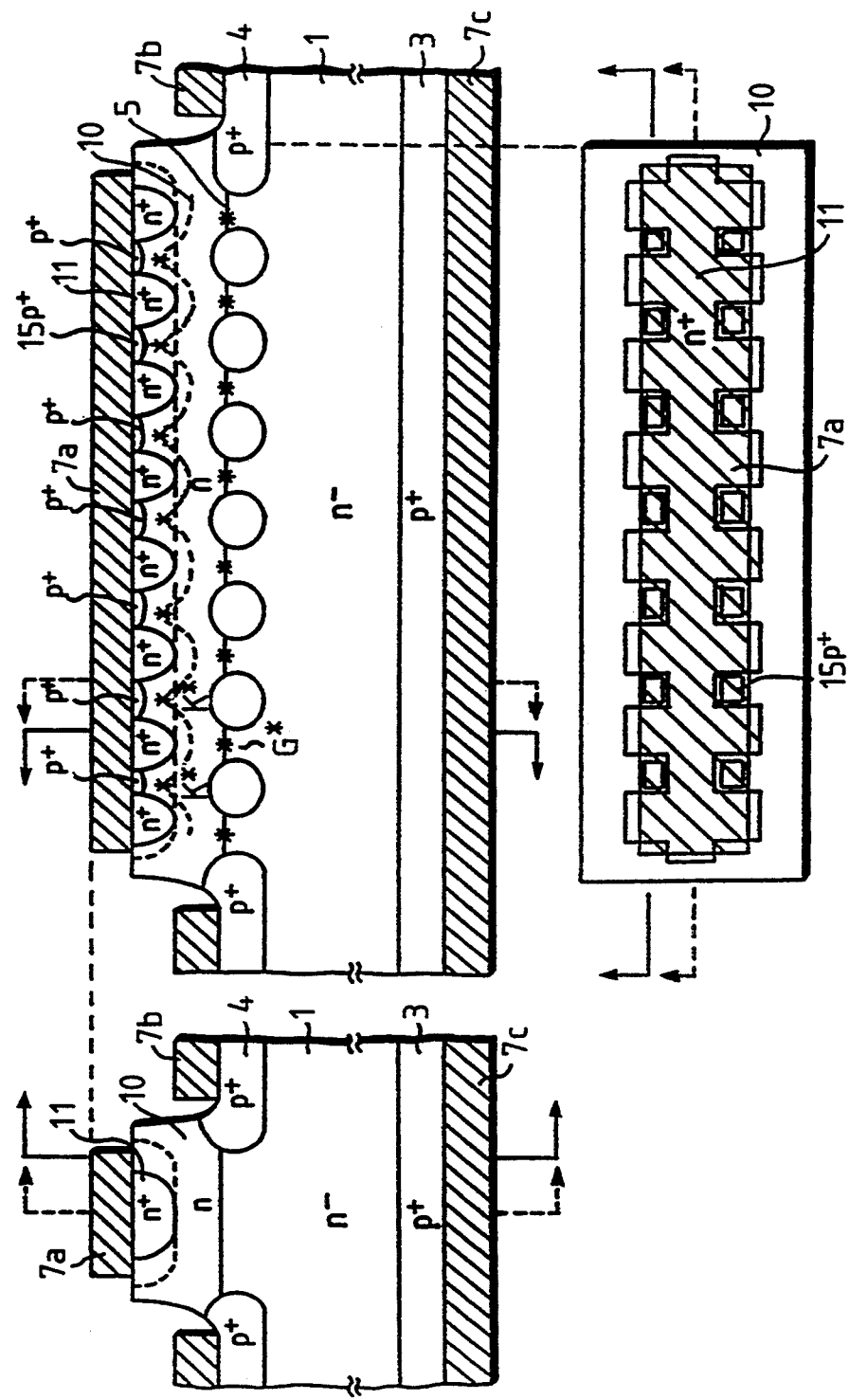
FIG. 24 schematically shows a sectional view and a top view of one unit segment portion of the SI semiconductor device with the SI main electrode shorted structure according to a seventeenth embodiment of the present invention.
Figure 25:
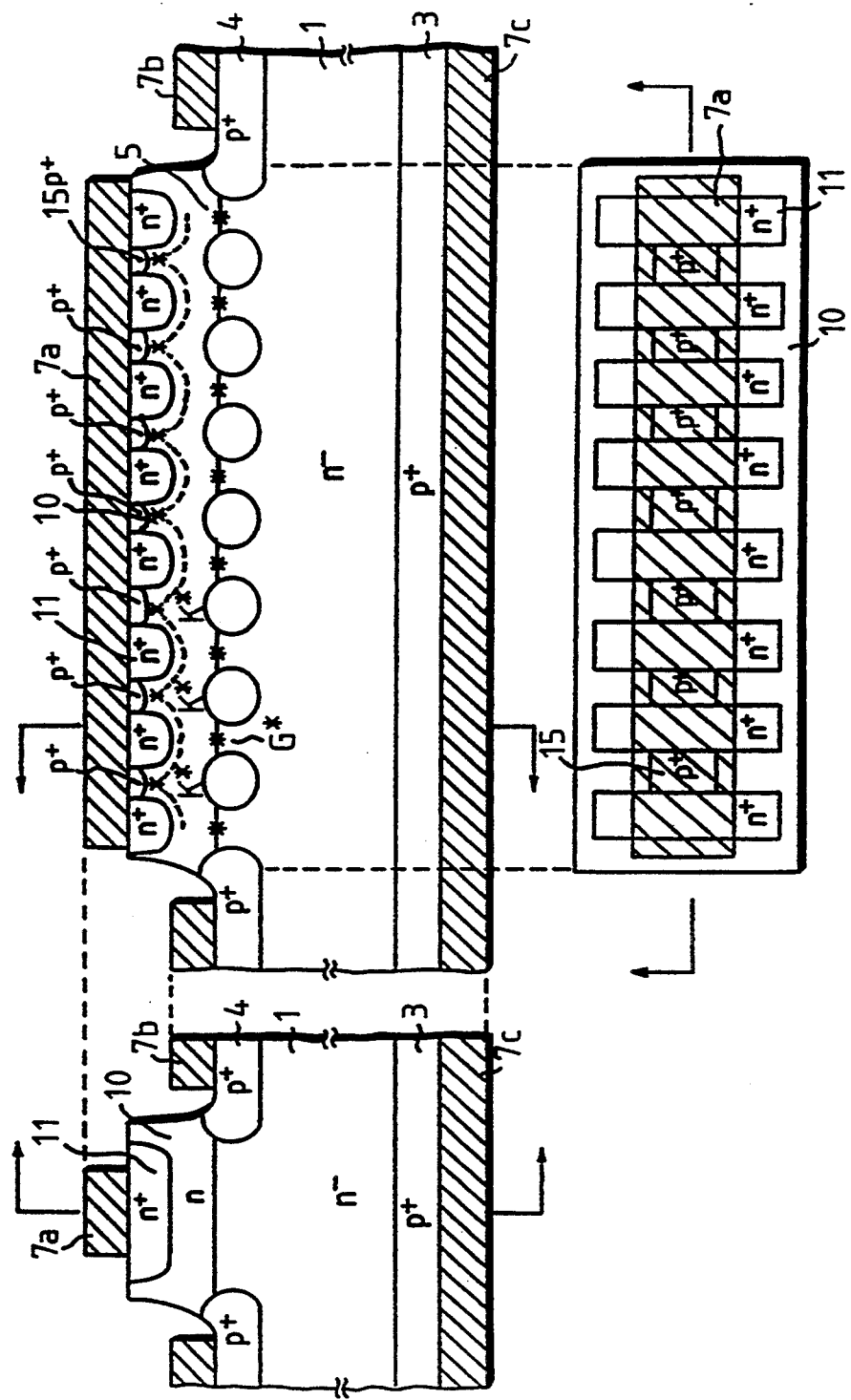
FIG. 25 schematically shows a sectional view and a top view of one unit segment port on of the SI semiconductor device with the SI main electrode shorted structure according to an eighteenth embodiment of the present invention.

FIGS. 24 and 25 schematically show sectional views and top plan views of unit segment portions of SI semiconductor devices with the SI main electrode shorted structure according to 17th and 18th embodiments of the present invention.

Structual features of these embodiments reside in the layout pattern of the n+-type cathode region 11 and the layout pattern of the p+-type cathode short-circuit region 15. That is, to solve the afore-mentioned problem of the prior art that only p+-type buried gate regions 4 directly under the n+-type cathode 11 spread wide and hence introduce dispersion in the gate-cathode withstand voltage distribution, the n+-type cathode region 11 is subdivided into smaller regions and the p+-type cathode short-circuit regions 15 are each formed in that portion surrounded by the cathode regions 11. Since the subdivided cathode regions 11 are disposed in those portions of the n-type region 10 where the channel regions 5 are formed, the variations in the diffusion depth between the gate and the cathode in the unit segment are alleviated and the gate-cathode withstand voltage distribution also becomes uniform.

In Embodiment 17, the n+-type cathode regions 11 are combined with a stripe-shaped cathode region into a unitary structure and the cathode electrode 7a is in contact with a distributed cathode region composed of the n+-type cathode regions and the n-type region 10 and the p+-type cathode short-circuit regions 15 as depicted in the top plan view.

In Embodiment 18 of FIG. 25 the n+-type cathode regions 11 are spaced apart and the p+-type cathode short-circuit regions 15 are each provided in that portion of the n-type region 10 which is surrounded by between adjacent n+-type cathode regions 11. The cathode electrode 7a extends across a distributed cathode short-circuit region [n+(11)−p+(15)−n+(11)−p+(15) . . . ] and makes contact with it.

In these embodiments, the cathode electrode 7a makes ohmic contact with the cathode regions 11 and the p+-type cathode short-circuit regions 15 and ohmic, non-ohmic or Schottky contact with the n-type region 10. The n-type region 10 may also be provided as a p− -or p-type region. The point is to offer a structure in which holes are stored in such a lower impurity density region 10 or the p+-type cathode short-circuit regions 15 and are readily absorbed into the cathode electrode 7a.

In these embodiments, the SI main electrode shorted structure is implemented as in Embodiments 15 and 16 described previously. That is, the cathode short-circuit regions 15 are shorted to the n+-type cathode regions 11, and owing to the built-in potential by the n+(11)n(10) conjunction, a depletion layer spreads in the n-type region 10 which is surrounded by adjacent n+-type cathode regions 11. Such depletion layers link together to form a potential barrier against holes in front of each cathode short-circuit region 15. The position where the potential barrier height is maximum is the intrinsic cathode K* indicated schematically in FIGS. 24 and 25. As will be understood from the potential distribution for holes depicted in FIG. 42, holes stored in the region closer to the cathode than the intrinsic cathode point K* are efficiently absorbed by the cathode short-circuit regions 15. The introduction of such cathode short-circuit regions 15 is equivalent to the formation of so-called drain regions for holes that are absorbed into the cathode electrode 7a. This structure heightens the hole absorbing effect by the built-in potential of the p+(15)n(10) junction, as compared with the structure in which holes are absorbed by the cathode electrode 7a through a mere Schottky junction.

In FIGS. 24 and 25 the cathode electrode 7a is shown to be in contact with the n-type region 10 as well but this contact need not always be made, of course; that is, the cathode electrode 7a may also be formed in contact with the n+ cathode regions 11 and p+-type regions 15 alone.

Embodiments 19 and 20

Figure 26:
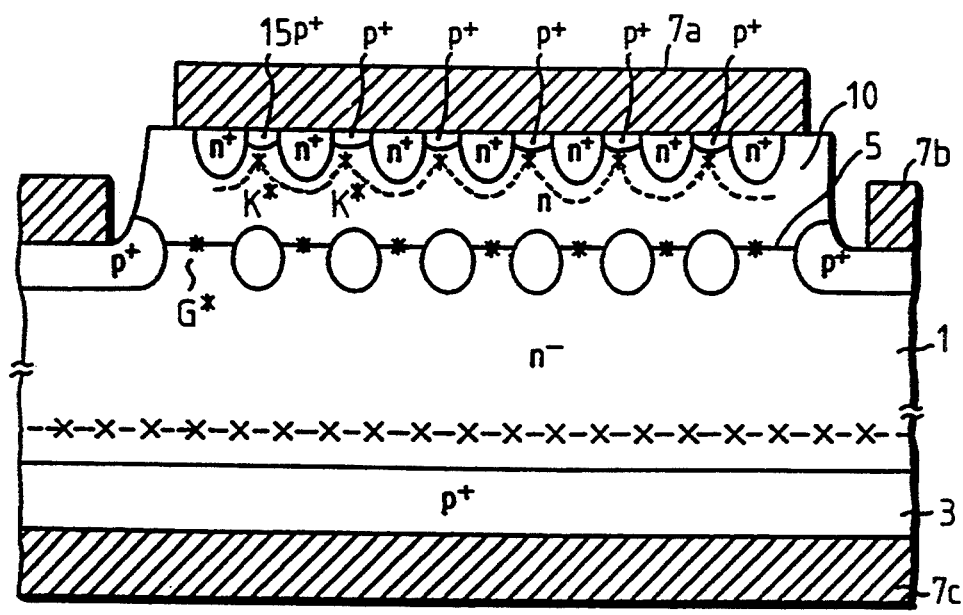
FIG. 26 schematically shows a sectional view and a top view of one unit segment portion of the SI semiconductor device with the SI main electrode shorted structure according to a nineteenth embodiment of the present invention.
Figure 27:
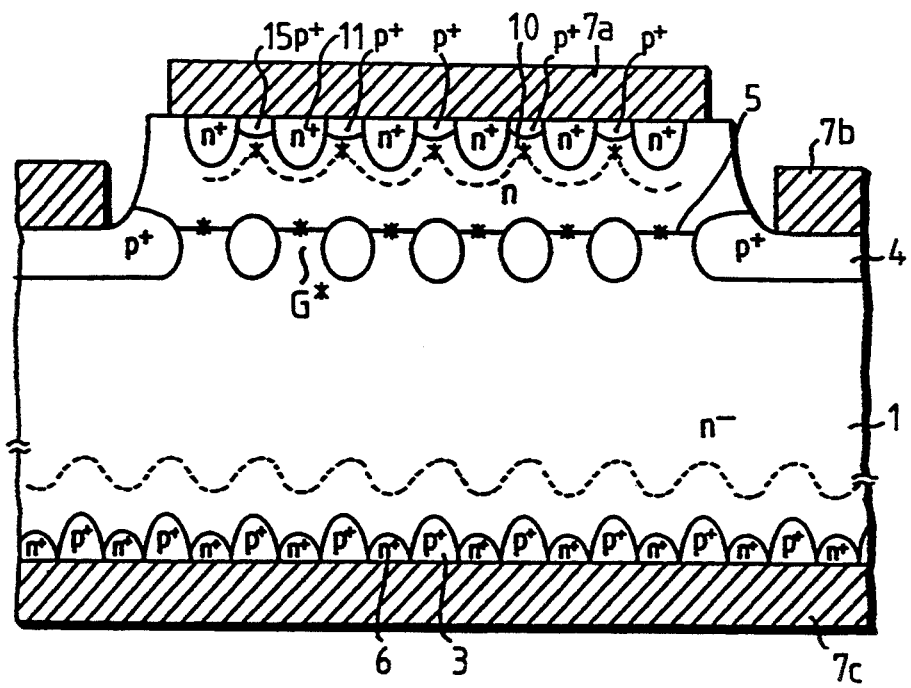
FIG. 27 schematically shows a sectional view and a top view of one unit segment portion of the SI semiconductor device with the SI main electrode shorted structure according to a twentieth embodiment of the present invention.

FIGS. 26 and 27 schematically illustrate, in section, unit segment portions of SI semiconductor devices with the SI main electrode shorted structure according to 19th and 20th embodiments of the present invention. The structure shown in each of FIGS. 26 and 27 is that of the buried gate type SI thyristor. As in Embodiments 17 and 18, the n+-type cathode region 11 is subdivided into smaller regions and the cathode short-circuit regions 15 which utilize the static induction effect are formed between the cathode regions 11. As compared with the distributed main electrode structure with no main electrode shorted structure, the SI main electrode (cathode) shorted structure according to the present invention decreases the quantity of gate pull-out charges and reduces the turn-off time $t_{gq}$ that is the sum of the minority carrier storage period $t_s$ and the fall period $t_f$. It is difficult however, to shorten the tail period $t_{tail}$ unique to the thyristor structure, through the use of the distributed main electrode (cathode) electrode structure alone. Embodiment 19 combines the SI cathode shorted structure with lifetime control. The lifetime control is effected by proton, electron beam or gamma-ray irradiation, or heavy metal diffusion. In FIG. 26 crosses (x) indicate the positions where to form desirable defect regions in the case of the proton irradiation. For instance, when the p+-type anode region 3 is about 5 μm thick, the defect regions are formed about 15 μm above the anode region 3. The defect regions formed near the anode region 3 permit effective control of the lifetime of electrons and reduction of the tail period.

On the other hand, Embodiment 20 of FIG. 27 combines the SI cathode shorted structure and the SI anode shorted structure. The anode shorted structure shown in FIG. 27 is one that utilizes the static induction effect and hence is an SI anode shorted structure. With the combined use of the SI cathode shorted structure and the SI anode shorted structure, it is possible to shorten the turn-off time $t_{gq}$ and the tail period $t_{tail}$. It is a matter of course that Embodiment 20 further utilizes the lifetime control.

Also in Embodiments 19 and 20, a potential barrier controlable by the static induction effect is formed in front of each cathode short-circuit region 15, which serves as a drain for holes that are absorbed into the cathode electrode 7a.

Embodiments 21, 22 and 23

Figure 28:
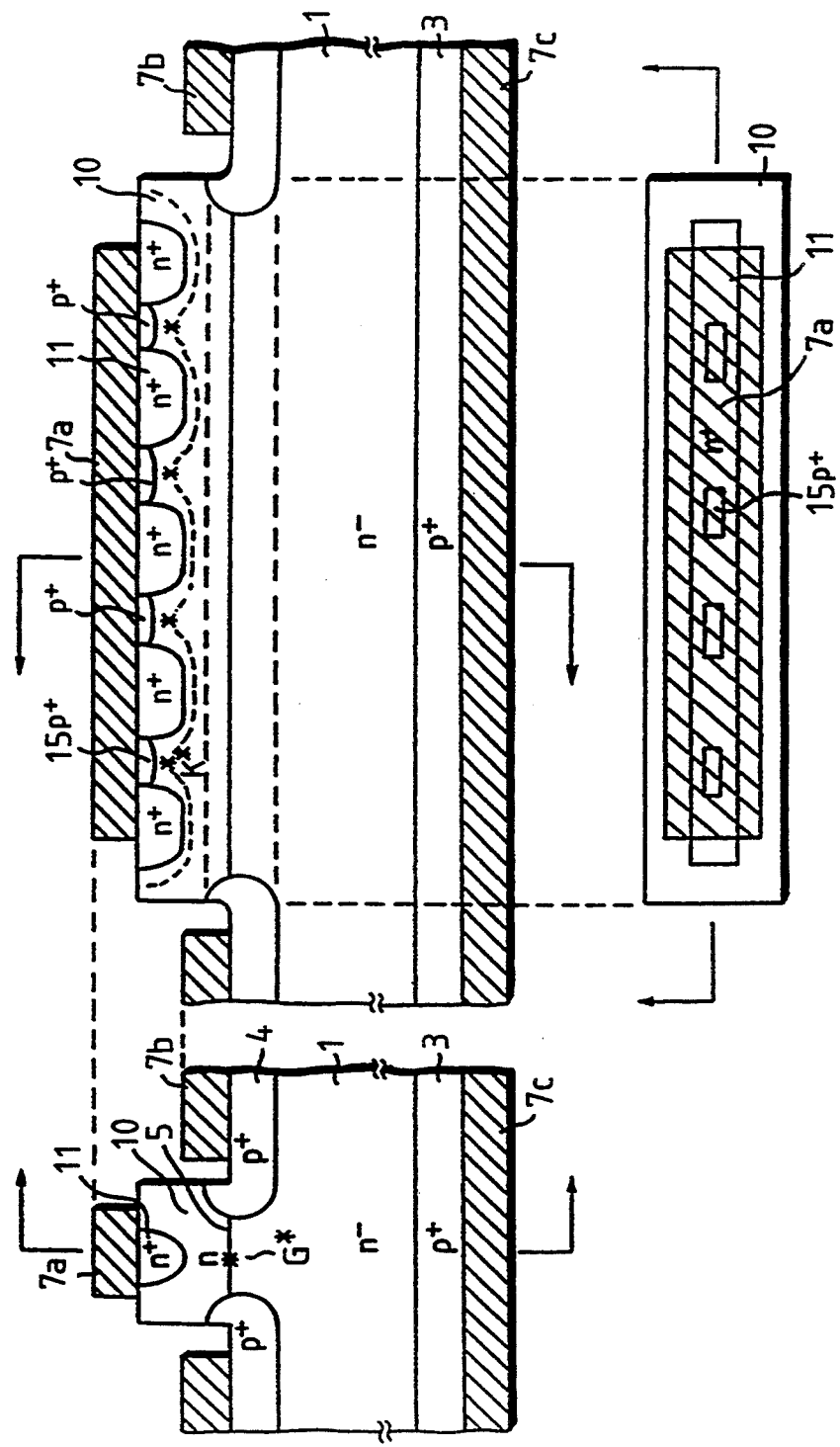
FIG. 28 schematically shows a sectional view and a top view of one unit segment portion of the SI semiconductor device with the SI main electrode shorted structure according to a twenty-first embodiment of the present invention.
Figure 29:
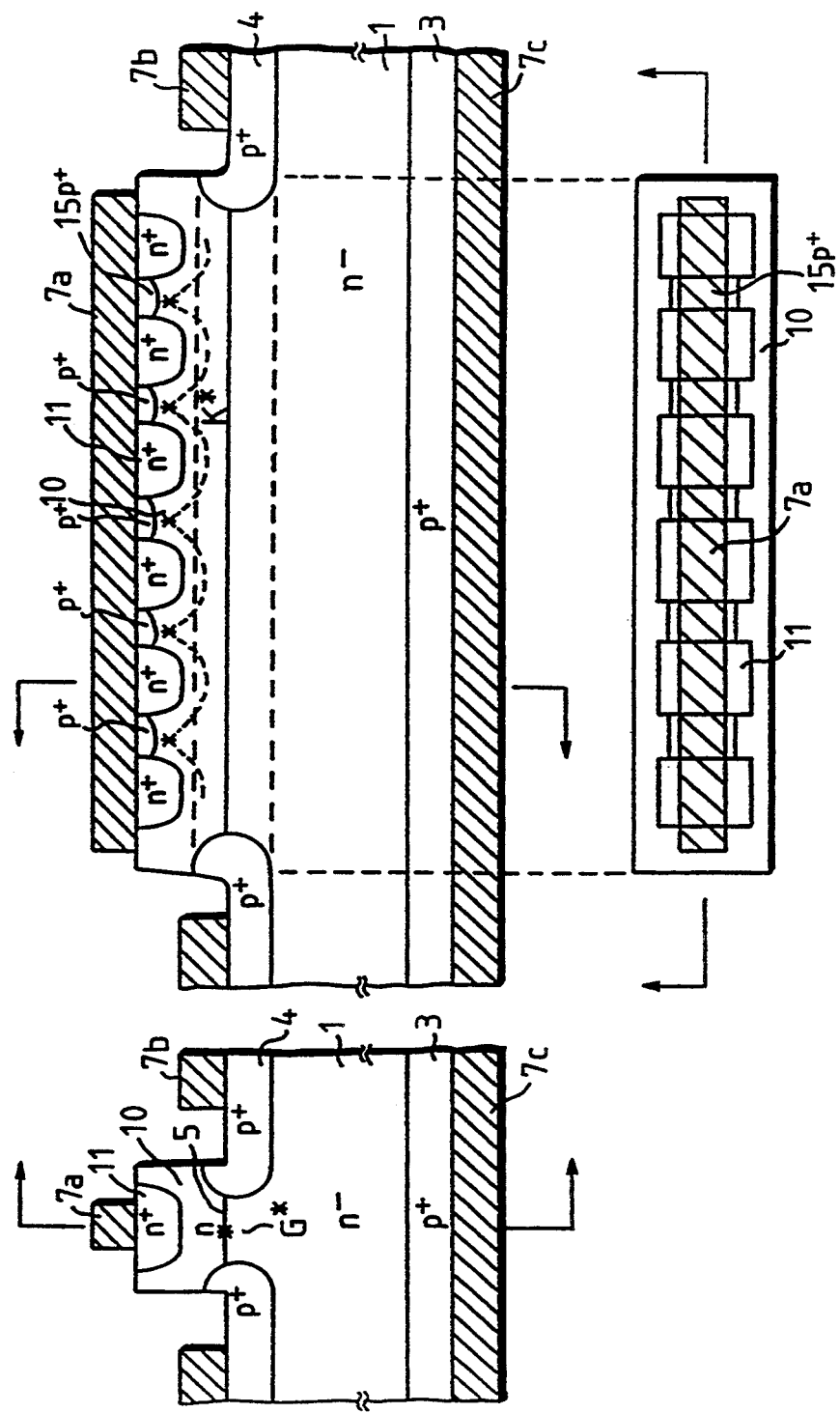
FIG. 29 schematically shows a sectional view and a top view of one unit segment portion of the SI semiconductor device with the SI main electrode shorted structure according to a twenty-second embodiment of the present invention.
Figure 30:
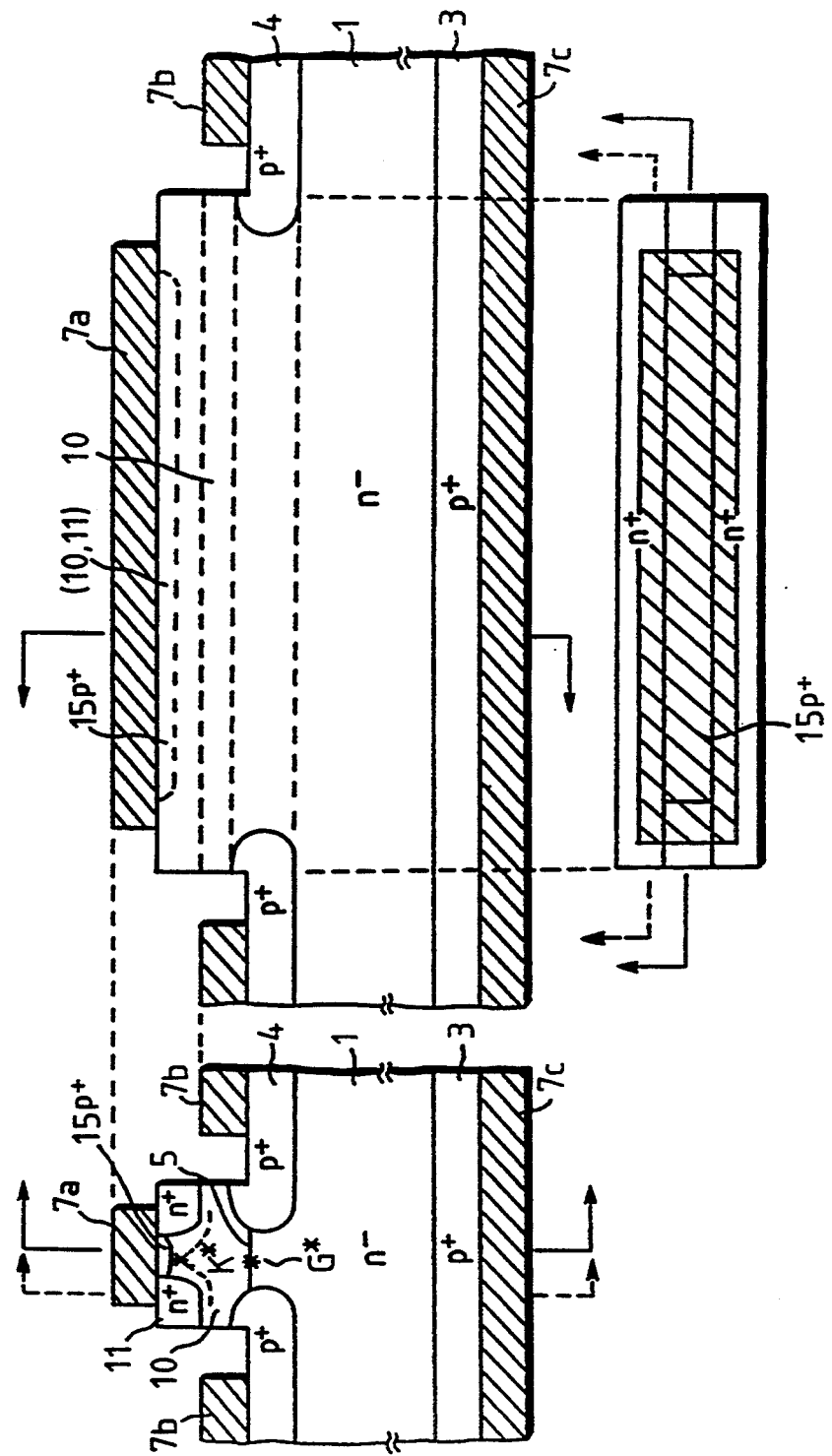
FIG. 30 schematically shows a sectional view and a top view of one unit segment portion of the SI semiconductor device with the SI main electrode shorted structure according to a twenty-third embodiment of the present invention.

FIGS. 28, 29 and 30 schematically illustrate sectional views and top plan views of unit segment portions of SI semiconductor devices with the SI main electrode shorted structure according to 21st, 22nd and 23rd embodiments of the present invention. The devices of these embodiments are each an SI thyristor with the recessed gate structure and feature the SI main electrode (cathode) shorted structure.

As will be seen from FIG. 28, in Embodiment 21 the n+-type cathode region 11 is formed as a stripe-shaped region and the cathode electrode 7a is formed in contact with a distributed cathode region [n+(11)−n(10)] and the p+-type SI cathode short-circuit regions 15 each surrounded by the cathode regions 11.

In Embodiment 22, as is evident from FIG. 29, the n+-type cathode region 11 is subdivided into smaller regions and the cathode electrode 7a is formed in contact with the distributed cathode region [n+(11)−n(10)] and the p+-type SI cathode short-circuit regions 15 surrounded by the cathode regions 11.

In Embodiment 23, as is evident from FIG. 30, the n+-type cathode region 11 is formed as two parallel stripe-like regions to define therebetween the n-type region 10, in which the p+-type cathode short-circuit region 15 is formed. The cathode electrode 7a is formed in contact with the [n+(11)−n(10)] distributed cathode region and the [n+(11)−p+(15)−n+(11)] SI cathode short-circuit region. This construction allows efficient absorption of holes into the cathode electrode 7a from the n-type region 10 surrounded the n+-type cathode regions 11.

While Embodiments 21 through 23 have each been described as being applied to an SI thyristor, it is also possible to form a recessed gate SI transistor by forming an n+-type drain region in place of the p+-type anode region 3.

The cathode electrode 7a makes ohmic contact with the n+-type cathode region 11 and the p+-type cathode short-circuit region 15 but ohmic, non-ohmic or Schottky contact with the n-type region 10. The n-type region 10 may also be provided as p− -or p-type region lower in impurity density than the p+-type gate regions 4. In such an instance, it is preferable that the cathode electrode 7a makes Schottky contact with the region 10.

In these embodiments, the potential barrier height is maximum at the intrinsic cathode point K* opposite each p+-type cathode short-circuit region 15, and the hole current is controlled accordingly. The holes stored in the region further to the above than the intrinsic cathode point K* are efficiently absorbed to the cathode short-circuit region 15.

Embodiments 24 and 25

Figure 31:
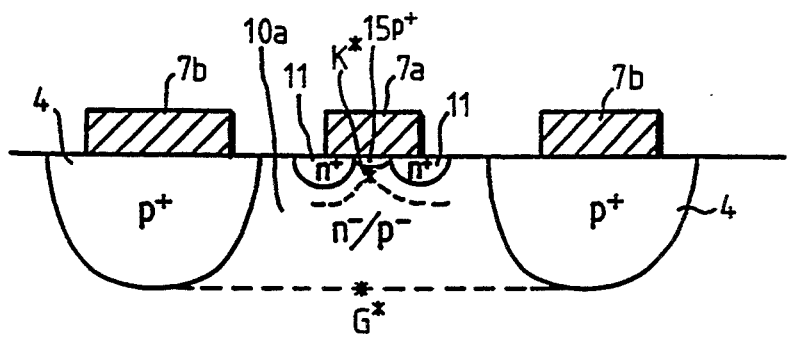
FIG. 31 is a schematic sectional view illustrating the main electrode and its vicinity in the SI semiconductor device with the SI main electrode shorted structure according to a twenty-fourth embodiment of the present invention.
Figure 32:
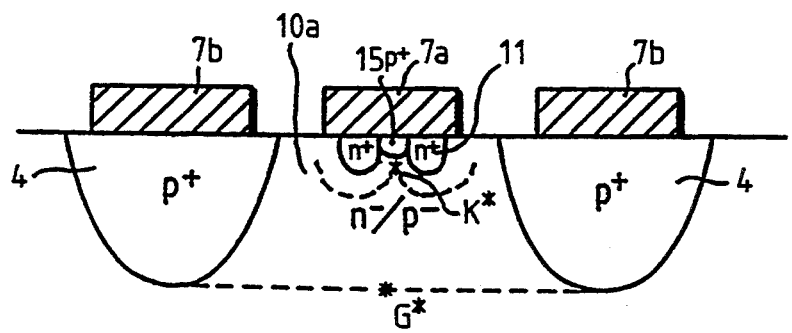
FIG. 32 is a schematic sectional view illustrating the main electrode and its vicinity in the SI semiconductor device with the SI main electrode shorted structure according to a twenty-fifth embodiment of the present invention.

FIGS. 31 and 32 schematically illustrate, in section, the main electrodes and the surrounding portions in SI semiconductor devices with the SI main electrode shorted structure according to 24th and 25th embodiments of the present invention. The illustrated main electrode structures are both those of planar gate type SI semiconductor devices, which can each be formed either as a thyristor or transistor; these embodiments will be described in connection with a thyristor.

Figure 33:
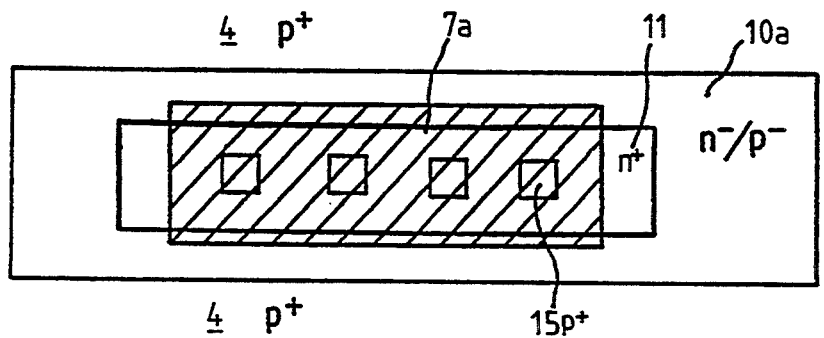
FIG. 33 is a schematic top plan view of a unit channel portion of the FIG. 32 embodiment.

In Embodiment 24 of FIG. 31 the n+-type cathode region 11 is divided into two parallel stripe-like regions and the cathode short-circuit region 15 is formed between the n+-type cathode regions 11. The cathode electrode 7a is formed in contact with the p+-type cathode short-circuit region 15 as well as the n+-type cathode regions 11. That is, the cathode electrode 7a extends across an SI cathode shorted structure [n+(11)−p+(15)−n+(11)]. In this embodiment, holes distributed in the n−/p−-type region 10a are readily absorbed to the cathode electrode 7a through the p+-type cathode short-circuit region 15 surrounded by the n+-type cathode regions 11. On the other hand, in Embodiment 25 of FIG. 32, the n+-type cathode region 11 is formed as a single stripe-shaped region electrode 7a and the cathode is formed in contact not only with the n+-type cathode region 11 but also with the surrounding n−/p−-type region 10a. In the n+-type cathode region 11 there are formed the p+-type cathode short-circuit regions 15 in the form of an island. FIG. 33 is a schematic top plan view of the unit channel portion of Embodiment 25 shown in FIG. 32. The cathode electrode 7a is formed in contact with the stripe-shaped n+-type cathode region 11, the island-like p+-type cathode short-circuit regions 15 and the n−/p−-type region 10a.

Embodiments 26, 27 and 28

Figure 34:
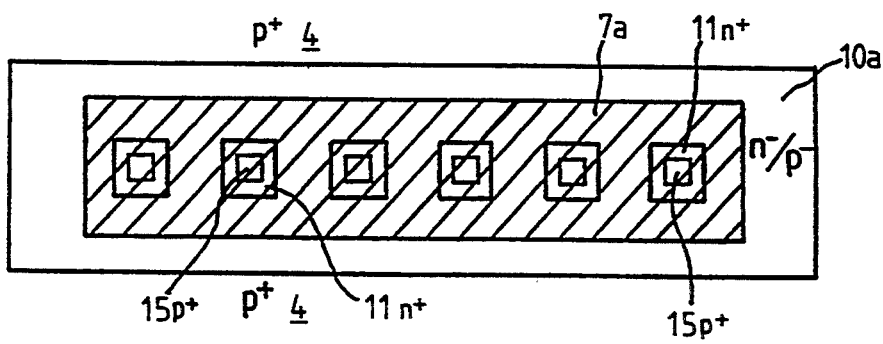
FIG. 34 is a schematic diagram showing an SI cathode shorted structure of the SI semiconductor device with the SI main electrode shorted structure according to a twenty-sixth embodiment of the present invention.
Figure 35:
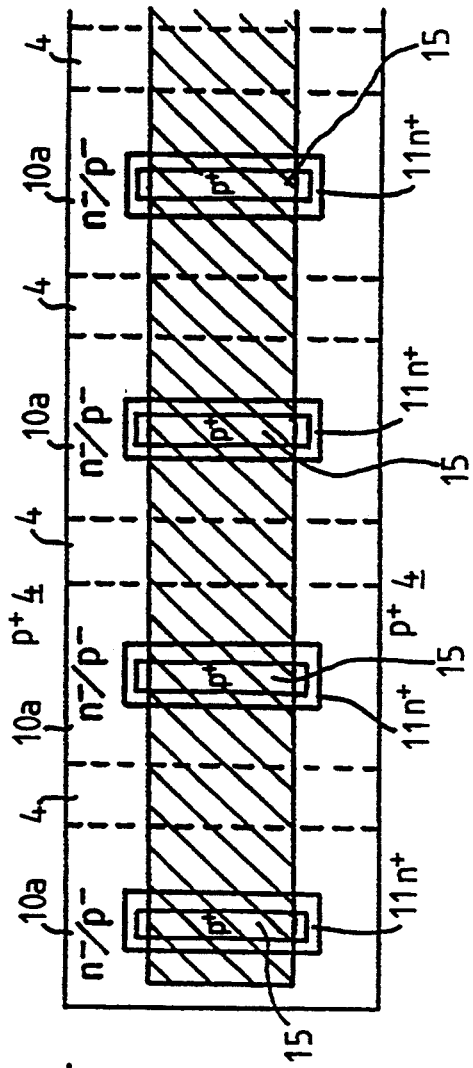
FIG. 35 is a schematic diagram showing an SI cathode shorted structure of the SI semiconductor device with the SI main electrode shorted structure according to a twenty-seventh embodiment of the present invention.
Figure 36:
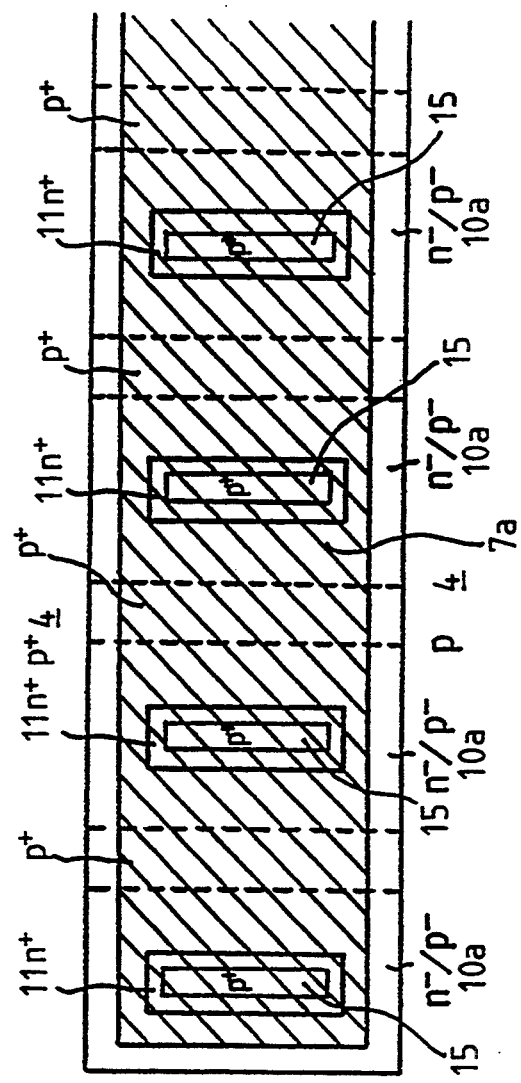
FIG. 36 is a schematic diagram showing an SI cathode shorted structure of the SI semiconductor device with the SI main electrode shorted structure according to a twenty-eighth embodiment of the present invention.

Also in the case where the SI main electrode shorted structure according to the present invention is applied to a planar gate structure, various modifications can be effected by changing the layout patterns of the n+-type cathode region 11 and the p+-type short-circuit regions 15 each surrounded by the region 11. FIGS. 34 through 36 are top plan views illustrating modifications of the layout pattern of the cathode region 11. FIG. 34 illustrates a 26th embodiment of the present invention, in which subdivided n+-type cathode regions 11 are arranged in the unit channel of the planar structure and the p+-type cathode short-circuit regions 15 are each formed in one of the cathode regions 11. The cathode electrode 7a is formed over an [n+(11)−n−/p−(10a)] cathode distributed structure and an [n+(11)−p+(15)−n+(11)] SI cathode shorted structure. FIG. 35 illustrates a 27th embodiment of the present invention, in which the cathode electrode 7a is formed in contact with the n+-type cathode regions 11 formed in a plurality of channels and the p+-type short-circuit regions 15 respectively formed in the cathode regions 11 and also in contact with the n−/p−-type regions surrounding the cathode regions 11. FIG. 36 illustrates a 28th embodiment of the present invention, in which the cathode electrode 7a is wider than in the FIG. 35 embodiment and entirely covers the n+-type cathode regions 11 and the p+-type cathode short-circuit regions 15. This construction enhances the effect of absorbing holes distributed in the n−/p−-type regions 10a.

Now, a comparison will be made between the electrode structure of Embodiment 15 shown in FIG. 22 and the conventional structure shown in FIG. 47. Compared with the conventional uniform cathode electrode structure, the SI main electrode shorted structure according to the present invention reduces the gate peak current value $I_{GP}$, increases the turn-off gain $G_{OFF}$, shortens the minority carrier storage time $t_s$ and the fall time $t_f$, and consequently shortens the turn-off time $t_{gq}(=t_s+t_f)$ and reduces the turn-off switching energy $E_{OFF}$ (mJ/pulse).

In particular, holes distributed between the gate region 4 and the cathode region 11 can efficiently be absorbed into the cathode electrode 7a by the electric field base on the built-in potential between the p+-type cathode short-circuit region 15 and the n-type region 10, and hence the quantity of charges that are pulled out of the gate electrode is remarkably reduced—this lightens the burden on the gate driver, permitting its miniaturization.

The quantity of gate pull-out charges, $Q(\mu C)$, in the FIG. 22 embodiment is about ⅓ or less than in the prior art structure.

Compared with the SI thyristor of the FIG. 47 prior art structure irradiated with gamma rays for lifetime control, the SI thyristor with the SI cathode shorted structure of FIG. 22 possesses excellent turn-off switching capabilities such as high-speed operation, small quantity of gate pull-out charges and low loss.

Compared with the conventional device in terms of the forward current-voltage characteristic, the SI thyristor with the SI cathode shorted structure of the present invention has a forward voltage drop (i.e. the on-state voltage) $V_T$ large in the low current region but small in the high current region. Hence, the SI thyristor according to the present invention has high surge capability.

With respect to the relationship between the on-state voltage and the cathode electrode shorting ratio between the n+-type cathode region and the p+-type cathode short-circuit region in the SI main electrode (cathode) shorted structure, the present invention suppresses an abrupt increase in the on-state voltage $V_T$ by holding the above-said shorting ratio below 30%.

The present invention is not limited specifically to Embodiments 1 through 28 described above but various modifications can be effected. For instance, a p-type region may be formed shallow in the interface between the n+-type cathode region 11 and the cathode electrode 7a so as to absorb holes distributed in the n+-type cathode region 11. This p-type region can be formed as shallow as tens of angstroms, for example, by sintering of an Al—Si alloy during the manufacture of the semiconductor device. This structure may be used in combination with the cathode shorted structure. It has been described previously that the n-type region 10 may be formed as a p− -or p-type region, but in such an instance, it is preferable that the above-mentioned shallow p-type region be separated or isolated by the n+-type cathode region 11 or a potential barrier from the n-type region (or p− or p-type region) 10.

The distributed main electrode structure and the SI main electrode shorted structure according to the present invention are applicable not only to SI transistors and SI thyristors but also to devices which have other cathode or source structures, such as an IGBT and a MOS controlled thyristor.

It is a matter of course that the conductivity types of respective parts may be reversed in the embodiments described above.

The SI semiconductor device with the distributed main electrode structure and the SI semiconductor device with the SI main electrode shorted structure according to the present invention possess such great advantages as listed below. These advantages are particularly remarkable in the case of thyristors using the structures according to the present invention.

(1) The turn-off time (the sum of the minor carrier storage time $t_s$ and the fall time $t_f$) can be shortened and the turn-off switching energy $E_{OFF}$ can be reduced. The reduction of the minor carrier storage time $t_s$, in particular, allows very easy-to-use devices which can be applicable to a high-frequency PWM inverter and so on. Besides, since the minority carrier storage time $t_s$ can be reduced for each segment, variations in the device loss in each segment on the wafer is reduced—this allows ease in increasing diameter of the wafer.

(2) Since the main electrode shorted structure markedly decreases the quantity of gate pull-out charges and increases the tun-off gain, the gate driver can be simplified and miniaturized; thus, manufacturing costs of the semiconductor devices can be cut.

(3) The withstand voltage characteristic and the leak current under high temperature conditions are about the same as in the prior art and the steady loss is low at the time of steady blocking. Hence, while the turn-off performance is enhanced, it is possible to keep excellent the on-state characteristic which usually has a trade-off relation to the turn-off performance.

(4) Since the on-state voltage $V_T$ has a positive temperature characteristic, thermal runaway is not likely to occur during high-frequency operation, in particular; therefore, the devices of the present invention can be used at high frequencies.

(5) Even if the turn-off speed is raised extremely high, equal to that of the SI transistor, for example, substantially no influence is exerted on the firing. That is, it is substantially unchanged with the waveforms of the gate voltage and the gate current at turn-on switching. Even if the turn-off performance is enhanced, the turn-on switching loss $E_{ON}$ undergoes substantially no change in the low current region. In the high current region the turn-on rise time $t_r$ and the turn-on switching loss $E_{ON}$ tend to increase, but the delay time $t_d$ does not change. It is also possible to produce an effect of increasing the surge capability in the high current region.

Needless to say, SI transistors utilizing the structures according to the present invention could also benefit from the effects (1) through (5) referred to above with respect to thyristors.

It will be apparent that many modifications and variations may be effected without departing from the scope of the novel concepts of the present invention.

What is claimed is:

1. A static induction semiconductor device with a distributed main electrode structure, which has a first main electrode region formed in a first main surface of a high resistivity layer, a second main electrode region formed in the first or second main surface of said high resistivity layer, and a control region formed near said first main electrode region and in which said control region forms a channel region in said high resistivity layer and controls the height of a potential barrier in said channel region to control a main current between said first main electrode region and said second main electrode region, characterized in that said first main electrode region has a structure wherein regions of higher and lower impurity densities relative to each other are distributed and that a main electrode formed in contact with said first main electrode region is partly in contact with said lower impurity density region as well as said higher impurity density region, and said higher and lower impurity density regions in said first main electrode region are the same in conductivity type but opposite to said control region.

2. The static induction semiconductor device of claim 1, characterized in that said main electrode formed in contact with said first main electrode region makes ohmic contact with said higher impurity density region and non-ohmic or Schottky contact with said lower impurity density region.

3. The static induction semiconductor device of claim 1, characterized in that said main electrode in contact with said first main electrode region is formed of aluminum (Al), molybdenum (Mo), tungsten (W), platinum (Pt), titanium (Ti), nickel (Ni) or their silicon (Si)-base alloys or silicides.

4. The static induction semiconductor device of claim 1, characterized in that said higher impurity density region in said first main electrode region is composed of separated regions.

5. The static induction semiconductor device of claim 1, characterized in that said control region has a buried structure.

6. The static induction semiconductor device of claim 1, characterized in that said control region has a recessed structure.

7. The static induction semiconductor device of claim 1, characterized in that said control region has a planar structure.

8. The static induction semiconductor device of claim 1 is a static induction thyristor.

9. The static induction semiconductor device of claim 1 is a static induction transistor.

10. A static induction semiconductor device with a static induction main electrode shorted structure, which has a first main electrode region formed in a first main surface of a high resistivity layer, a second main electrode region formed in said first or second main surface of said high resistivity layer, and a control region formed near said first main electrode region and which said control region forms a channel region in said high resistivity layer and controls the height of a potential barrier in said channel region to control a main current between said first main electrode region and said second main electrode region, characterized in that said first main electrode region has a structure wherein regions of higher and lower impurity densities relative to each other and a short-circuit region respectively formed in said lower impurity density region surrounded by said higher impurity density regions are distributed, that a main electrode formed in contact with said first main electrode region is partly in contact with said lower impurity density region and said short-circuit region as well as said higher impurity density region, that said short-circuit region is of the same conductivity type as said control region but is opposite to said higher impurity density region and that a potential barrier is formed in said lower impurity region between said short-circuit region and said control region by a depletion layer spreading from said higher impurity density region into said lower impurity density region, and said higher and lower impurity density regions are of the same conductivity type but opposite to said control region.

11. The static induction semiconductor device of claim 10, characterized in that said main electrode formed in contact with said first main electrode structure makes ohmic contact with said higher impurity density region and non-ohmic or Schottky contact with said lower impurity density region.

12. The static induction semiconductor device of claim 10, characterized in that said main electrode in contact with said first main electrode region is formed of aluminum (Al), molybdenum (Mo), tungsten (W), platinum (Pt), titanium (Ti), nickel (Ni) or their silicon (Si)-base alloys or silicides.

13. The static induction semiconductor device of claim 10, characterized in that said higher impurity density region in said first main electrode region is composed of separated regions.

14. The static induction semiconductor device of claim 10, characterized in that said control region has a buried structure.

15. The static induction semiconductor device of claim 10, characterized in that said control region has a recessed structure.

16. The static induction semiconductor device of claim 10, characterized in that said control region has a planar structure.

17. The static induction semiconductor device of claim 10 is a static induction thyristor.

18. The static induction semiconductor device of claim 10 is a static induction transistor.

19. A static induction semi-conductor device in accordance with claim 10, wherein:
said short circuit region has a depth into said high resistivity layer which is less than a depth of said higher impurity density region into said high resistivity layer.

20. A static induction semiconductor device comprising:
a high resistivity layer with a first and second main surface;
a first main electrode region formed in said first main surface of said high resistivity layer;
a second main electrode region formed in said second main surface of said high resistivity layer;
a control region formed adjacent said first main electrode region and said control region forming a channel region in said high resistivity layer and controlling a height of a potential barrier in said channel region to control a main current between said first main electrode region and said second main electrode region;
a high and low density region formed in said first main electrode region, said high density region having an impurity density higher than said low density region;
a short-circuit region formed in said low density region and surrounded by said high density region, said short-circuit region being of a same conductivity type as said control region and opposite to said high density region to form a potential barrier in said low region between said short-circuit region and said control region by a depletion layer spreading from said high density region into said low density region, said high and low density regions being of a same conductivity type and opposite to said control region, said short circuit region having a depth into said high resistivity layer less than a depth of said high density region into said high resistivity layer;
a main electrode formed in contact with said first main electrode region and partly in contact with said low density region, said short-circuit region and said high density region.

* * * * *